United States Patent
Watanabe et al.

(10) Patent No.: US 12,368,971 B2
(45) Date of Patent: Jul. 22, 2025

(54) SEMICONDUCTOR DEVICE, METHOD FOR DRIVING SEMICONDUCTOR DEVICE, AND ELECTRONIC DEVICE

(71) Applicant: SEMICONDUCTOR ENERGY LABORATORY CO., LTD., Atsugi (JP)

(72) Inventors: Kazunori Watanabe, Tokyo (JP); Satoshi Yoshimoto, Kanagawa (JP); Koji Kusunoki, Kanagawa (JP); Susumu Kawashima, Kanagawa (JP); Motoharu Saito, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 255 days.

(21) Appl. No.: 18/251,576

(22) PCT Filed: Oct. 26, 2021

(86) PCT No.: PCT/IB2021/059850
§ 371 (c)(1),
(2) Date: May 3, 2023

(87) PCT Pub. No.: WO2022/096981
PCT Pub. Date: May 12, 2022

(65) Prior Publication Data
US 2023/0412935 A1 Dec. 21, 2023

(30) Foreign Application Priority Data
Nov. 6, 2020 (JP) .................................. 2020-185673

(51) Int. Cl.
*H04N 25/44* (2023.01)
*G06V 40/13* (2022.01)
(Continued)

(52) U.S. Cl.
CPC .......... *H04N 25/44* (2023.01); *G06V 40/1318* (2022.01); *H04N 25/713* (2023.01); *H04N 25/779* (2023.01)

(58) Field of Classification Search
CPC .... H04N 25/44; H04N 25/713; H04N 25/779; H04N 25/616; H04N 1/028;
(Continued)

(56) References Cited

U.S. PATENT DOCUMENTS 4,706,130 A * 11/1987 Yamakawa .......... H04N 1/1931
358/300
6,476,790 B1 11/2002 Tanaka
(Continued)

FOREIGN PATENT DOCUMENTS

JP 4674939 4/2011
JP 2019-079415 A 5/2019
(Continued)

OTHER PUBLICATIONS

International Search Report (Application No. PCT/IB2021/059850) Dated Jan. 25, 2022.
(Continued)

*Primary Examiner* — Nhan T Tran
(74) *Attorney, Agent, or Firm* — Fish & Richardson P.C.

(57) ABSTRACT

A semiconductor device capable of performing authentication in a short time can be provided. The semiconductor device includes a light-emitting unit and an imaging unit. The imaging unit includes a row driver circuit, and the row driver circuit includes first to m latch circuits (m is an integer greater than or equal to 2) and first to m register circuits. A first start pulse signal is input to a first latch circuit and second start pulse signals are input to first to m latch circuits. Scan signals output from the first to (m−1)-th register circuits are input to the second to m-th latch circuits,
(Continued)

respectively. The first latch circuit has a function of outputting one of the first start pulse signal and the second start pulse signal to the first register circuit on the basis of data held, and the second to m-th latch circuits have a function of outputting one of the scan signal and the second start pulse signal to the second to m-th register circuits on the basis of data held.

13 Claims, 47 Drawing Sheets

(51) Int. Cl.
*H04N 25/713* (2023.01)
*H04N 25/779* (2023.01)

(58) Field of Classification Search
CPC ........... G06V 40/1318; H10D 30/6755; H10D 86/423; H10D 86/60; G06T 1/00; H10K 39/34; H10K 59/1201
See application file for complete search history.

(56) References Cited

U.S. PATENT DOCUMENTS

| | | | |
|---|---|---|---|
| 6,710,761 B2 | 3/2004 | Tanaka | |
| 7,342,565 B2 | 3/2008 | Tanaka | |
| 7,903,160 B2 * | 3/2011 | Taguchi | H04N 25/78 348/308 |
| 8,035,715 B2 * | 10/2011 | Nojima | H04N 25/00 348/294 |
| 11,604,526 B2 * | 3/2023 | Fukushima | G06F 3/0412 |
| 11,610,529 B2 | 3/2023 | Watanabe et al. | |
| 2015/0156433 A1 * | 6/2015 | Nomura | H04N 25/443 348/308 |
| 2019/0104273 A1 * | 4/2019 | Sato | H03M 1/68 |
| 2019/0130087 A1 | 5/2019 | Mori et al. | |
| 2021/0144328 A1 * | 5/2021 | Kondou | H04N 25/617 |
| 2021/0383094 A1 * | 12/2021 | Tada | G06V 40/1365 |
| 2022/0068181 A1 * | 3/2022 | Watanabe | G09G 3/3233 |

FOREIGN PATENT DOCUMENTS

| | | |
|---|---|---|
| JP | 2020-144802 A | 9/2020 |
| WO | WO-2020/152556 | 7/2020 |
| WO | WO-2020/184412 | 9/2020 |

OTHER PUBLICATIONS

Written Opinion (Application No. PCT/IB2021/059850) Dated Jan. 25, 2022.

* cited by examiner

FIG. 2A
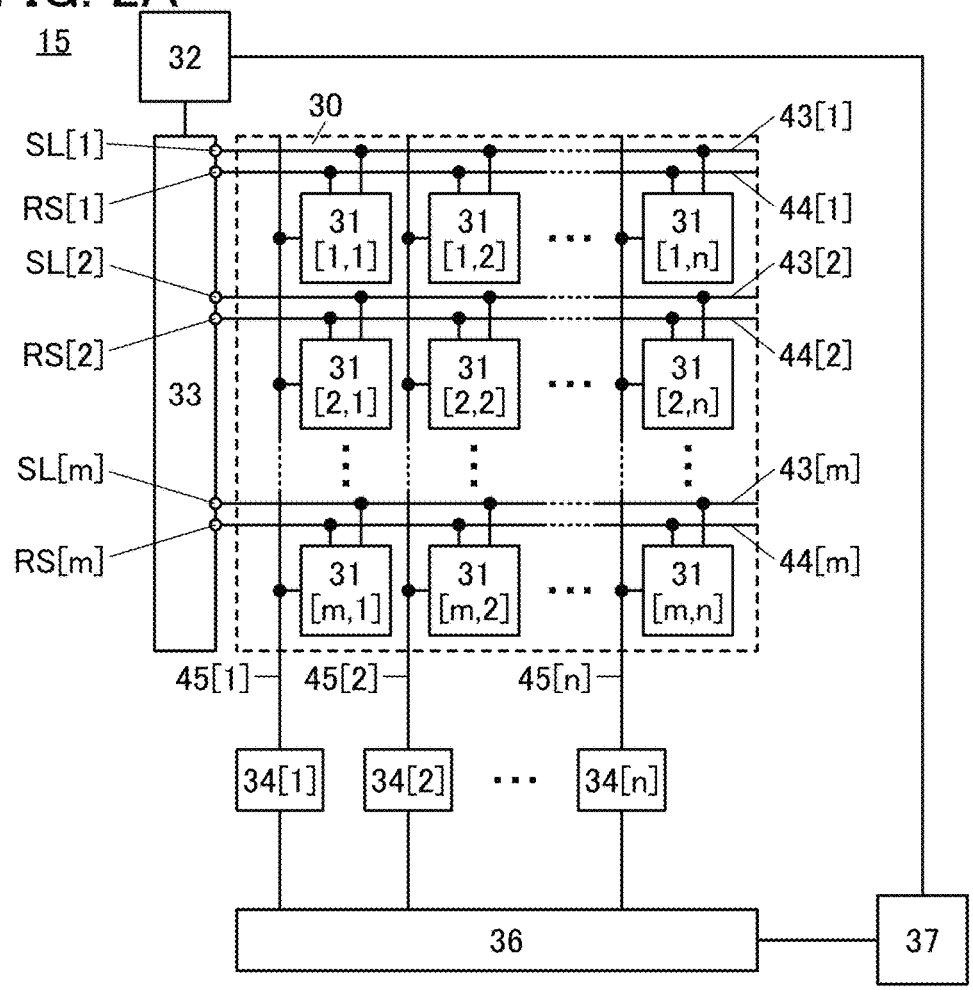
FIG. 2B1
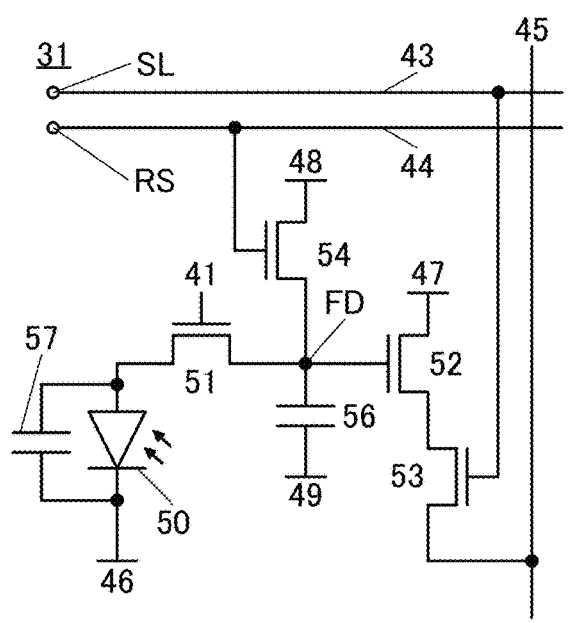
FIG. 2B2
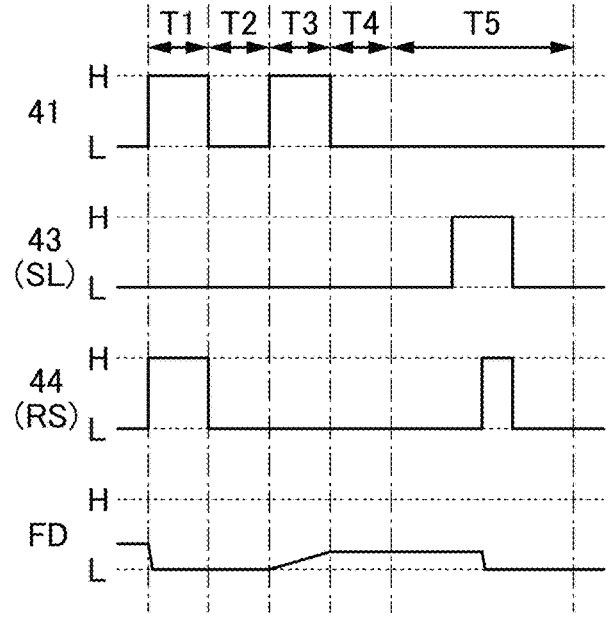

FIG. 5A1
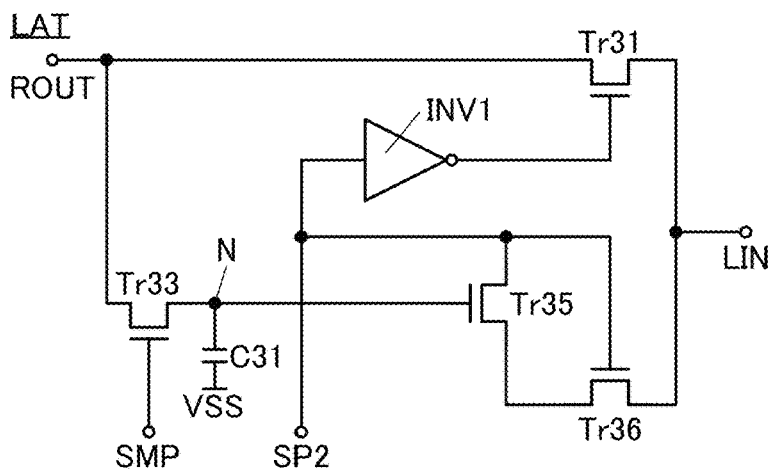
FIG. 5A2
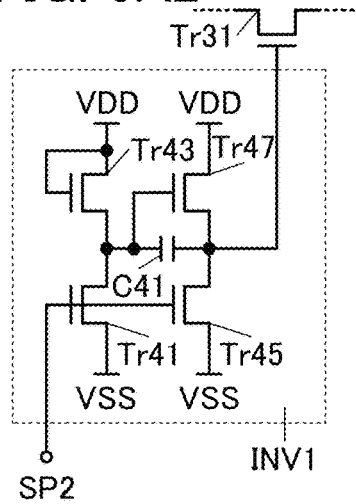
FIG. 5B1
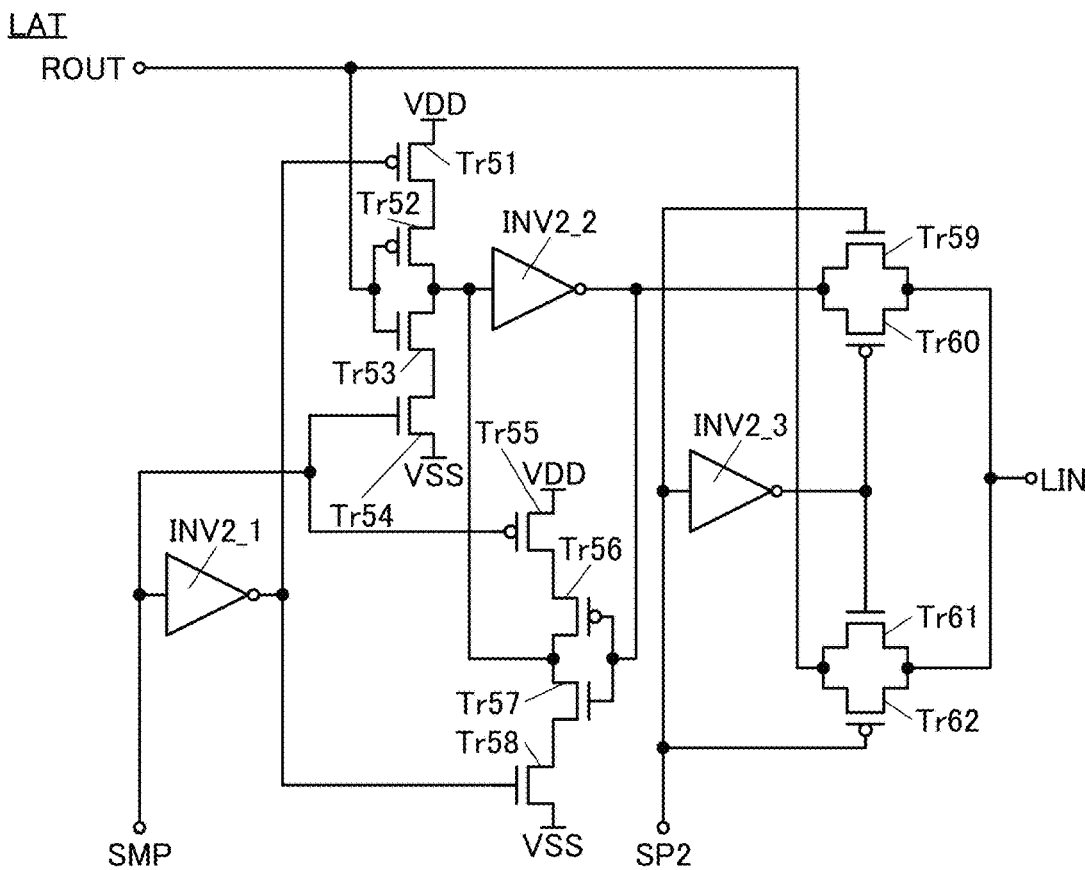
FIG. 5B2
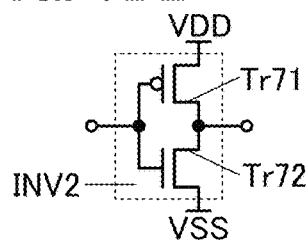

FIG. 17A
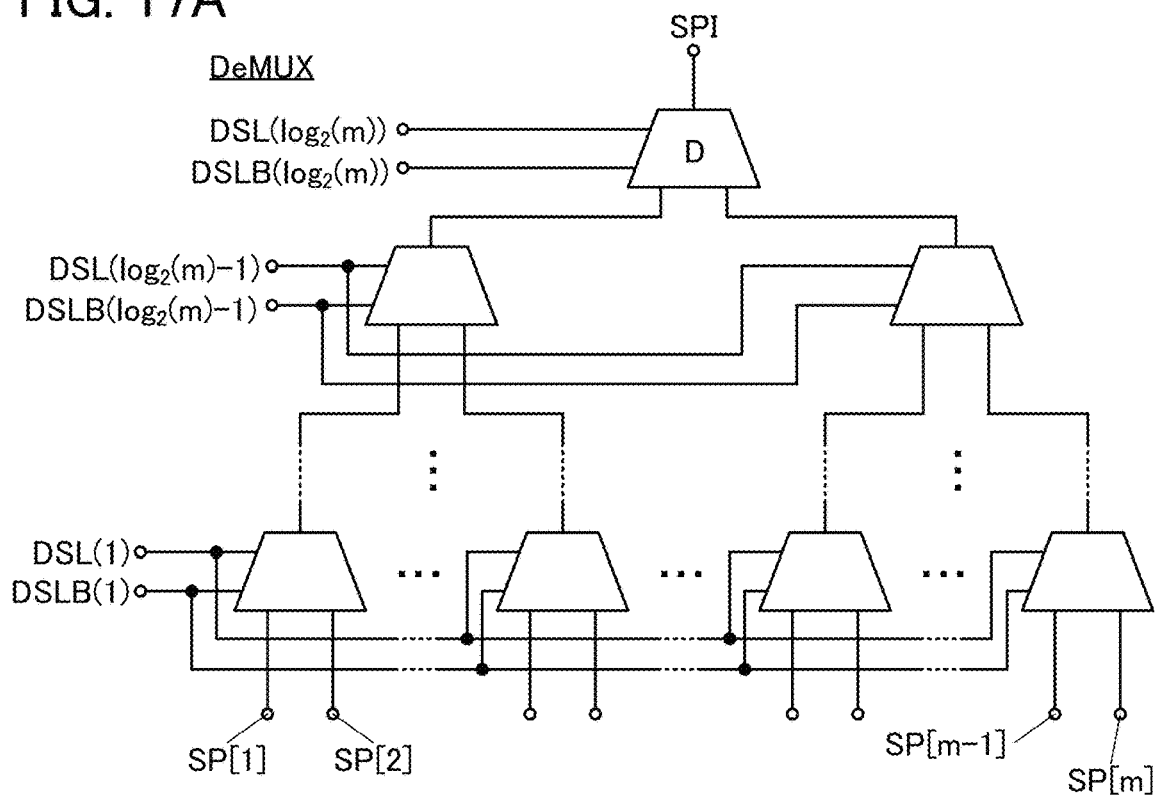
FIG. 17B1
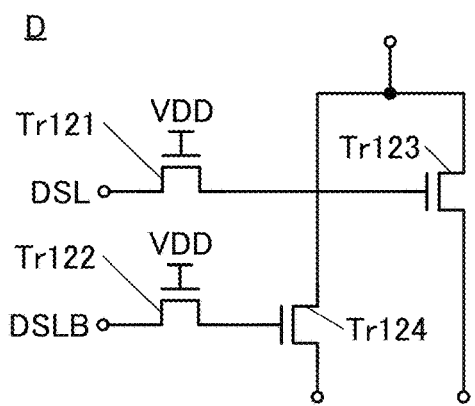
FIG. 17B2
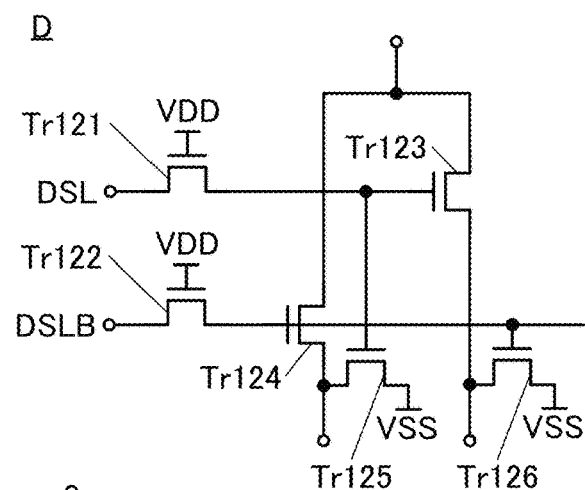
FIG. 17B3
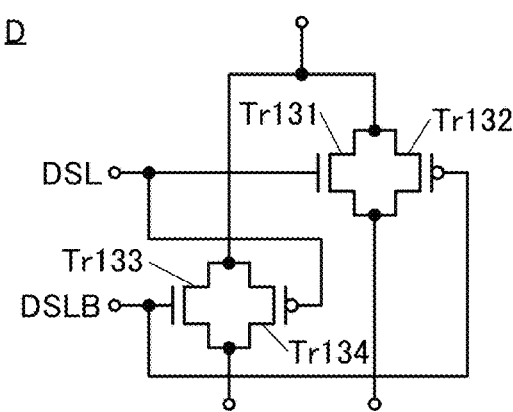

PIX1

PIX2

PIX2

FIG. 40A
| Amorphous | Intermediate state<br>New crystalline phase<br>Crystalline | Crystal |
|---|---|---|
| •completely amorphous | •CAAC<br>•nc<br>•CAC<br>excluding single crystal and poly crystal | •single crystal<br>•poly crystal |
FIG. 40B
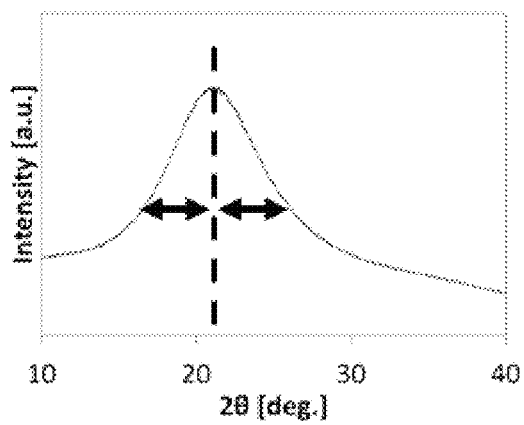
FIG. 40C
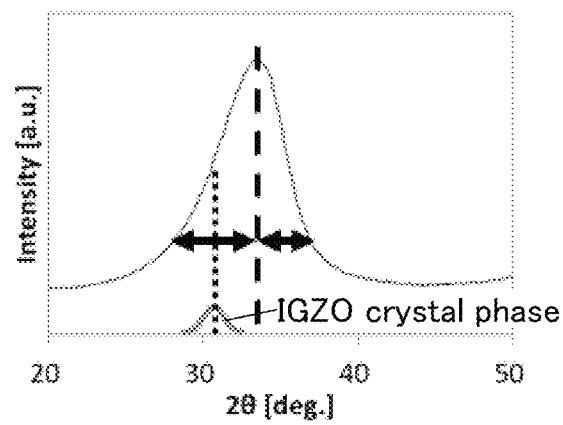
FIG. 40D
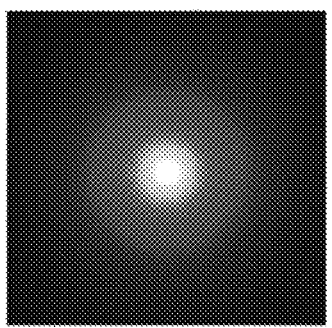
FIG. 40E
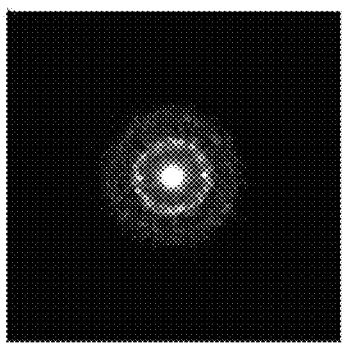

SEMICONDUCTOR DEVICE, METHOD FOR DRIVING SEMICONDUCTOR DEVICE, AND ELECTRONIC DEVICE

CROSS REFERENCE TO RELATED APPLICATIONS

This application is a U.S. National Phase Application under 35 U.S.C. § 371 of International Application PCT/IB2021/059850, filed on Oct. 26, 2021, which is incorporated by reference and claims the benefit of a foreign priority application filed in Japan on Nov. 6, 2020, as Application No. 2020-185673.

TECHNICAL FIELD

One embodiment of the present invention relates to a semiconductor device and a driving method thereof. One embodiment of the present invention relates to a semiconductor device including a light-emitting unit and an imaging unit and a driving method thereof. One embodiment of the present invention relates to an imaging unit and a driving method thereof. One embodiment of the present invention relates to an electronic device.

Note that one embodiment of the present invention is not limited to the above technical field. Examples of the technical field of one embodiment of the present invention disclosed in this specification and the like include a semiconductor device, a display device, a light-emitting unit, a power storage device, a memory device, an electronic device, a lighting device, an input device (e.g., touch sensor), an input/output device (e.g., touch panel), a driving method thereof, and a manufacturing method thereof. A semiconductor device generally means a device that can function by utilizing semiconductor characteristics.

BACKGROUND ART

Imaging units have been used in devices such as digital cameras conventionally, and with the widespread use of portable information terminals such as smartphones and tablet terminals, an improvement in performance, a reduction in size, and a reduction in costs have been needed. Moreover, imaging units have been not only used for taking a photograph or a moving image but also applied to biometric authentication such as face authentication, fingerprint authentication, and vein authentication or input devices such as touch sensors or motion sensors, for example; that is, the usage has been diversified. Patent Document 1 discloses electronic devices such as smartphones capable of fingerprint authentication.

REFERENCE

Patent Document

[Patent Document 1] Japanese Published Patent Application No. 2019-79415

SUMMARY OF THE INVENTION

Problems to be Solved by the Invention

As a method of performing fingerprint authentication, which is one mode of authentication, there is a method in which a finger is irradiated with light from a light-emitting element and light reflected by the finger is detected by a light-receiving element. In this case, time-consuming fingerprint authentication allows high accuracy in the fingerprint authentication. However, if authentication such as fingerprint authentication takes a long time, it is stressful for a person being authenticated.

An object of one embodiment of the present invention is to provide a semiconductor device capable of performing authentication in a short time and a driving method thereof. Another object is to provide a method of driving a semiconductor device capable of performing highly accurate authentication and a driving method thereof. Another object is to provide a driving method of a highly reliable semiconductor device and a driving method thereof. Another object is to provide a novel semiconductor device and a driving method thereof.

Another object is to provide an imaging unit capable of performing authentication in a short time and a driving method thereof. Another object is to provide an imaging unit capable of performing highly accurate authentication and a driving method thereof. Another object is to provide a highly reliable imaging unit and a driving method thereof. Another object is to provide a novel imaging unit and a driving method thereof.

Note that the description of these objects does not preclude the existence of other objects. In one embodiment of the present invention, there is no need to achieve all these objects. Note that other objects can be derived from the description of the specification, the drawings, the claims, and the like.

Means for Solving the Problems

One embodiment of the present invention is a semiconductor device including a light-emitting unit and an imaging unit, the imaging unit includes a first register circuit, a second register circuit, and a latch circuit, the first register circuit has a function of outputting a scan signal, the scan signal and a start pulse signal are input to the latch circuit, and the latch circuit has a function of outputting one of the scan signal and the start pulse signal to the second register circuit on the basis of data held in the latch circuit.

In the above embodiment, each of the first register circuit, the second register circuit, and the latch circuit may include a transistor, and the transistor may include a metal oxide in a channel formation region.

Another embodiment of the present invention is a semiconductor device including a light-emitting unit and an imaging unit, the imaging unit includes first to m-th latch circuits (m is an integer greater than or equal to 2) and first to m-th register circuits, a first start pulse signal is input to the first latch circuit, a second start pulse signal is input to the first to m-th latch circuits, scan signals output from the first to (m−1)-th register circuits are input to the second to m-th latch circuits respectively, the first latch circuit has a function of outputting one of the first start pulse signal and the second start pulse signal to the first register circuit on the basis of data held in the first latch circuit, and the second to m-th latch circuits have a function of outputting one of the scan signal and the second start pulse signal to the second to m-th register circuits, respectively, on the basis of data held in the second to m-th latch circuits.

In the above embodiment, the imaging unit may have a function of being driven in a first mode in which the first latch circuit outputs the first start pulse signal and the second to m-th latch circuits output the scan signals, the imaging unit may have a function of being driven in a second mode in which any of the first to m-th latch circuits outputs the second start pulse signal, and a transmission rate of the scan signal in the first mode may be higher than a transmission rate of the scan signal in the second mode.

In the above embodiment, in the second mode, the first latch circuit does not necessarily have to output the first start pulse signal.

In the above embodiment, when in the second mode, a p-th latch circuit (p is an integer greater than or equal to 2 and less than or equal to m) outputs the second start pulse signal, the first latch circuit may output neither the first start pulse signal nor the second start pulse signal, and the second to (p−1)-th latch circuits may output neither the scan signal nor the second start pulse signal.

In the above embodiment, the imaging unit may include a pixel portion in which pixels are arranged in matrix with m rows and n columns (n is an integer greater than or equal to 1), a detection circuit, and a control circuit. The detection circuit may have a function of detecting an object touching the pixel portion, and the control circuit may have a function of generating data to be written to the first to m-th latch circuits on the basis of a result of the detection.

In the above embodiment, each of the first to m-th latch circuits and the first to m-th register circuits may include a transistor, and the transistor may include a metal oxide in a channel formation region.

Another embodiment of the present invention is an electronic device including the semiconductor device of one embodiment of the present invention and an operation button.

Another embodiment of the present invention is a method for driving a semiconductor device including a light-emitting unit and an imaging unit, the imaging unit includes a shift register circuit in which first to m-th latch circuits (m is an integer greater than or equal to 2) and first to m-th register circuits are connected in series alternately. The driving method includes inputting a first start pulse signal to the first register circuit via the first latch circuit in a first period; outputting a first scan signal from the first register circuit and sequentially transferring the first scan signal to the second to m-th register circuits via the second to m-th latch circuits in a second period; writing data to a p-th latch circuit (p is any of integers greater than or equal to 1 and less than or equal to m) after inputting the first start pulse signal to the first latch circuit in a third period; inputting a second start pulse signal to a p-th register circuit via the p-th latch circuit in a fourth period; outputting a second scan signal from the p-th register circuit and transferring the second scan signal to a (p+1)-th register circuit via a (p+1)-th latch circuit in a fifth period; and a transmission rate of the first scan signal is higher than a transmission rate of the second scan signal. In the above embodiment, the imaging unit may include a pixel portion in which pixels are arranged in matrix with m rows and n columns (n is an integer greater than or equal to 1), a pixel may acquire captured-image data before start of the first period; the shift register circuit sequentially may supply, to pixels in first to m-th rows, a selection signal that selects the pixel from which the captured-image data is read out in response to the first scan signal in the second period; the semiconductor device may detect a position of an object touching the pixel portion on the basis of the captured-image data after an end of the second period, and a latch circuit to which the data is written may be determined on the basis of the position of the object in the third period.

In the above embodiment, the semiconductor device may perform authentication after an end of the fifth period.

In the above embodiment, the first to m-th latch circuits and the first to m-th register circuits may each include a transistor, and the transistor may include a metal oxide in a channel formation region.

Another embodiment of the present invention is an imaging unit that includes a first register circuit, a second register circuit, and a latch circuit, the first register circuit has a function of outputting a scan signal, the scan signal and a start pulse signal are input to the latch circuit, and the latch circuit has a function of outputting one of the scan signal and the start pulse signal to the second register circuit on the basis of data held in the latch circuit.

In the above embodiment, each of the first register circuit, the second register circuit, and the latch circuit may include a transistor, and the transistor may include a metal oxide in a channel formation region.

One embodiment of the present invention is an imaging unit that includes first to m-th latch circuits (m is an integer greater than or equal to 2) and first to m-th register circuits, a first start pulse signal is input to the first latch circuit, a second start pulse signal is input to the first to m-th latch circuits, scan signals output from the first to (m−1)-th register circuits are input to the second to m-th latch circuits respectively, the first latch circuit has a function of outputting one of the first start pulse signal and the second start pulse signal to the first register circuit on the basis of data held in the first latch circuit, and the second to m-th latch circuits have a function of outputting one of the scan signal and the second start pulse signal to the second to m-th register circuits, respectively, on the basis of data held in the second to m-th latch circuits.

In the above embodiment, the imaging unit may have a function of being driven in a first mode in which the first latch circuit outputs the first start pulse signal and the second to m-th latch circuits may output the scan signals, the imaging unit may have a function of being driven in a second mode in which any of the first to m-th latch circuits outputs the second start pulse signal, and a transmission rate of the scan signal in the first mode may be higher than a transmission rate of the scan signal in the second mode.

In the above embodiment, in the second mode, the first latch circuit does not necessarily have to output the first start pulse signal.

In the above embodiment, when in the second mode, a p-th latch circuit (p is an integer greater than or equal to 2 and less than or equal to m) outputs the second start pulse signal, the first latch circuit may output neither the first start pulse signal nor the second start pulse signal, and the second to (p−1)-th latch circuits may output neither the scan signal nor the second start pulse signal.

In the above embodiment, the imaging unit may include a pixel portion in which pixels are arranged in matrix with m rows and n columns (n is an integer greater than or equal to 1), a detection circuit, and a control circuit. The detection circuit may have a function of detecting an object touching the pixel portion, and the control circuit may have a function of generating data to be written to the first to m-th latch circuits on the basis of a result of the detection.

In the above embodiment, each of the first to m-th latch circuits and the first to m-th register circuits may include a transistor, and the transistor may include a metal oxide in a channel formation region.

Another embodiment of the present invention is an electronic device including the imaging unit of one embodiment of the present invention and an operation button.

Another embodiment of the present invention is a method for driving an imaging unit that includes a shift register circuit in which first to m-th latch circuits (m is an integer greater than or equal to 2) and first to m-th register circuits are connected in series alternately. The driving method includes inputting a first start pulse signal to the first register circuit via the first latch circuit in a first period; outputting a first scan signal from the first register circuit and sequentially transferring the first scan signal to the second to m-th register circuits via the second to m-th latch circuits in a second period; writing data in a p-th latch circuit (p is any of integers greater than or equal to 1 and less than or equal to m) after inputting the first start pulse signal to the first latch circuit in a third period; inputting the second start pulse signal to a p-th register circuit via the p-th latch circuit in a fourth period; outputting a second scan signal from the p-th register circuit and transferring the second scan signal to a (p+1)-th register circuit via a (p+1)-th latch circuit in a fifth period; and a transmission rate of the first scan signal is higher than a transmission rate of the second scan signal.

In the above embodiment, the imaging unit may include a pixel portion in which pixels are arranged in matrix with m rows and n columns (n is an integer greater than or equal to 1), a pixel may acquire captured-image data before start of the first period, the shift register circuit sequentially may supply, to pixels in first to m-th rows, a selection signal that selects the pixel from which the captured-image data is read out in response to the first scan signal in the second period, the imaging unit may detect a position of an object touching the pixel portion on the basis of the captured-image data after an end of the second period, and a latch circuit to which the data is written may be determined on the basis of the position of the object in the third period.

Alternatively, in the above embodiment, the imaging unit may perform authentication after an end of the fifth period.

Alternatively, in the above embodiment, the first to m-th latch circuits and the first to m-th register circuits may each include a transistor, and the transistor may include a metal oxide in a channel formation region.

Effect of the Invention

According to one embodiment of the present invention, a semiconductor device capable of performing authentication in a short time and a driving method thereof can be provided. A semiconductor device capable of performing highly accurate authentication and a driving method thereof can be provided. A highly reliable semiconductor device and a driving method thereof can be provided. A novel semiconductor device and a driving method thereof can be provided.

An imaging unit capable of performing authentication in a short time and a driving method thereof can be provided. An imaging unit capable of performing highly accurate authentication and a driving method thereof can be provided. A highly reliable imaging unit and a driving method thereof can be provided. A novel imaging unit and a driving method thereof can be provided.

Note that the description of these effects does not preclude the existence of other effects. One embodiment of the present invention does not need to have all these effects. Other effects can be derived from the description of the specification, the drawings, the claims, or the like.

BRIEF DESCRIPTION OF THE DRAWINGS

FIG. 2A is a block diagram illustrating a structure example of an imaging unit. FIG. 2B1 is a circuit diagram illustrating a structure example of the imaging unit. FIG. 2B2 is a timing chart showing an example of a method for driving the imaging unit.

FIG. 5A1, FIG. 5A2, FIG. 5B1, and FIG. 5B2 are circuit diagrams illustrating structure examples of a latch circuit.

FIG. 17A, and FIG. 17B1 to FIG. 17B3 are circuit diagrams illustrating a structure example of a demultiplexer circuit.

FIG. 40A is a diagram showing the classification of crystal structures of IGZO. FIG. 40B is a diagram showing an XRD spectrum of a quartz glass substrate. FIG. 40C is a diagram showing an XRD spectrum of a crystalline IGZO film. FIG. 40D a diagram showing a nanobeam electron diffraction pattern of a quartz glass substrate. FIG. 40E is a diagram showing a nanobeam electron diffraction pattern of the crystalline IGZO film.

MODE FOR CARRYING OUT THE INVENTION

Figure 1A:
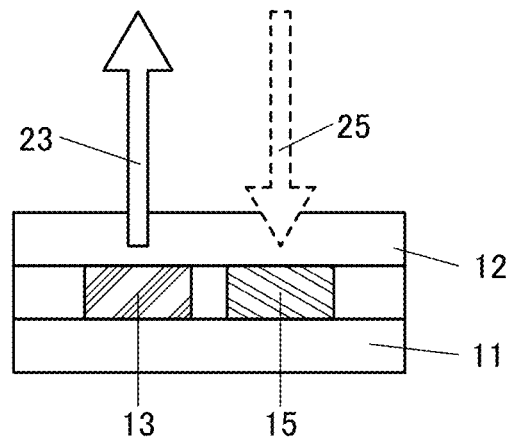
FIG. 1A, and FIG. 1B are schematic cross-sectional views illustrating a structure example of a semiconductor device.

Embodiments are described in detail with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the description in the following embodiments. Note that in the structures of the invention described below, the same portions or portions having similar functions are denoted with the same reference numerals in different drawings, and description of such portions is not repeated.

The position, size, range, or the like of each component illustrated in the drawings and the like do not represent the actual position, size, range, or the like in some cases for easy understanding of the invention. Therefore, the disclosed invention is not necessarily limited to the position, size, range, or the like disclosed in the drawings or the like. For example, in an actual manufacturing process, a resist mask or the like might be unintentionally reduced in size by treatment such as etching, which is not be reflected in the drawings for easy understanding in some cases.

In addition, in this specification and the like, the terms "electrode" and "wiring" do not functionally limit these components. For example, an "electrode" is used as part of a "wiring" in some cases, and vice versa. Furthermore, the terms "electrode" or "wiring" can also include the case where a plurality of "electrodes" or "wirings" are formed in an integrated manner, for example.

In this specification and the like, the resistance value of a "resistor" is sometimes determined depending on the length of a wiring. Alternatively, the resistance value is sometimes determined through the connection of a conductive layer used for a wiring to a conductive layer with resistivity different from that of the conductive layer used for the wiring. Alternatively, the resistance value is sometimes determined by impurity doping in a semiconductor layer.

In this specification and the like, a "terminal" in an electric circuit refers to a portion that inputs or outputs current or voltage or receives or transmits a signal. Accordingly, part of a wiring or an electrode functions as a terminal in some cases.

Note that the term "over", "above", "under", or "below" in this specification and the like does not necessarily mean that a component is placed directly over and in contact with or directly under and in contact with another component. For example, the expression "electrode B over insulating layer A" does not necessarily mean that the electrode B is formed on and in direct contact with the insulating layer A, and does not exclude the case where another component is provided between the insulating layer A and the electrode B. Additionally, the expression "conductive layer D above conductive layer C" does not necessarily mean that the conductive layer D is formed on and in direct contact with the conductive layer C, and does not exclude the case where another component is provided between the conductive layer C and the conductive layer D. The term "above" or "below" does not exclude the case where a component is placed in an oblique direction.

Furthermore, functions of a source and a drain are interchanged with each other depending on operation conditions, for example, when a transistor with a different conductivity type is employed or when the direction of current flow is changed in circuit operation; therefore, it is difficult to define which is the source or the drain. Therefore, the terms source and drain can be switched in this specification.

In this specification and the like, the expression "electrically connected" includes the case where components are directly connected to each other and the case where components are connected through an "object having any electric function". Here, there is no particular limitation on the "object having any electric function" as long as electric signals can be transmitted and received between components that are connected through the object. Thus, even when the expression "electrically connected" is used, there is a case where no physical connection portion is made and a wiring is just extended in an actual circuit. In addition, the expression "directly connected" includes the case where different conductive layers are connected to each other through a contact to form a wiring. Thus, a wiring may be formed of conductive layers that contain one or more of the same elements or may be formed of conductive layers that contain different elements.

In this specification and the like, the terms "identical", "same", "equal", "uniform", and the like used in describing calculation values and actual measurement values allow for a margin of error of ±20% unless otherwise specified.

A voltage refers to a potential difference between a given potential and a reference potential (e.g., a ground potential or a source potential) in many cases. Therefore, the terms "voltage" and "potential" can be replaced with each other in many cases. In this specification and the like, the terms "voltage" and "potential" can be replaced with each other unless otherwise specified.

Note that a "semiconductor" has characteristics of an "insulator" when the conductivity is sufficiently low, for example. Thus, a "semiconductor" can be replaced with an "insulator". In that case, a "semiconductor" and an "insulator" cannot be strictly distinguished from each other because a border therebetween is not clear. Accordingly, a "semiconductor" and an "insulator" described in this specification can be replaced with each other in some cases.

Furthermore, a "semiconductor" has characteristics of a "conductor" when the conductivity is sufficiently high, for example. Thus, a "semiconductor" can be replaced with a "conductor". In that case, a "semiconductor" and a "conductor" cannot be strictly distinguished from each other because a border therebetween is not clear. Accordingly, a "semiconductor" and a "conductor" described in this specification can be replaced with each other in some cases.

Note that ordinal numbers such as "first" and "second" in this specification and the like are used in order to avoid confusion among components and do not denote the priority or the order such as the order of steps or the stacking order. A term without an ordinal number in this specification and the like may be provided with an ordinal number in the scope of claims in order to avoid confusion among components. Furthermore, a term with an ordinal number in this specification and the like may be provided with a different ordinal number in the scope of claims. Furthermore, even when a term is provided with an ordinal number in this specification and the like, the ordinal number may be omitted in the scope of claims.

Note that in this specification and the like, an "on state" of a transistor refers to a state in which a source and a drain of the transistor are electrically short-circuited (also referred to as a "conduction state"). Furthermore, an "off state" of a transistor refers to a state in which a source and a drain of the transistor are electrically disconnected (also referred to as a "non-conduction state"). For example, the transistor in the on state can operate in a linear region.

In addition, in this specification and the like, an "on-state current" sometimes refers to a current that flows between a source and a drain when a transistor is in an on state. Furthermore, an "off-state current" sometimes refers to a current that flows between a source and a drain when a transistor is in an off state.

In this specification and the like, a gate refers to part or the whole of a gate electrode and a gate wiring. A gate wiring refers to a wiring for electrically connecting at least one gate electrode of a transistor to another electrode or another wiring.

In this specification and the like, a source refers to part or the whole of a source region, a source electrode, and a source wiring. A source region refers to a region in a semiconductor layer where the resistivity is lower than or equal to a given value. A source electrode refers to part of a conductive layer that is connected to a source region. A source wiring refers to a wiring for electrically connecting at least one source electrode of a transistor to another electrode or another wiring.

In this specification and the like, a drain refers to part or the whole of a drain region, a drain electrode, and a drain wiring. A drain region refers to a region in a semiconductor layer where the resistivity is lower than or equal to a given value. A drain electrode refers to part of a conductive layer in a portion that is connected to a drain region. A drain wiring refers to a wiring for electrically connecting at least one drain electrode of a transistor to another electrode or another wiring.

Embodiment 1

In this embodiment, a semiconductor device of one embodiment of the present invention will be described.

A semiconductor device of one embodiment of the present invention includes a light-emitting unit and an imaging unit. The light-emitting unit has a function of, for example, emitting infrared light or visible light. The imaging unit has a function of sensing emitted light. For example, a detection target is irradiated with light emitted from the light-emitting unit, and the light which is reflected by the detection target can be sensed with the imaging unit. When a detection target is a user's finger of a semiconductor device of one embodiment of the present invention, for example, the semiconductor device of one embodiment of the present invention can perform a finger authentication or the like.

The imaging unit included in the semiconductor device of one embodiment of the present invention includes a pixel portion in which pixels are arranged in a matrix and a row driver circuit having a function of selecting pixels from which captured-image data is read out row by row.

For example, in the case where a finger authentication is performed using the semiconductor device of one embodiment of the present invention, the row driver circuit selects pixels in all rows and read out first image data. In this manner, the position in a pixel portion of a finger that is contact with the pixel portion is detected, for example. Next, the row driver circuit selects only pixels at rows with which the finger is contact and at peripheral rows of the rows and reads out second image data. In this manner, the semiconductor device of one embodiment of the present invention performs finger authentication.

Here, when the first image data is read out, detection of the position of a finger is sufficient, and thus the finger authentication is not needed. Therefore, the readout period for the pixels in one row can be shortened as compared with the case where a finger authentication is performed. When the second captured-image data is read out, the readout period for the pixels in one row is longer than that in the case where the first image data is read out, since a finger authentication needs to be performed. In the semiconductor device of one embodiment of the present invention, pixels from which second image data is read out for finger authentication can be only some of pixels provided in a pixel portion. Thus, finger authentication can be performed in a shorter time than the time taken in the case where second image data is read out of all pixels. Furthermore, even when it takes a long time to read out the second image data, the time necessary for finger authentication, i.e., the total of time for reading the first captured-image data and time for reading the second captured-image data can be prevented from being a considerably long time. Therefore, the semiconductor device of one embodiment of the present invention can perform finger authentication with high accuracy in a short time.

Structure Example_1 of Semiconductor Device

FIG. 1A is a diagram illustrating a structure example of a semiconductor device 10. The semiconductor device 10 includes a substrate 11 and a substrate 12, and a light-emitting unit 13 and an imaging unit 15 are provided between the substrate 11 and the substrate 12.

The light-emitting unit 13 has a function of emitting light 23. The light 23 can be infrared light or visible light.

The imaging unit 15 has a function of detecting incident light 25. Specifically, the imaging unit 15 is provided with a light-receiving element and has a function of detecting the light incident on the light-receiving element.

In this specification and the like, the term "element" can be replaced with the term "device" as appropriate in some cases. For example, a light-receiving element can be referred to as a light-receiving device.

A photoelectric conversion element that detects incident light and generates charge can be used as the light-receiving element. The amount of generated electric charge depends on the amount of light incident on the light-light-receiving element. As the light-receiving element, a pn photodiode or a pin photodiode can be used, for example.

As the light-receiving element, an organic photodiode including an organic compound in a photoelectric conversion layer is preferably used. An organic photodiode is easily made thin and lightweight and easily has a large area. In addition, an organic photodiode can be used in a variety of imaging units because of its high flexibility in shape and design. Alternatively, a photodiode containing amorphous silicon, crystalline silicon (e.g., single crystal silicon, polycrystalline silicon, or microcrystalline silicon), a metal oxide, or the like can be used as the light-receiving element.

A photodiode containing an appropriate material as an organic compound in a photoelectric conversion layer can have sensitivity to light ranging from ultraviolet light to infrared light. A photodiode containing amorphous silicon in a photoelectric conversion layer has sensitivity mainly to visible light, and a photodiode containing crystalline silicon in a photoelectric conversion layer has sensitivity to light ranging from visible light to infrared light. Since a metal oxide has a wide band gap, a photodiode containing a metal oxide in a photoelectric conversion layer has high sensitivity to mainly light having a higher energy than visible light. Furthermore, as the metal oxide, an In-M-Zn oxide can be used.

The semiconductor device 10, for example, emits the light 23 to a detection target, and the light reflected by the detection target can be detected as the light 25 with the imaging unit 15.

Figure 1B:
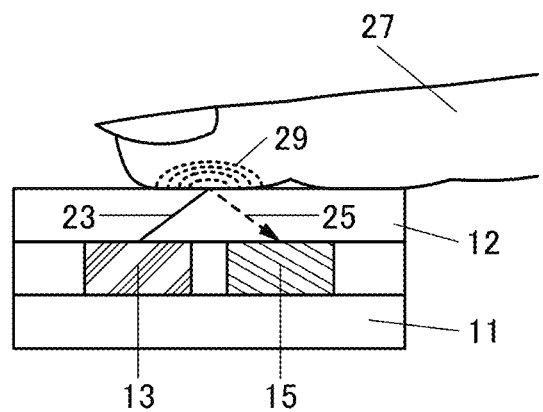

FIG. 1B is a diagram illustrating an example of a function of the semiconductor device In FIG. 1B, the detection target is a finger 27. The finger 27 can be a finger of the user of the semiconductor device 10, for example.

In FIG. 1B, the light 23 is emitted to the finger 27 and the imaging unit 15 detects the light reflected by the finger 27 as the light 25, whereby a fingerprint 29 of the finger 27 can be detected. In this manner, authentication such as fingerprint authentication can be performed.

Structure Example_1 of Imaging Unit

FIG. 2A is a block diagram illustrating a structure example of the imaging unit 15. The imaging unit 15 includes a pixel portion 30 in which pixels 31 in m rows and n columns (m and n are integers more than or equal to 1) are arranged in a matrix, a control circuit 32, a row driver circuit 33, a CDS circuit 34, a readout circuit 36, and a detection circuit 37. Here, the row driver circuit 33 includes a shift register circuit, which is not illustrated in FIG. 2A. A specific structure example of the shift register circuit is described later. The CDS circuit 34 can be provided for each column of the pixels 31. FIG. 2A illustrates an example in which n CDS circuits 34 are provided.

In this specification and the like, when a plurality of components are denoted by the same reference numerals and in particular need to be distinguished from each other, an identification sign such as "[ ]", "< >", "( )", or "_" is sometimes added to the reference numerals. For example, the pixel 31 in the first row and the first column is denoted with a pixel 31[1,1], and the pixel 31 in the m-th row and the n-th column is denoted with a pixel 31[m,n]. Furthermore, the CDS circuit 34 in the first column is denoted with the CDS circuit 34[1], and the CDS circuit 34 in the n-th column is denoted with the CDS circuit 34[n].

The row driver circuit 33 is electrically connected to the pixels 31 through a wiring 43. The row driver circuit 33 is electrically connected to the pixels 31 through a wiring 44. Here, the wiring 43 is electrically connected to a terminal SL, and the wiring 44 is electrically connected to a terminal RS.

The CDS circuit 34 is electrically connected to the pixels 31 through the wiring 45. The CDS circuit 34 is electrically connected to the readout circuit 36.

FIG. 2A illustrates a structure in which the pixels 31 in the same row are electrically connected to the same wiring 43 (terminal SL) and the same wiring 44 (terminal RS), and the pixels 31 in the same column are electrically connected to the same wiring 45. In this specification and the like, for example, the wiring 43 (terminal SL) electrically connected to the pixels 31 in the first row is referred to as a wiring 43[1] (terminal SL[1]) and the wiring 43 (terminal SL) electrically connected to the pixels 31 in the m-th row is referred to as a wiring 43[m] (terminal SL[m]). For example, the wiring 44 (terminal RS) electrically connected to the pixels 31 in the first row is referred to as a wiring 44[1] (terminal RS[1]) and the wiring 44 (terminal RS) electrically connected to the pixels 31 in the m-th row is referred to as a wiring 44[m] (terminal RS[m]). For example, the wiring 45 electrically connected to the pixels 31 in the first column is referred to as a wiring 45[1], and the wiring 45 electrically connected to the pixels 31 in the n-th column is referred to as a wiring 45[n].

The control circuit 32 has a function of generating a signal for controlling driving of the row driver circuit 33. The control circuit 32 has a function of generating, for example, a start pulse signal, a clock signal, and the like, and supplying such signals to the row driver circuit 33. The signals generated by the control circuit 32 will be described in detail later.

The row driver circuit 33 has a function of selecting the pixels 31 from which captured-image data is read out. Specifically, the pixels 31 from which the captured-image data acquired is read out can be selected by supplying a signal to the wiring 43 (terminal SL). The row driver circuit 33 also has a function of selecting the pixels 31 to be subjected to the reset of the acquired captured-image data. Specifically, the pixels 31 to be subjected to the reset of the captured-image data can be selected by supplying a signal to the wiring 44 (terminal RS). Note that the row driver circuit is also referred to as a gate driver circuit or a scan driver circuit.

In this specification and the like, a high-potential signal is simply referred to as a "signal" in some cases. For example, "a high-potential signal is supplied" is simply referred to as "a signal is supplied", and "a low-potential signal is supplied" is simply referred to as "supply of a signal is stopped" in some cases.

The CDS circuit 34 has a function of performing correlated double sampling (CDS) on captured-image data read out from the pixel 31. The correlated double sampling is to take a difference between a potential output from the pixel 31 when captured-image data is read out and a potential output from the pixel 31 when the captured-image data is reset. The correlated double sampling can reduce noise in the captured-image data that is read out.

The readout circuit 36 has a function of sequentially outputting captured-image data output from the CDS circuit 34[1] to the CDS circuit 34[n] to the detection circuit 37, for example.

The detection circuit 37 has a function of detecting an object, for example, on the basis of data output from the readout circuit 36. For example, when the semiconductor device 10 is driven as illustrated in FIG. 1B, the detection circuit 37 has a function of detecting the finger 27. Furthermore, the detection circuit 37 has a function of detecting a fingerprint 29 of the finger 27 and authenticating it.

The result of detection by the detection circuit 37 is supplied to the control circuit 32. Thus, the row driver circuit 33 can be driven in accordance with the result of detection by the detection circuit 37.

Not all the circuits in FIG. 2A may be provided in the imaging unit 15. For example, the control circuit 32 and the detection circuit 37 may be provided outside the imaging unit 15.

Structure Example_1 of Pixel

FIG. 2B1 is a circuit diagram illustrating a structure example of the pixel 31. The pixel 31 with a structure illustrated in FIG. 2B1 includes a light-receiving element 50, a transistor 51, a transistor 52, a transistor 53, a transistor 54, a capacitor 56, and a capacitor 57. Note that the capacitor 56 and/or the capacitor 57 is not necessarily provided. Descriptions below are made on the assumption that the transistor 51 to the transistor 54 are n-channel transistors; however, the description below can also be referred to for the case where a p-channel transistor is included by reversing the high/low relationship between potentials as appropriate, for example.

One electrode of the light-receiving element 50 is electrically connected to one electrode of the capacitor 57. The one electrode of the capacitor 57 is electrically connected to one of a source and a drain of the transistor 51. The other of the source and the drain of the transistor 51 is electrically connected to a gate of the transistor 52. One of a source and a drain of the transistor 52 is electrically connected to one of a source and a drain of the transistor 53. A gate of the transistor 52 is electrically connected to one of a source and a drain of the transistor 54. The one of the source and the drain of the transistor 54 is electrically connected to one electrode of the capacitor 56. Note that a node where the other of the source and the drain of the transistor 51, the gate of the transistor 52, one of the source and the drain of the transistor 54, and the one electrode of the capacitor 56 are electrically connected to each other is referred to as a node FD.

A gate of the transistor 51 is electrically connected to a wiring 41. A gate of the transistor 53 is electrically connected to the wiring 43 (terminal SL). A gate of the transistor 54 is electrically connected to the wiring 44 (terminal RS). The other of the source and the drain of the transistor 53 is electrically connected to the wiring 45. The other electrode of the light-receiving element 50 and the other electrode of the capacitor 57 are electrically connected to a wiring 46. The other of the source and the drain of the transistor 52 is electrically connected to a wiring 47. The other of the source and the drain of the transistor 54 is electrically connected to a wiring 48. The other electrode of the capacitor 56 is electrically connected to a wiring 49.

A power potential can be supplied to the wiring 46 to the wiring 49. Thus, it can be said that the wiring 46 to the wiring 49 each have a function of a power supply line. For example, a high potential can be supplied to the wiring 47, and a low potential can be supplied to the wiring 49. In the case where the cathode of the light-receiving element 50 is electrically connected to the wiring 46 as illustrated in FIG. 2B1, the wiring 46 can have a high potential and the wiring 48 can have a low potential. In contrast, in the case where the anode of the light-receiving element 50 is electrically connected to the wiring 46, the wiring 46 can have a low potential and the wiring 48 can have a high potential.

FIG. 2B2 is a timing chart illustrating an example of a driving method of the pixel 31 with the structure illustrated in FIG. 2B1. Here, the potential of the wiring 46 is set to a high potential, and the potential of the wiring 48 is set to a low potential. Note that in FIG. 2B2, "H" means a high potential and "L" means a low potential. The same applies to other timing charts. FIG. 2B2 illustrates Period T1 to Period T5 as a driving period of the pixel 31.

In Period T1, the potentials of the wiring 41 and the wiring 44 (terminal RS) is set to high potentials, and the potential of the wiring 43 (terminal SL) is set to a low potential. Accordingly, the transistor 51 and the transistor 54 are turned on and the transistor 53 is turned off. The transistor 54 is turned on, whereby the potential of the node FD becomes a low potential that is the potential of the wiring 48. Furthermore, since the transistor 51 is turned on in addition to the transistor 54, the potential of one electrode of the light-receiving element 50 also becomes a low potential that is the potential of the wiring 48, which is not illustrated in FIG. 2B2. Therefore, electric charges stored in the capacitor 56, the capacitor 57, and the like are reset. Thus, Period T1 can be referred to as a reset period, and the operation in Period T1 can be referred to as the reset operation.

In Period T2, the potentials of the wiring 41 and the wiring 44 (terminal RS) are set to low potentials. Thus, the transistor 51 and the transistor 54 are turned off. When light is incident on the light-receiving element 50 in this state, electric charges corresponding to energy of light that enters the light-receiving element 50 are stored in the capacitor 57. Thus, Period T2 can be referred to as an exposure period, and the operation in Period T2 can be referred to as an exposure operation.

In Period T3, the potential of the wiring 41 is set to a high potential. Thus, the transistor 51 is turned on, whereby the electric charges stored in the capacitor 57 are transferred to the node FD. Accordingly, the potential of the node FD is increased. Thus, Period T3 can be referred to as a transfer period, and the operation in Period T3 can be referred to as a transfer operation.

In Period T4, the potential of the wiring 41 is set to a low potential. Accordingly, the transistor 51 is turned off, whereby transfer of electric charges from the capacitor 57 to the node FD is finished.

In the above manner, captured-image data is acquired by the pixel 31. Specifically, the potential of the node FD becomes a potential corresponding to the captured-image data. Thus, Period T1 to Period T4 can be referred to as an acquisition period, and an operation performed in Period T1 to Period T4 can be referred to as an acquisition operation.

Next, an example of the driving method for Period T5 will be described. In Period T5, the potential of the wiring 43 (terminal SL) is set to a high potential. Thus, the transistor 53 is turned on, and a signal representing the captured-image data acquired by the pixel 31 is output to the wiring 45. Specifically, the potential of the wiring 45 becomes a potential corresponding to the potential of the node FD. Accordingly, captured-image data acquired by the pixel 31 is read out.

As described above, a high potential signal is supplied to the wiring 43 (terminal SL), whereby the captured-image data acquired by the pixel 31 is read out. In other words, the pixel 31 from which the captured-image data is read out can be selected by the signal supplied to the wiring 43 (terminal SL). Thus, the signal supplied to the wiring 43 (terminal SL) can be referred to as a selection signal.

After the captured-image data is read out, the potential of the wiring 44 (terminal RS) is set to a high potential. Thus, the transistor 54 is turned on, and the captured-image data acquired by the pixel 31 is reset. Specifically, the potential of the node FD becomes a low potential that is the potential of the wiring 48. Here, since the transistor 53 is in the on state, the potential of the wiring 45 is changed in accordance with the potential change of the node FD. Therefore, the CDS circuit 34 electrically connected to the wiring 45 can perform correlated double sampling.

As described above, a high potential signal is supplied to the wiring 44 (terminal RS), whereby the captured-image data acquired by the pixel 31 is reset. Thus, a signal supplied to the wiring 44 (terminal RS) can be referred to as a reset signal.

After the correlated double sampling is performed, the potential of the wiring 44 (the terminal RS) is set to be a low potential to turn off the transistor 54, while the potential of the wiring 43 (terminal SL) is set to a low potential to turn off the transistor 53.

The above is an example of the driving method for Period T5. In Period T5, the captured-image data acquired by the pixel 31 is read out. Thus, Period T5 can be referred to as a readout period, and the operation in Period T5 can be referred to as a readout operation.

The acquisition of captured-image data by the pixel 31[1,1] to the pixel 31[m,n] is preferably performed with the global shutter mode. Here, the global shutter mode refers to a method of acquiring captured-image data in all the pixels at the same time. When captured-image data is acquired by the global shutter mode, simultaneousness of image capturing can be secured; thus, an image with few distortions can be easily obtained even though an object moves fast.

In contrast, captured-image data is read out from the pixel 31[1,1] to the pixel 31[m,n] row by row, for example. Therefore, in the case of acquisition of captured-image data with the global shutter mode, there are some pixels 31 with long periods from acquisition of captured-image data to readout of the captured-image data. Therefore, in the case of acquisition of captured-image data with the global shutter mode, it is preferable that electric charges transferred from the capacitor 57 to the node FD can be held for a long time.

In order to hold electric charge in the node FD for a long time, the transistor electrically connected to the node FD may be a transistor with a low off-state current. Examples of the transistor with a low off-state current include a transistor including a metal oxide in a channel formation region (hereinafter, an OS transistor). Thus, the transistor 51 and the transistor 54 are preferably OS transistors.

The channel formation region of an OS transistor preferably includes a metal oxide. The metal oxide preferably contains at least indium or zinc. In particular, indium and zinc are preferably contained. In addition to them, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

The off-state current per channel width of 1 μm of an OS transistor can be as low as approximately 1 yA/μm (y: yocto, $10^{-24}$) to 1 zA/μm (z: zepto, $10^{-21}$).

A CAC (Cloud-Aligned Composite)-OS is preferably used for the OS transistor. The details of a CAC-OS will be described in a subsequent embodiment.

As the transistor 51 to the transistor 54, a transistor other than the OS transistor can be used if having a low off-state current. For example, a transistor including a wide-bandgap semiconductor may be used. In some cases, a wide-bandgap semiconductor refers to a semiconductor with a bandgap of 2.2 eV or more. Examples of the semiconductor include silicon carbide, gallium nitride, and diamond.

Note that the transistor 51 and the transistor 54 may be transistors including silicon in their channel formation regions (hereinafter, Si transistors) or the like, for example. A Si transistor has a higher off-state current than an OS transistor. However, by making the capacitance of the capacitor 56 large, for example, captured-image data can be acquired by the pixel 31[1,1] to the pixel 31[m,n] with the global shutter mode even when the on-state currents of the transistor 51 and the transistor 54 are high. Note that captured-image data may be acquired by the pixel 31[1,1] to the pixel 31[m,n] with the rolling shutter mode. In that case, the capacitance of the capacitor 56 need not be increased even when the transistor 51 and the transistor 54 are transistors with a high off-state current.

The transistor 52 and the transistor 53 may be Si transistors or OS transistors. For example, when transistors including crystalline silicon (typically, low-temperature polysilicon, single crystal silicon, or the like) are used as the transistor 52 and the transistor 53, the on-state current of the transistor 52 and the transistor 53 can be increased. This enables high-speed readout of captured-image data. In contrast, when all of the transistor 51 to the transistor 54 are OS transistors, all the transistors included in the pixel 31 can be formed in the same layer. When all the transistors including the transistor 51 to the transistor 54 included in the semiconductor device 10 are OS transistors, all the transistors included in the semiconductor device 10 can be formed in the same layer. Therefore, the manufacturing process of the semiconductor device 10 can be simplified. Note that transistors including amorphous silicon in their channel formation region may be used as the transistor 51 to the transistor 54.

Structure Example_1 of Shift Register Circuit

Figure 3:
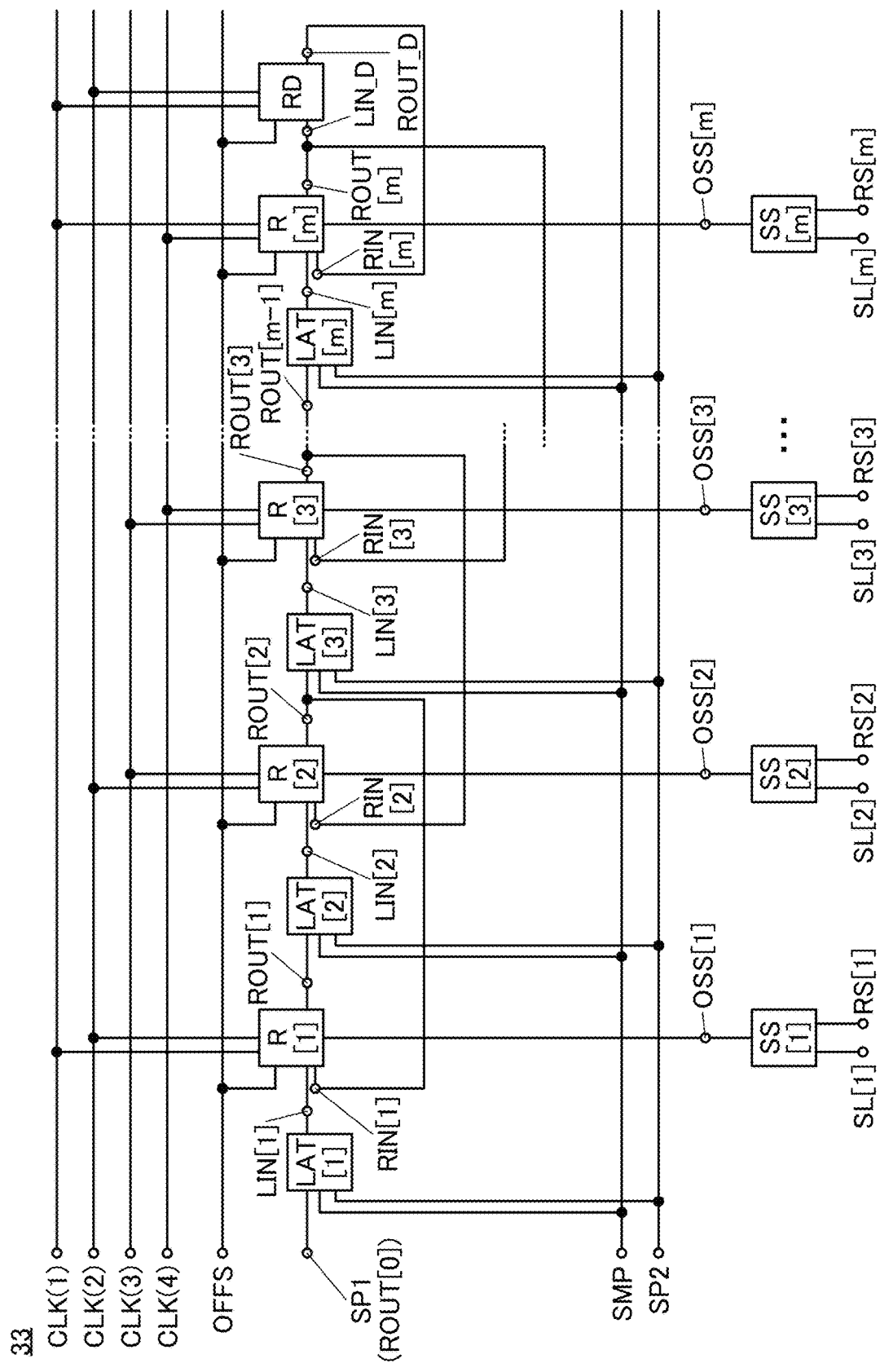
FIG. 3 is a block diagram illustrating a structure example of a row driver circuit.

FIG. 3 is a diagram illustrating a structure example of the row driver circuit 33. Specifically, FIG. 3 is a diagram illustrating a structure example of a shift register circuit included in the row driver circuit 33. The shift register circuit includes a latch circuit LAT, a register circuit R, a register circuit RD, and a signal supply circuit SS. Here, for example, m latch circuits LAT, m register circuits R, and m signal supply circuits SS and one register circuit RD can be provided in the shift register circuit. That is, the latch circuit LAT, the register circuit R, and the signal supply circuit SS can be provided for each row of the pixels 31.

An input terminal to which a signal is input and an output terminal from which a signal is output are electrically connected to each of the latch circuit LAT, the register circuit R, the register circuit RD, and the signal supply circuit SS.

In this specification and the like, an input terminal electrically connected to the latch circuit LAT is referred to as an input terminal of the latch circuit LAT or an input terminal included in the latch circuit LAT in some cases. An output terminal electrically connected to the latch circuit LAT is be referred to as an output terminal of the latch circuit LAT or an output terminal included in the latch circuit LAT in some cases. The same applies to other circuits or the like.

A terminal SP1 is electrically connected to an input terminal of a latch circuit LAT[1]. An output terminal of the latch circuit LAT[1] is electrically connected to a terminal LIN[1], and the terminal LIN[1] is electrically connected to an input terminal of a register circuit R[1]. That is, a signal output from the latch circuit LAT[1] is input to the register circuit R[1] through the terminal LIN[1]. Note that the terminal SP1 may be referred to as a terminal ROUT[0].

An output terminal of the register circuit R[1] is electrically connected to the terminal ROUT[1], and the terminal ROUT[1] is electrically connected to an input terminal of a latch circuit LAT[2]. That is, a signal output from the register circuit R[1] is input to the latch circuit LAT[2] through the terminal ROUT[1].

Similarly, output terminals of the latch circuit LAT[2] to a latch circuit LAT[m] are electrically connected to a terminal LIN[2] to a terminal LIN[m], respectively, and the terminal LIN[2] to the terminal LIN[m] are electrically connected to input terminals of a register circuit R[2] to a register circuit R[m], respectively. Output terminals of the register circuit R[2] to the register circuit R[m−1] are electrically connected to a terminal ROUT[2] to a terminal ROUT[m−1], respectively, and the terminal ROUT[1] to the terminal ROUT[m−1] are electrically connected to input terminals of the latch circuit LAT[3] to the latch circuit LAT[m], respectively.

That is, the register circuit R[1] to the register circuit R[m] are connected in series with the latch circuit LAT[2] to the latch circuit LAT[m] interposed therebetween. In other words, the latch circuit LAT[1] to the latch circuit LAT[m] and the register circuit R[1] to the register circuit R[m] are connected in series alternately.

An output terminal of the register circuit R[m] is electrically connected to a terminal ROUT[m]. The terminal ROUT[m] is electrically connected to a terminal LIN_D and the terminal LIN_D is electrically connected to an input terminal of the register circuit RD.

Here, the terminal ROUT[2] to the terminal ROUT[m] are electrically connected to a terminal RIN[1] to a terminal RIN[m−1], respectively, and the terminal RIN[1] to the terminal RIN[m−1] are electrically connected to input terminals of the register circuit R[1] to the register circuit R[m−1], respectively. Thus, a signal output to the terminal ROUT from register circuit R can be supplied to the register circuit R in the previous stage as well. The output terminal of the register circuit RD is electrically connected to a terminal ROUT_D and the terminal ROUT_D is electrically connected to a terminal RIN[m]. The terminal RIN[m] is electrically connected to the input terminal of the register circuit R[m]. Thus, a signal output to the terminal ROUT_D from the register circuit RD is supplied to the register circuit R[m].

A terminal SMP and a terminal SP2 are electrically connected to the input terminals of the latch circuit LAT[1] to the latch circuit LAT[m]. In addition, two terminals CLK of the terminal CLK(1) to the terminal CLK(4) are electrically connected to the input terminals of the register circuit R[1] to the register circuit R[m] and the register circuit RD. For example, as illustrated in FIG. 3, the terminal CLK(1) and the terminal CLK(2) are electrically connected to the register circuit R[1], the terminal CLK(2) and the terminal CLK(3) are electrically connected to the register circuit R[2], the terminal CLK(3) and the terminal CLK(4) are electrically connected to the register circuit R[3], the terminal CLK(4) and the terminal CLK(1) are electrically connected to the register circuit R[m], and the terminal CLK(1) and the terminal CLK(2) are electrically connected to the register circuit RD. Note that the number of terminals CLK included in the row driver circuit 33 is not limited to four, and the number of terminals CLK electrically connected to one register circuit R is not limited to two.

A terminal OFFS is electrically connected to the input terminals of the register circuit R[1] to the register circuit R[m] and the input terminal of the register circuit RD. A terminal OSS[1] to a terminal OSS[m] are electrically connected to the output terminals of the register circuit R[1] to the register circuit R[m], respectively.

The terminal OSS[1] to the terminal OSS[m] are electrically connected to input terminals of a signal supply circuit SS[1] to a signal supply circuit SS[m], respectively. Thus, a signal output to the terminal OSS from the register circuit R is input to the signal supply circuit SS.

The terminal SL[1] to the terminal SL[m] are electrically connected to output terminals of the signal supply circuit SS[1] to the signal supply circuit SS[m], respectively, and the terminal RS[1] to the terminal RS[m] are electrically connected to output terminals of the signal supply circuit SS[1] to the signal supply circuit SS[m], respectively. As described above, the signal output to the terminal SL is a selection signal, and the signal output to the terminal RS is a reset signal. Thus, the terminal SL is a selection signal output terminal, and the terminal RS is a reset signal output terminal.

A start pulse signal is input to the terminal SP1 and the terminal SP2. Thus, the terminal SP1 and the terminal SP2 are start pulse signal input terminals. The start pulse signal is input to the terminal SP1 or the terminal SP2, whereby driving of the shift register circuit illustrated in FIG. 3 can be started.

A clock signal is input to the terminal CLK. Thus, the terminal CLK is a clock signal input terminal. For example, clock signals input to the terminal CLK(1) to the terminal CLK(4) can be signals with different phases, and the register circuit R and the register circuit RD can be driven in response to the clock signals.

Specifically, when the start pulse signal is input to the terminal SP1 or the terminal SP2, any of the register circuit R[1] to the register circuit R[m] outputs a signal to the terminal ROUT and the terminal OSS in response to the clock signal. The signal output to the terminal ROUT can be input to the register circuit R in the subsequent stage through the latch circuit LAT and the terminal LIN, and thus the register circuit R in the subsequent stage can output a signal. Thus, the signal output to the terminal ROUT from the register circuit R and the signal input to the register circuit R through the terminal LIN can each be referred to as a scan signal.

The signal output to the terminal OSS from the register circuit R as described above is input to the signal supply circuit SS. In response to this, the signal supply circuit SS outputs a selection signal from the terminal SL to the pixel 31, and outputs a reset signal from the terminal RS to the pixel 31.

When a signal is input to the terminal OFFS, the register circuit R[1] to the register circuit R[m] can stop the output of signals to the terminal ROUT[1] to the terminal ROUT

[m] and the output of signals to the terminal OSS[1] to the terminal OSS[m]. In addition, the register circuit RD can stop the output of a signal to the terminal ROUT_D. In other words, the input of a signal to the terminal OFFS can stop scanning by the shift register circuit. Thus, the signal input to the terminal OFFS can be referred to as a scan stop signal.

In addition, when a signal is input to the register circuit R through the terminal RIN, the register circuit R can stop the output of a signal to the terminal ROUT and the output of a signal to the terminal OSS. As described above, a signal output to the terminal ROUT from the register circuit R in the subsequent stage is input to the terminal RIN. Thus, for example, after the register circuit R outputs signals to the terminal ROUT and the terminal OSS, the same register circuit R can be prevented from outputting a signal again. Thus, a malfunction of the imaging unit 15 can be inhibited.

When a signal is input to the terminal SMP, data corresponding to the potential of the terminal SP1 is written to the latch circuit LAT[1], and data corresponding to the potentials of the terminal ROUT[1] to the terminal ROUT[m−1] are written to the latch circuit LAT[2] to the latch circuit LAT[m], respectively. Thus, the signal input to the terminal SMP can be referred to as a sampling signal. Note that the data held in the latch circuit LAT can be 1-bit digital data.

The latch circuit LAT[1] has a function of outputting either a signal input from the terminal SP1 or a signal input from the terminal SP2 to the terminal LIN[1] in response to data held in the latch circuit LAT[1]. For example, when data "0" is held in the latch circuit LAT[1], a signal input from the terminal SP1 can be output, and when data "1" is held in the latch circuit LAT[1], a signal input from the terminal SP2 can be output.

Note that the row driver circuit 33 does not necessarily include the latch circuit LAT[1]. In this case, the terminal LIN[1] can serve as the terminal SP1.

The latch circuit LAT[2] to the latch circuit LAT[m] have a function of outputting either a signal input from the terminal ROUT[1] to the terminal ROUT[m−1] or the signal input from the terminal SP2 to the terminal LIN[2] to the terminal LIN[m], respectively, in response to data held in the latch circuit LAT[2] to the latch circuit LAT[m]. For example, when data "0" is held in the latch circuit LAT[2], the signal input from the terminal ROUT[1] can be output and when data "1" is held in the latch circuit LAT[2], the signal input from the terminal SP2 can be output.

For example, the signals input to the terminals illustrated in FIG. 3 can be generated by the control circuit 32 illustrated in FIG. 2A.

Figure 4A:
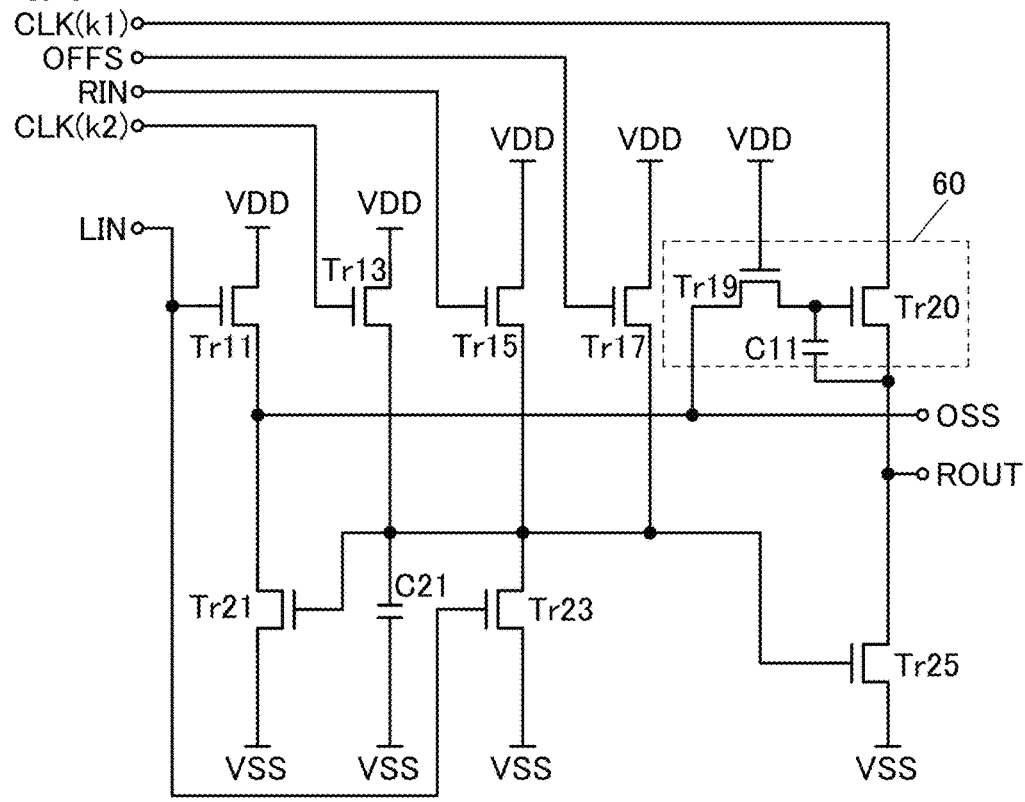
FIG. 4A and FIG. 4B are each a circuit diagram illustrating a structure example of a register circuit.

FIG. 4A is a circuit diagram illustrating a structure example of the register circuit R. The register circuit R includes a transistor Tr11, a transistor Tr13, a transistor Tr15, a transistor Tr17, a transistor Tr19, a transistor Tr20, a transistor Tr21, a transistor Tr23, a transistor Tr25, a capacitor C11, and a capacitor C21. Here, for example, the circuit 60 is configured with the transistor Tr19, the transistor Tr20, and the capacitor C11 in FIG. 4A.

In this specification and the like, a potential VDD refers to a high potential and a potential VSS refers to a low potential.

For example, a terminal CLK(k1) and a terminal CLK(k2) illustrated in FIG. 4A can be any of the above-described plurality of terminals CLK. For example, the shift register circuit included in the row driver circuit 33 includes the terminal CLK(1) to the terminal CLK(4). In this case, the terminal CLK(k1) can be any one of the terminal CLK(1) to the terminal CLK(4), and the terminal CLK(k2) can be any one of the terminal CLK(1) to the terminal CLK(4) excluding the terminal CLK which is the same as the terminal CLK(k1).

Specifically, for example, in the register circuit R[1], the terminal CLK(k1) can serve as the terminal CLK(1) and the terminal CLK(k2) can serve as the terminal CLK(2). In the register circuit R[2], the terminal CLK(k1) can serve as the terminal CLK(2) and the terminal CLK(k2) can serve as the terminal CLK(3). In the register circuit R[3], the terminal CLK(k1) can serve as the terminal CLK(3) and the terminal CLK(k2) can serve as the terminal CLK(4).

In the register circuit R having the structure illustrated in FIG. 4A, the terminal CLK(k1) is electrically connected to one of a source and a drain of the transistor Tr20. The terminal CLK(k2) is electrically connected to a gate of the transistor Tr13. The terminal LIN is electrically connected to a gate of the transistor Tr11 and a gate of the transistor Tr23. The terminal RIN is electrically connected to a gate of the transistor Tr15. The terminal OFFS is electrically connected to a gate of the transistor Tr17. The terminal ROUT is electrically connected to the other of the source and the drain of the transistor Tr20, one of the source and the drain of the transistor Tr25, and one electrode of the capacitor C11. The terminal OSS is electrically connected to one of a source and a drain of the transistor Tr11, one of a source and a drain of the transistor Tr19, and one of a source and a drain of the transistor Tr21.

One of a source and a drain of the transistor Tr13, one of a source and a drain of the transistor Tr15, one of a source and a drain of the transistor Tr17, a gate of the transistor Tr21, one of a source and a drain of the transistor Tr23, a gate of the transistor Tr25, and one electrode of the capacitor C21 are electrically connected to each other. In the case where the gate capacitance of the transistor Tr21, the gate capacitance of the transistor Tr25, or the like is sufficiently high, the register circuit R does not necessarily include the capacitor C21.

The other of the source and the drain of the transistor Tr19, a gate of the transistor Tr20, and the other electrode of the capacitor C11 are electrically connected to each other. By providing the transistor Tr19 in the circuit R, the circuit 60 can be a bootstrap circuit. Note that the register circuit R does not necessarily include the transistor Tr19. In that case, the capacitor C11 can also be omitted.

In description below, the transistor Tr11, the transistor Tr13, the transistor Tr15, the transistor Tr17, the transistor Tr19, the transistor Tr20, the transistor Tr21, the transistor Tr23, and the transistor Tr25 are n-channel transistors; however, the description below can also be referred to for the case where a p-channel transistor is included by reversing the high/low relationship between potentials as appropriate, for example.

A high potential can be supplied to the other of the source and the drain of the transistor Tr11, the other of the source and the drain of the transistor Tr13, the other of the source and the drain of the transistor Tr15, the other of the source and the drain of the transistor Tr17, and a gate of the transistor Tr19. In addition, a low potential can be supplied to the other of the source and the drain of the transistor Tr21, the other of the source and the drain of the transistor Tr23, the other of the source and the drain of the transistor Tr25, and the other electrode of the capacitor C21.

When a high potential signal is input to the terminal LIN, the transistor Tr11 and the transistor Tr23 are turned on. When the transistor Tr11 is turned on and the transistor Tr21 is in an off state, a high-potential signal is output from the terminal OSS and the potential of the gate of the transistor Tr20 becomes a high potential. Furthermore, when the potential of the gate of the transistor Tr20 becomes a high potential, the transistor Tr20 is turned on. Thus, a signal input to the terminal CLK(k1) can be output to the terminal ROUT.

When a high-potential signal is input to the terminal CLK(k2), the transistor Tr13 is turned on. Thus, the gate of the transistor Tr21 and the gate of the transistor Tr25 have high potentials. Furthermore, when the potential of the gate of the transistor Tr21 becomes a high potential, the transistor Tr21 is turned on. Thus, when the transistor Tr11 is in an off state, the potential of the terminal OSS becomes a low potential. Furthermore, when the potential of the gate of the transistor Tr25 becomes a high potential, the transistor Tr25 is turned on. The transistor Tr21 and the transistor Tr25 are turned on, so that the terminal ROUT has a low potential. Similarly, in the case where a high-potential signal is input to the terminal RIN or the terminal OFFS, the potential of the terminal OSS and the potential of the terminal ROUT become low potentials.

Here, the transistor Tr19 is preferably a transistor having an extremely low off-state current, such as an OS transistor. Thus, after the potential of the terminal LIN becomes a low potential and the transistor Tr11 is turned off, the potential of the gate of the transistor Tr20 can be held for a long time. Thus, until the potential of the terminal CLK(k2), the terminal RIN, or the terminal OFFS become a high potential, the signal input to the terminal CLK(k1) can be kept being output to the terminal ROUT.

In addition, the transistor Tr11, the transistor Tr13, the transistor Tr15, the transistor Tr17, the transistor Tr20, the transistor Tr21, the transistor Tr23, and the transistor Tr25 may also be OS transistors. When the transistors included in the register circuit R are all OS transistors, all the transistors included in the register circuit R can be manufactured in the same process.

Alternatively, Si transistors can be used for the transistor Tr11, the transistor Tr13, the transistor Tr15, the transistor Tr17, the transistor Tr19, the transistor Tr20, the transistor Tr21, the transistor Tr23, and the transistor Tr25. In particular, when transistors including crystalline silicon in their channel formation region are used as the transistors, on-state current can be increased. Thus, the register circuit R can be driven at high speed. Alternatively, transistors including amorphous silicon in their channel formation region may be used for the transistor Tr11, the transistor Tr13, the transistor Tr15, the transistor Tr17, the transistor Tr19, the transistor Tr20, the transistor Tr21, the transistor Tr23, and the transistor Tr25.

Figure 4B:
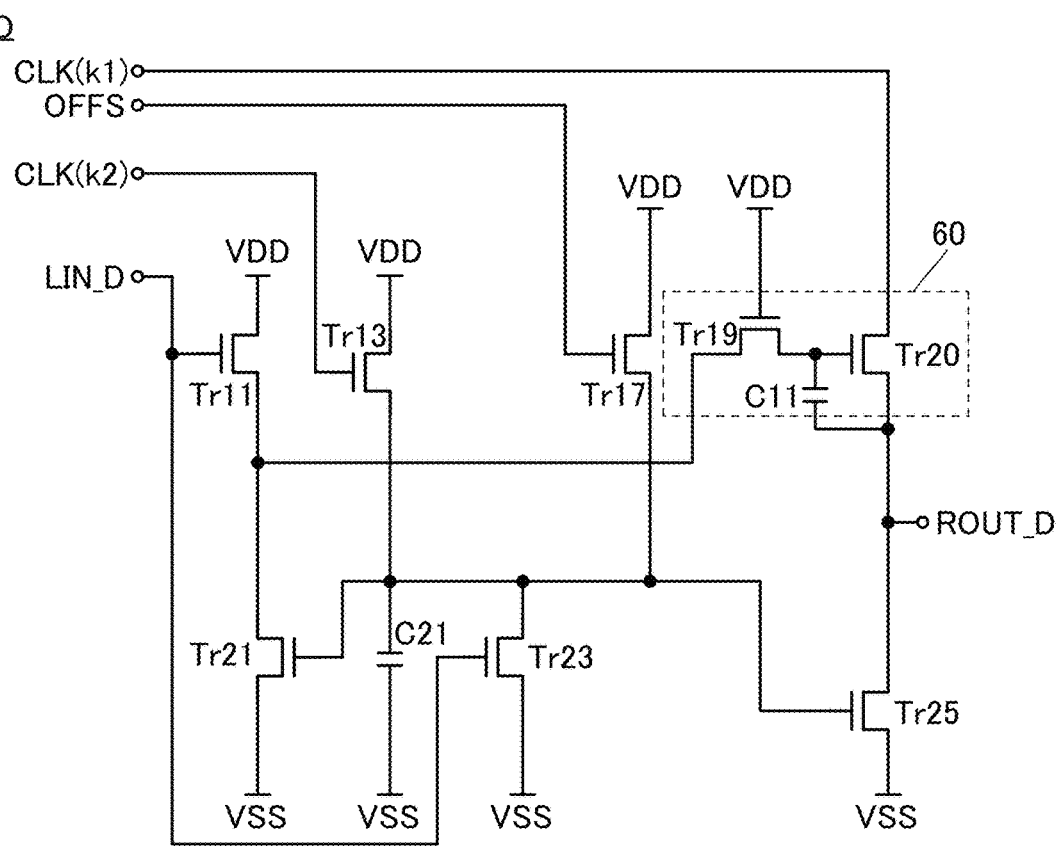

FIG. 4B is a circuit diagram illustrating a structure example of the register circuit RD. The register circuit RD is different from the register circuit R in that the transistor Tr15 is not provided. In addition, the register circuit RD is different from the register circuit R also in that a gate of the transistor Tr11 and a gate of the transistor Tr23 are electrically connected to the terminal LIN_D. Moreover, the register circuit RD is different from the register circuit R also in that the other of the source and the drain of the transistor Tr20, one of the source and the drain of the transistor Tr25, and one electrode of the capacitor C11 are electrically connected to the terminal ROUT_D. Moreover, the register circuit RD is different from the register circuit R also in that one of a source and a drain of the transistor Tr11, one of a source and a drain of the transistor Tr19, and one of a source and a drain of the transistor Tr21 are not electrically connected to the terminal OSS.

FIG. 5A1 is a circuit diagram illustrating a structure example of the latch circuit LAT. The latch circuit LAT in FIG. 5A1 includes a transistor Tr31, a transistor Tr33, a transistor Tr35, a transistor Tr36, a capacitor C31, and an inverter circuit INV1. In FIG. 5A1, a node that is connected to one of a source and a drain of the transistor Tr33, a gate of the transistor Tr35, and one electrode of the capacitor C31 is referred to as a node N.

In the latch circuit LAT in FIG. 5A1, when a high-potential signal is input to the terminal SMP, the transistor Tr33 is turned on. Thus, the potential of the node N becomes a potential corresponding to the potential of the terminal ROUT, and data corresponding to a signal input from the terminal ROUT to the latch circuit LAT is written to the latch circuit LAT. After data is written to the latch circuit LAT, the potential of the terminal SMP is set to a low potential, so that the transistor Tr33 is turned off. Thus, the potential of the node N is held and the data written to the latch circuit LAT is held. Specifically, when the potential of the node N is a low potential, data "0" is held in the latch circuit LAT and when the potential of the node N is a high potential, data "1" is held in the latch circuit LAT, for example.

Here, the transistor Tr33 is preferably a transistor having an extremely low off-state current, such as an OS transistor. Thus, the latch circuit LAT can hold data for a long period. Thus, the frequency of writing data in the latch circuit LAT can be lowered.

FIG. 5A2 is a circuit diagram illustrating a structure example of the inverter circuit INV1 in FIG. 5A1. The inverter circuit INV1 includes a transistor Tr41, a transistor Tr43, a transistor Tr45, a transistor Tr47, and a capacitor C41.

The latch circuit LAT has the structure in FIG. 5A1 and the inverter circuit INV1 has the structure in FIG. 5A2, in which case all the transistors included in the latch circuit LAT can be transistors having the same polarity, for example, n-channel transistors. Thus, the transistor Tr31, the transistor Tr35, the transistor Tr36, the transistor Tr41, the transistor Tr43, the transistor Tr45, and the transistor Tr47 as well as the transistor Tr33 can be OS transistors for example. Accordingly, all the transistors included in the latch circuit LAT can be manufactured in the same process.

FIG. 5B1 is a circuit diagram illustrating a structure example of the latch circuit LAT, which is different from that in FIG. 5A1. The latch circuit LAT illustrated in FIG. 5B1 includes a transistor Tr51, a transistor Tr52, a transistor Tr53, a transistor Tr54, a transistor Tr55, a transistor Tr56, a transistor Tr57, a transistor Tr58, a transistor Tr59, a transistor Tr60, a transistor Tr61, a transistor Tr62, an inverter circuit INV 2_1, an inverter circuit INV 2_2, and an inverter circuit INV 2_3.

FIG. 5B2 is a circuit diagram illustrating a structure example of the inverter circuit INV2. The inverter circuit INV2 includes a transistor Tr71 and a transistor Tr72. A gate of the transistor Tr71 and a gate of the transistor Tr72 can be input terminals of the inverter circuit INV2. One of a source and a drain of the transistor Tr71 and one of a source and a drain of the transistor Tr72 can be output terminals of the inverter circuit INV2.

The transistor Tr53, the transistor Tr54, the transistor Tr57, the transistor Tr58, the transistor Tr59, the transistor Tr61, and the transistor Tr72 can be n-channel transistors. The transistor Tr51, the transistor Tr52, the transistor Tr55, the transistor Tr56, the transistor Tr60, the transistor Tr62, and the transistor Tr71 can be p-channel transistors.

The transistor Tr53, the transistor Tr54, the transistor Tr57, the transistor Tr58, the transistor Tr59, the transistor Tr61, and the transistor Tr72 can be OS transistors or Si transistors, for example. The transistor Tr51, the transistor Tr52, the transistor Tr55, the transistor Tr56, the transistor Tr60, the transistor Tr62, and the transistor Tr71 can be Si transistors, for example.

As described above, by inputting a high-potential signal to the terminal SMP, data corresponding to a signal input to the latch circuit LAT from the terminal ROUT is written to the latch circuit LAT. For example, when the potential of the terminal ROUT is a low potential, data "0" can be written to the latch circuit LAT, and when the potential of the terminal ROUT is a high potential, data "1" can be written to the latch circuit LAT. After data is written to the latch circuit LAT, the potential of the terminal SMP is set to a low potential, whereby data written to the latch circuit LAT is held.

When the potential of the terminal SP2 is a low potential, the latch circuit LAT can output a signal input from the terminal ROUT to the terminal LIN. In the latch circuit LAT, when the potential of the terminal SP2 is a high potential and data "0" is held in the latch circuit LAT, it is possible that a signal is not output from the terminal LIN or the potential of the terminal LIN is a low potential. In addition, when the potential of the terminal SP2 is a high potential and data "1" is held in the latch circuit LAT, the latch circuit LAT can output a signal input from the terminal SP2 to the terminal LIN.

In this specification and the like, data that allows the signal input from the terminal SP2 to be output to the terminal LIN is written to the latch circuit LAT, which is referred to simply as "writing data to the latch circuit LAT" in some cases. That is, for example, data "1" is written to the latch circuit LAT, which is referred to simply as "writing data to the latch circuit LAT" in some cases.

An example of a driving method of the row driver circuit 33 is described below. Specifically, an example of a driving method of the shift register circuit included in the row driver circuit 33 in the readout period T5 which is illustrated in FIG. 2B2 is described. The semiconductor device of one embodiment of the present invention can perform an authentication such as fingerprint authentication by the driving method described below, for example.

Figure 6A:
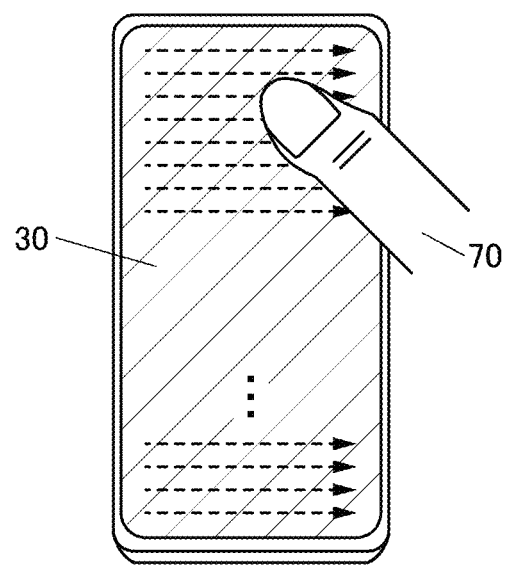
FIG. 6A and FIG. 6B are schematic views showing examples of a driving method of a row driver circuit.
Figure 6B:
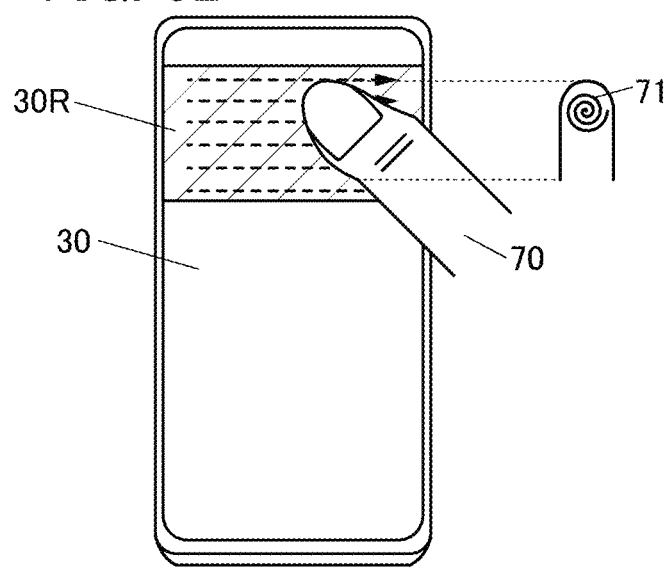

FIG. 6A and FIG. 6B are schematic views each illustrating an example of a driving method of the row driver circuit 33 in the readout period. In FIG. 6A and FIG. 6B, a region including the pixels 31 from which captured-image data is read out is hatched in the pixel portion 30. The same applies to other drawings in some cases.

In this specification and the like, the driving method illustrated in FIG. 6A is referred to as a first mode or a first driving mode in some cases. The driving method illustrated in FIG. 6B is referred to as a second mode or a second driving mode in some cases.

For example, in the case where fingerprint authentication is performed, the row driver circuit 33 scans entirely the pixel portion 30 as illustrated in FIG. 6A. Thus, for example, captured-image data is read out from all the pixels 31. The readout captured-image data is supplied to the detection circuit 37 illustrated in FIG. 2A, for example. The detection circuit 37 detects the position in the pixel portion 30 of the finger 70 touching the pixel portion 30, on the basis of the captured-image data. In the case of the operation illustrated in FIG. 6A, data "0" can be held in the latch circuit LAT[1] to the latch circuit LAT[m] illustrated in FIG. 3, for example.

Next, the control circuit 32 illustrated in FIG. 2A, for example, determines a row of the pixels 31 from which the captured-image data is read out for detecting a fingerprint on the basis of the detected position of the finger 70. After determining, the control circuit 32, for example, generates data indicating a row in which the row driver circuit 33 starts scanning when the captured-image data is read out for detection of a fingerprint. The data is written to, for example, the latch circuit LAT illustrated in FIG. 3. Specifically, data "1" is written to the latch circuit LAT corresponding to the row in which the row driver circuit 33 starts scanning.

Then, as illustrated in FIG. 6B, the row driver circuit 33 scans part of the pixel portion based on the determination results. Thus, captured-image data can be read out only from the pixels 31 in the row which the finger 70 touches, for example. Alternatively, captured-image data can be read out only from the pixels 31 in the row which the finger 70 touches and the pixels 31 in rows peripheral to the row. In FIG. 6B, a region of the pixel portion 30 that includes the pixels 31 from which captured-image data is read out is referred to as a pixel portion 30R.

The captured-image data read out by the method illustrated in FIG. 6B is supplied to, for example, the detection circuit 37 illustrated in FIG. 2A. The detection circuit 37 detects a fingerprint 71 of the finger 70 on the basis of on the captured-image data. Thus, the semiconductor device of one embodiment of the present invention can perform fingerprint authentication.

Here, in the period in FIG. 6A, it is sufficient that the position of the finger 70 is detected, and thus the fingerprint authentication is not necessarily performed. Therefore, the readout period for the pixels 31 in one row can be shortened as compared with that in the case where fingerprint authentication is performed. In contrast, since in the period in FIG. 6B, the fingerprint authentication needs to be performed, the readout period for the pixels 31 in one row is longer than that in the case in FIG. 6A. In the semiconductor device of one embodiment of the present invention, as illustrated in FIG. 6B, the pixels 31 from which captured-image data is read out for fingerprint authentication can be only some of the pixels 31 provided in the pixel portion 30. Thus, the fingerprint authentication can be performed in a short time as compared with captured-image data is read out from all the pixels 31 for fingerprint authentication. Even when it takes a long time to read out captured-image data for fingerprint authentication, the total readout time can be prevented from being greatly long. Therefore, the semiconductor device of one embodiment of the present invention can perform fingerprint authentication with high accuracy in a short time.

Note that in this specification and the like, captured-image data read out by the method illustrated in FIG. 6A is referred to as first captured-image data and captured-image data read out by the method illustrated in FIG. 6B is referred to as second captured-image data in some cases. However, the imaging unit 15 can acquire captured-image data by the method in Period T1 to Period T4 illustrated in FIG. 2B2, read out the captured-image data by the method illustrated in FIG. 6A as the first captured-image data, and then, read out the second captured-image data by the method illustrated in FIG. 6B, without acquiring the captured-image data again. Therefore, the first captured-image data and the second captured-image data can be captured-image data acquired in the same period.

Figure 7:
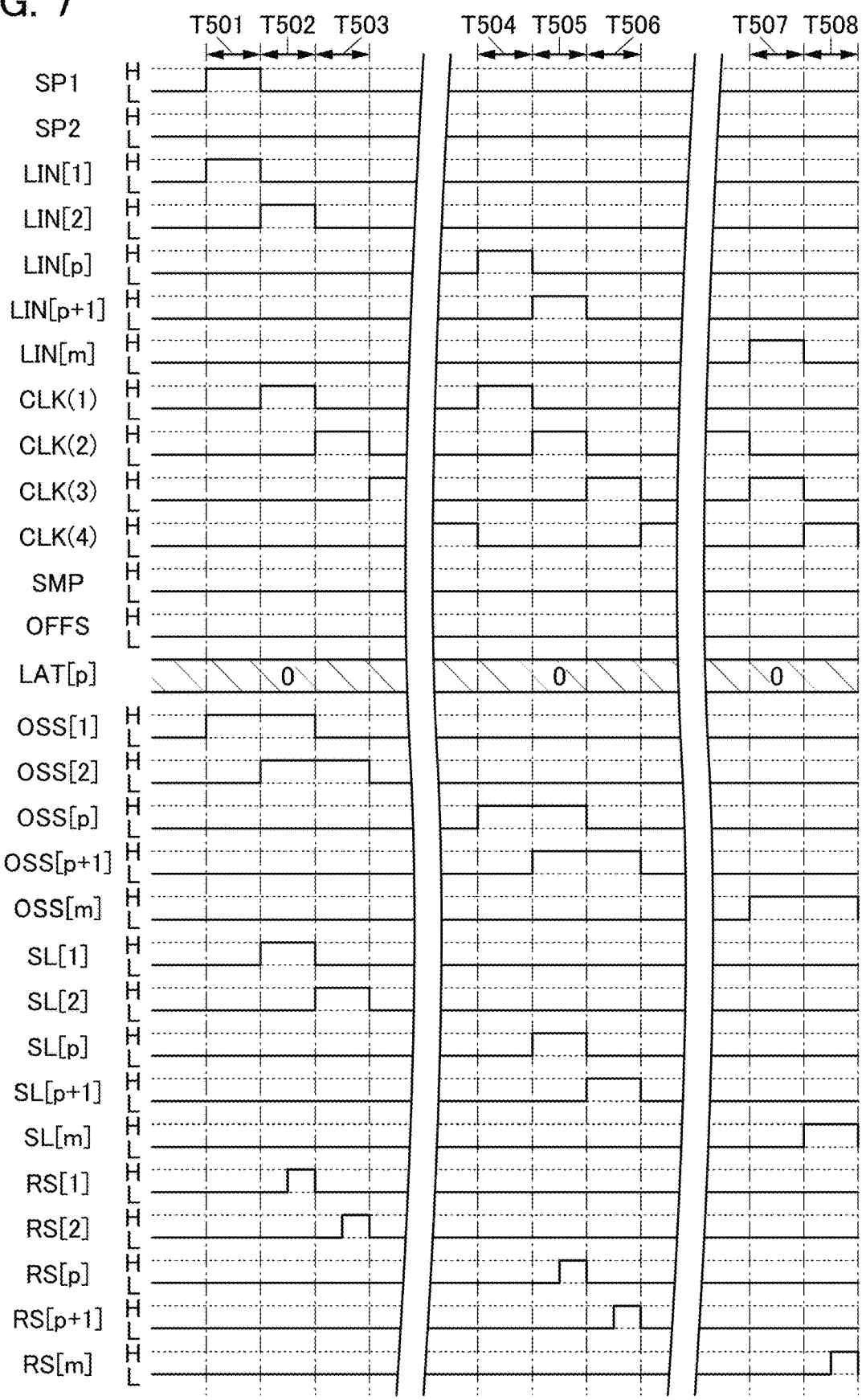
FIG. 7 is a timing chart illustrating an example of a driving method of a row driver circuit.

Examples of details of the driving methods in FIG. 6A, FIG. 6B and the like will be described with reference to FIG. 7 to FIG. 9. FIG. 7 is a timing chart illustrating an example of the details of the driving method of FIG. 6A, and illustrates an example of a driving method of the row driver circuit 33, with divided periods, Period T501 to Period T508.

Prior to Period T501, the potential of the terminal SMP and the potential of the terminal OFFS are low potentials, and data "0" is held in the latch circuit LAT[1] to the latch circuit LAT[m]. For example, FIG. 7 illustrates data held in a latch circuit LAT[p] (p is an integer greater than or equal to 4 and less than or equal to m−2) as an example.

First, in Period T501, a high-potential signal is input as a start pulse signal to the terminal SP1. The value of data held in the latch circuit LAT[1] is "0"; thus, a signal input to the terminal SP1 is output to the terminal LIN[1]. Thus, the potential of the terminal LIN[1] becomes a high potential. The potential of the terminal LIN[1] becomes a high potential, whereby a high-potential signal is output from the terminal OSS[1]. Note that in Period T501, the potentials of the terminal CLK(1) to the terminal CLK(4) are low potentials.

In Period T502, the potential of the terminal CLK(1) becomes a high potential. Note that the potentials of the terminal CLK(2) to the terminal CLK(4) remain low potentials subsequently to Period T501. The potential of the terminal LIN[1] becomes a high potential in Period T501, and the potential of the terminal CLK(1) becomes a high potential in Period T502, so that the potential of the terminal ROUT[1] becomes a high potential although not illustrated in FIG. 7. The value of data held in the latch circuit LAT[2] is "0"; thus, a signal input to the terminal ROUT[1] is output to the terminal LIN[2]. Thus, the potential of the terminal LIN[2] becomes a high potential. The potential of the terminal LIN[2] becomes a high potential, so that a high-potential signal is output from the terminal OSS[2].

In addition, the potential of the terminal OSS[1] in Period T502 is a high potential. Accordingly, a selection signal is output to the terminal SL[1] and a reset signal is output to the terminal RS[1].

In Period T503, the potential of the terminal CLK(1) becomes a low potential and the potential of the terminal CLK(2) becomes a high potential. Note that the potentials of the terminal CLK(3) and the terminal CLK(4) remain low potentials subsequently to Period T502. In Period T502, the potential of the terminal LIN[2] becomes a high potential, and in Period T503, the potential of the terminal CLK(2) becomes a high potential, so that the potential of the terminal ROUT[2] becomes a high potential. The value of data held in the latch circuit LAT[3] is "0"; thus, a signal input to the terminal ROUT[2] is output to the terminal LIN[3]. Thus, the potential of the terminal LIN[3] becomes a high potential. The potential of the terminal LIN[3] becomes a high potential, whereby a high-potential signal is output from the terminal OSS[3]. Note that the potentials of the terminal ROUT[2], the terminal LIN[3], and the terminal OSS[3] are not illustrated in FIG. 7.

In addition, the potential of the terminal OSS[2] in Period T503 is a high potential. In this manner, a selection signal is output from the terminal SL[2] and a reset signal is output from the terminal RS[2]. The potential of the terminal CLK(2) becomes a high potential, whereby the potential of the terminal OSS[1] becomes a low potential.

In Period T504, the potential of the terminal LIN[p] becomes a high potential. As an example, the potential of the terminal CLK(1) becomes a high potential and the potentials of the terminal CLK(2) to the terminal CLK(4) become low potentials, whereas the potentials of the terminal CLK(1) to the terminal CLK(4) can be determined in accordance with the value of p.

The potential of the terminal LIN[p] becomes a high potential, so that a high-potential signal is output from the terminal OSS[p]. Although not illustrated in FIG. 7, a selection signal is output from a terminal SL[p−1] and a reset signal is output from a terminal RS[p−1] in Period T504.

In Period T505, the potential of the terminal CLK(1) becomes a low potential and the potential of the terminal CLK(2) becomes a high potential. Note that the potentials of the terminal CLK(3) and the terminal CLK(4) remain low potentials subsequently to Period T504. The potential of the terminal LIN[p] becomes a high potential in Period T504 and the potential of the terminal CLK(2) becomes a high potential in Period T505, whereby the potential of the terminal ROUT[p] becomes a high potential, although not illustrated in FIG. 7. The value of data held in the latch circuit LAT[p+1] is "0"; thus, a signal input to the terminal ROUT[p] is output to the terminal LIN[p+1]. Thus, the potential of the terminal LIN[p+1] becomes a high potential. The potential of the terminal LIN[p+1] becomes a high potential, so that a high-potential signal is output from the terminal OSS[p+1].

In addition, the potential of the terminal OSS[p] in Period T505 is a high potential. Accordingly, a selection signal is output to the terminal SL[p] and a reset signal is output to the terminal RS[p].

In Period T506, the potential of the terminal CLK(2) becomes a low potential, and the potential of the terminal CLK(3) becomes a high potential. Note that the potentials of the terminal CLK(1) and the terminal CLK(4) remain low potentials subsequently to Period T505. In Period T505, the potential of the terminal LIN[p+1] becomes a high potential, and in Period T506, the potential of the terminal CLK(3) becomes a high potential, so that the potential of the terminal ROUT[p+1] becomes a high potential. Data that is held in a latch circuit LAT[p+2] is "0"; thus, a signal input to the terminal ROUT[p+1] is output to a terminal LIN[p+2]. Thus, the potential of the terminal LIN[p+2] becomes a high potential. The potential of the terminal LIN[p+2] becomes a high potential, so that a high-potential signal is output from a terminal OSS[p+2]. Note that in FIG. 7, the potentials of the terminal ROUT [p+1], the terminal LIN[p+2], and the terminal OSS[p+2] are not illustrated.

In addition, the potential of the terminal OSS[p+1] in Period T506 is a high potential. In this manner, a selection signal is output from a terminal SL[p+1], and a reset signal is output from a terminal RS[p+1]. The potential of the terminal CLK(3) becomes a high potential, whereby the potential of the terminal OSS[p] becomes a low potential.

In Period T507, the potential of the terminal LIN[m] becomes a high potential. The potential of the terminal CLK(3) becomes a high potential, and the potentials of the terminal CLK(1), the terminal CLK(2), and the terminal CLK(4) become low potentials. The potential of the terminal LIN[m] becomes a high potential, whereby a high-potential signal is output from the terminal OSS[m]. Although not illustrated in FIG. 7, a selection signal is output from the terminal SL[m−1] and a reset signal is output from the terminal RS[m−1] in Period T507.

In Period T508, the potential of the terminal CLK(3) becomes a low potential, and the potential of the terminal CLK(4) becomes a high potential, and the potentials of the terminal CLK(1) and the terminal CLK(2) remain low potentials subsequently to Period T507. In Period T507, the potential of the terminal LIN[m] becomes a high potential, and in Period T508, the potential of the terminal CLK(4) becomes a high potential, whereby the potential of the terminal ROUT[m] becomes a high potential, although not illustrated in FIG. 7.

Furthermore, the potential of the terminal OSS[m] in Period T508 is a high potential. Accordingly, a selection signal is output to the terminal SL[m] and a reset signal is output to the terminal RS[m].

As described above, in the driving method illustrated in FIG. 7, a start pulse signal is input to the terminal SP1 in Period T501, and the start pulse signal is supplied to the register circuit R[1] through the latch circuit LAT[1]. After that, scan signals are sequentially supplied to the register circuit R[2] to the register circuit R[m] and the register circuit RD. In response to the scan signals, selection signals are output to the terminal SL[1] to the terminal SL[m] sequentially, and reset signals are output to the terminal RS[1] to the terminal RS[m] sequentially. Thus, captured-image data can be sequentially read out from the pixels 31 in the first to m-th rows. In the driving method illustrated in FIG. 7, the start pulse signal is not input to the terminal SP2.

Figure 8:
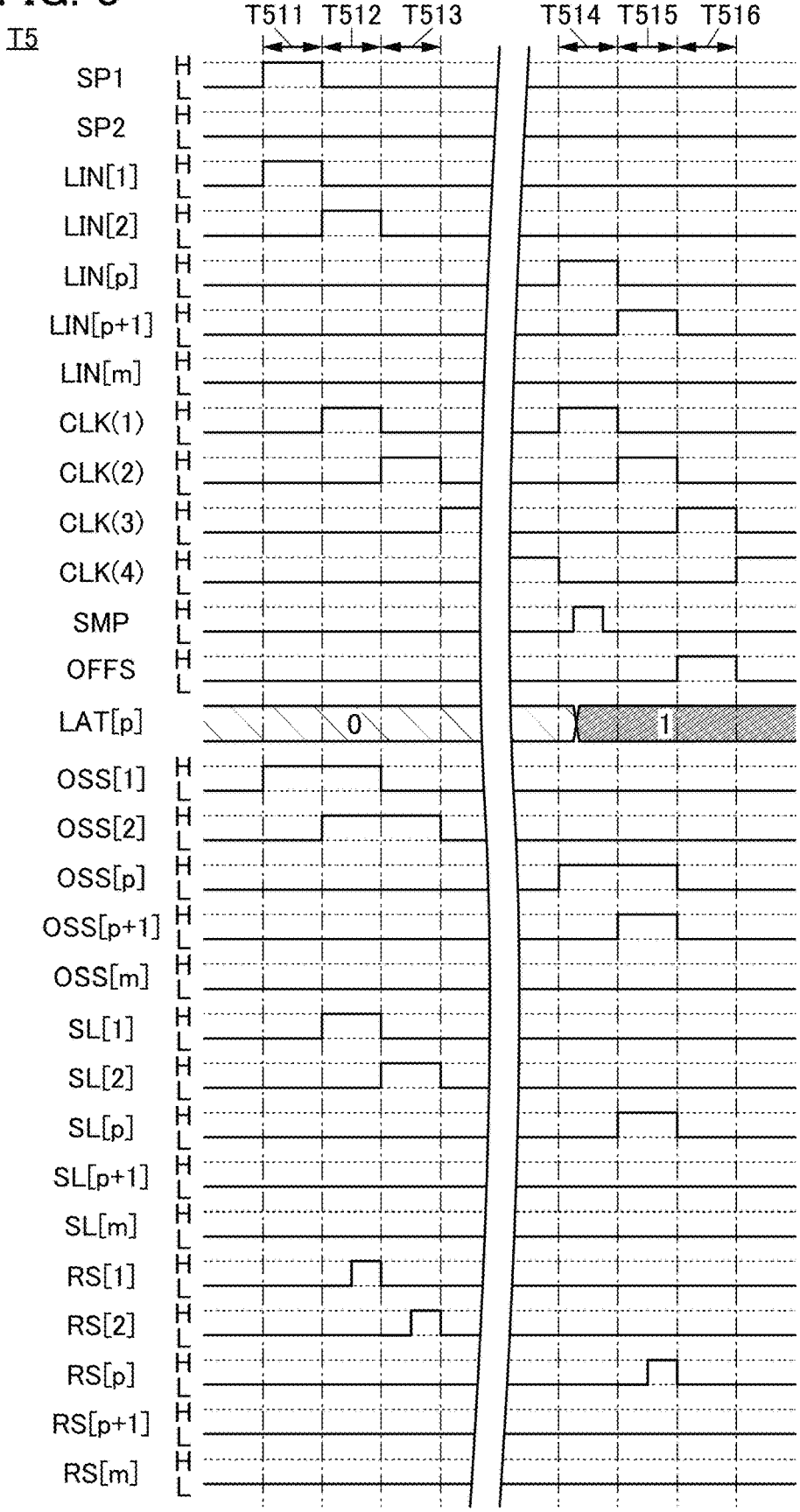
FIG. 8 is a timing chart illustrating an example of a driving method of a row driver circuit.

FIG. 8 is a timing chart illustrating an example of a method for writing data "1" into the latch circuit LAT[p], and illustrates an example of the driving method of the row driver circuit 33, with divided periods, Period T511 to Period T516.

In Period T511 to Period T516, no signals are preferably output from the terminal SL and the terminal RS. For example, in Period T511 to Period T516, a high-potential signal is not output from the terminal SL or the terminal RS in FIG. 8.

The operations in Period T511 to Period T513 can be similar to the operations in Period T501 to Period T503 in FIG. 7 except for the potential of the terminal SL and the potential of the terminal RS.

At the start point of Period T514, data "0" is held in the latch circuit LAT[p]. Moreover, in Period T514, a high potential is input to a terminal ROUT[p−1], and thus the latch circuit LAT[p] outputs a high-potential signal from the terminal LIN[p].

In Period T514, a high-potential signal is input to the terminal SMP. Since the high-potential signal input to the terminal ROUT[p−1], data "1" is written to the latch circuit LAT[p]. Since the potentials of the terminal SP1, the terminal ROUT[1] to a terminal ROUT[p−2], and the terminal ROUT[p] to the terminal ROUT[m−1] are low potentials, data "0" is written to the latch circuit LAT[1] to the latch circuit LAT[p−1] and the latch circuit LAT[p+1] to the latch circuit LAT[m].

After the value is written to the latch circuit LAT, the potential of the terminal SMP is set to a low potential. Accordingly, the data written to the latch circuit LAT is held.

The operation in Period T515 can be similar to the operation in Period T505 in FIG. 7 except for the potential of the terminal SL and the potential of the terminal RS.

In Period T516, a high-potential signal is input to the terminal OFFS as a scan-stop signal. Thus, output of signals to the terminal ROUT and the terminal OSS by the register circuit R is stopped. Thus, scan by the shift register circuit included in the row driver circuit 33 is stopped.

Note that the scan-stop signal is not necessarily input to the terminal OFFS. In that case, scan signals are supplied up to the register circuit R[m] and the register circuit RD.

Thus, data "1" is written to the latch circuit LAT[p].

Figure 9:
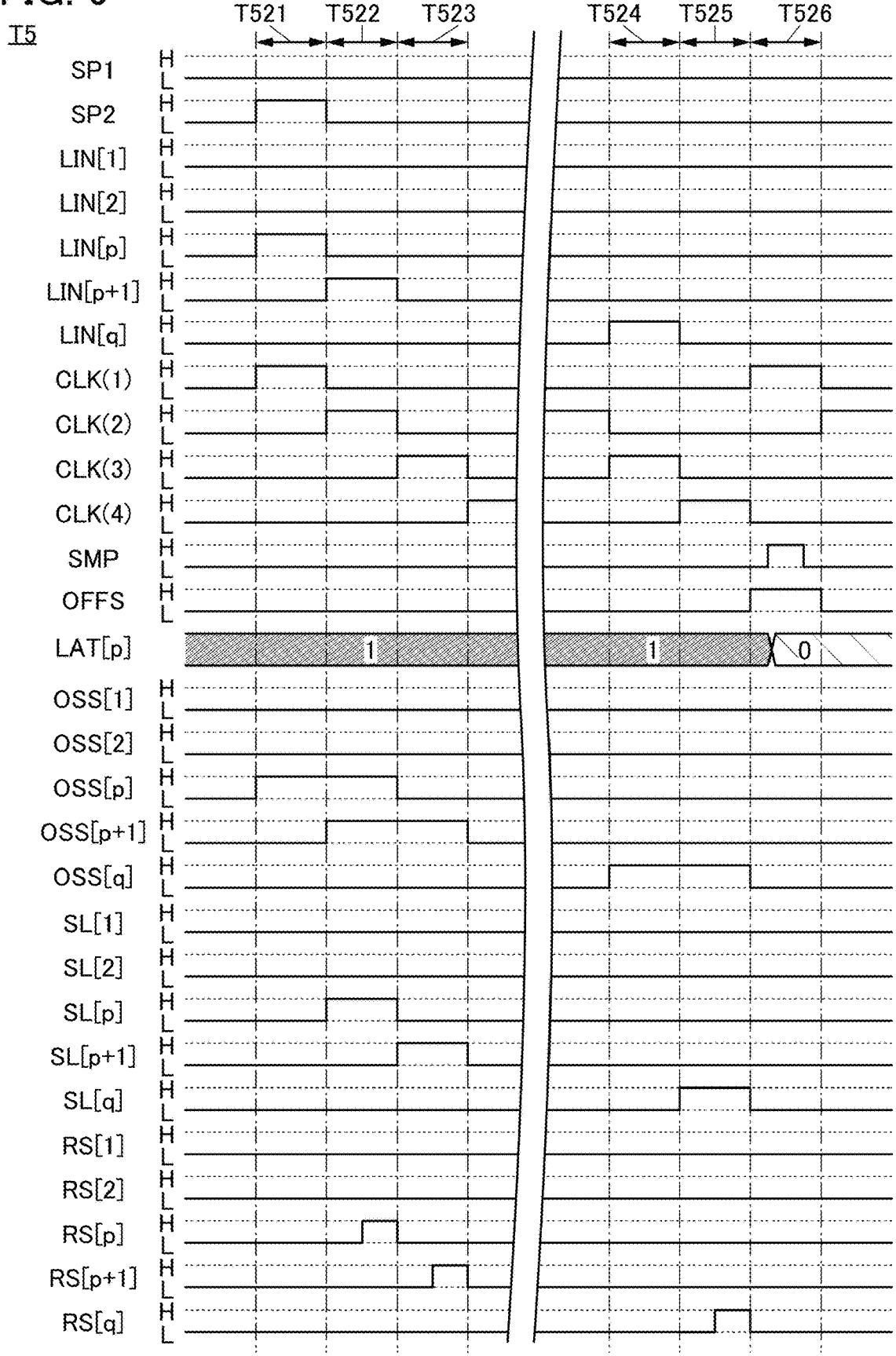
FIG. 9 is a timing chart illustrating an example of a driving method of a row driver circuit.

FIG. 9 is a timing chart illustrating an example of the detail of the driving method illustrated in FIG. 6B, and illustrates an example of a method for driving the row driver circuit 33 with divided periods, Period T521 to Period T526. In the driving method illustrated in FIG. 9, the pixels 31 in the p-th row to the pixels 31 in the q-th row (q is an integer greater than or equal to p+1 and less than or equal to m) are scanned sequentially, whereby captured-image data is read out from the pixels 31 in the p-th to q-th rows.

Prior to Period T521, the potential of the terminal SMP and the potential of the terminal OFFS are low potentials. Data "1" is held in the latch circuit LAT[p], and data "0" is held in the latch circuit LAT[1] to the latch circuit LAT[p−1] and the latch circuit LAT[p+1] to the latch circuit LAT[m].

In Period T521, a high-potential signal is input as a start pulse signal to the terminal SP2. As described above, the value of data held in the latch circuit LAT[p] is "1", and the value of data held in the other latch circuits LAT is "0". Thus, a signal input to the terminal SP2 is output to the terminal LIN[p] through the latch circuit LAT[p]. Thus, the potential of the terminal LIN[p] becomes a high potential. The potential of the terminal LIN[p] becomes a high potential, so that a high-potential signal is output from the terminal OSS[p]. Note that in Period T521, the potential of the terminal CLK(1) of the terminals CLK becomes a high potential, and the potentials of the terminal CLK(2) to the terminal CLK(4) of the terminals CLK are low potentials; however, as described above, the potentials of the terminal CLK(1) to the terminal CLK(4) can be determined in accordance with the value of p.

In Period T522, the potential of the terminal CLK(1) becomes a low potential and the potential of the terminal CLK(2) becomes a high potential, for example. Note that the potentials of the terminal CLK(3) and the terminal CLK(4) remain low-potentials subsequently to Period T521. In Period T521, the potential of the terminal LIN[p] becomes a high potential, and in Period T522, the potential of the terminal CLK(2) becomes a high potential, whereby the potential of the terminal ROUT[p] becomes a high potential, although not illustrated in FIG. 9. The value of data held in the latch circuit LAT[p+1] is "0"; thus, the signal input to the terminal ROUT[p] is output to the terminal LIN[p+1]. Thus, the potential of the terminal LIN[p+1] becomes a high potential. The potential of the terminal LIN[p+1] becomes a high potential, so that a high-potential signal is output from the terminal OSS[p+1].

In addition, the potential of the terminal OSS[p] in Period T522 is a high potential. Accordingly, a selection signal is output to the terminal SL[p] and a reset signal is output to the terminal RS[p].

In Period T523, the potential of the terminal CLK(2) becomes a low potential, and the potential of the terminal CLK(3) becomes a high potential. Note that the potentials of the terminal CLK(1) and the terminal CLK(4) remain low-potentials subsequently to Period T522. In Period T522, the potential of the terminal LIN[p+1] becomes a high potential, and in Period T523, the potential of the terminal CLK(3) becomes a high potential, so that the potential of the terminal ROUT[p+1] becomes a high potential. The value of data that is held in the latch circuit LAT[p+2] is "0"; thus, a signal input to the terminal ROUT[p+1] is output to the terminal LIN[p+2]. Thus, the potential of the terminal LIN[p+2] becomes a high potential. The potential of the terminal LIN[p+2] becomes a high potential, so that a high-potential signal is output from the terminal OSS[p+2]. Note that in FIG. 9, the potentials of the terminal ROUT[p+1], the terminal LIN[p+2], and the terminal OSS[p+2] are not illustrated.

In addition, the potential of the terminal OSS[p+1] in Period T523 is a high potential. In this manner, a selection signal is output from the terminal SL[p+1], and a reset signal is output from the terminal RS[p+1]. The potential of the terminal CLK(3) becomes a high potential, whereby the potential of the terminal OSS[p] becomes a low potential.

In Period T524, the potential of the terminal LIN[q] becomes a high potential. As an example, the potential of the terminal CLK(3) becomes a high potential, and the potentials of the terminal CLK(1), the terminal CLK(2), and the terminal CLK(4) become low potentials, whereas the potentials of the terminal CLK(1) to the terminal CLK(4) can be determined in accordance with the value of q.

When the potential of the terminal LIN[q] becomes a high potential, a high-potential signal is output from a terminal OSS[q]. Although not illustrated in FIG. 9, a selection signal is output from a terminal SL[q−1] and a reset signal is output from a terminal RS[q−1] in Period T524.

In Period T525, since the potential of the terminal OSS[q] is a high potential, a selection signal is output to a terminal SL[q] and a reset signal is output to a terminal RS[q].

In Period T526, a high-potential signal is input to the terminal OFFS as a scan stop signal. Thus, output of signals to the terminal ROUT and the terminal OSS from the register circuit R is stopped. Thus, scan by the shift register circuit included in the row driver circuit 33 is stopped.

After that, a high-potential signal is input to the terminal SMP. Since the high-potential signal is input to the terminal OFFS, the potentials of the terminal ROUT[1] to the terminal ROUT[m] are low potentials. Thus, data "0" is written to the latch circuit LAT[1] to the latch circuit LAT[m].

After the value is written to the latch circuit LAT, the potential of the terminal SMP is set to a low potential. Accordingly, the data written to the latch circuit LAT is held. As described above, data held in the latch circuit LAT can be reset by the operation in Period T526.

As described above, in the driving method illustrated in FIG. 9, a start pulse signal is input to the terminal SP2 in Period T521 and the start pulse signal is supplied to the register circuit R[p] through the latch circuit LAT[p]. After that, scan signals are sequentially supplied to the register circuit R[p+1] to the register circuit R[q]. In response to the scan signals, selection signals are sequentially output to the terminal SL[p] to the terminal SL[q], and reset signals are sequentially output to the terminal RS[p] to the terminal RS[q]. Thus, captured-image data can be sequentially read out from the pixels 31 in the p-th to q-th rows. In the driving method illustrated in FIG. 9, the start pulse signal is not input to the terminal SP1. The latch circuit LAT[1] to the latch circuit LAT[p−1] do not output signals to the terminal LIN[1] to the terminal LIN[p−1].

When the row driver circuit 33 performs the operation illustrated in FIG. 7 to FIG. 9 in the readout period, the semiconductor device of one embodiment of the present invention can perform authentication such as finger authentication. Note that in this specification and the like, the driving method illustrated in FIG. 7 may be referred to as a first mode or a first driving mode. The driving method in FIG. 9 may be referred to as a second mode or a second driving mode. Moreover, the driving method illustrated in FIG. 8 may be referred to as a second mode or a second driving mode, while the driving method in FIG. 9 may be referred to as a third mode or a third driving mode.

As described above, in the period illustrated in FIG. 6A, the readout period for the pixels 31 in one row can be shortened as compared with the period shown in FIG. 6B. Thus, Period T505 in FIG. 7 can be shorter than Period T522 in FIG. 9. Thus, the transmission rate of a scan signal in the case where the row driver circuit 33 is driven by the method illustrated in FIG. 7 can be higher than the transmission rate of a scan signal in the case where the row driver circuit 33 is driven by the method illustrated in FIG. 9. Here, the transmission rate of a scan signal can be represented by the number of the register circuits R to which scan signals are transmitted per unit time, for example.

In the operation illustrated in FIG. 9, any of the register circuit R[2] to the register circuit R[m] can be driven without an input of a scan signal from the register circuit R in the previous stage. Thus, any of the register circuit R[2] to the register circuit R[m] can be operated regardless of the operation of the register circuit R in the previous stage.

Figure 10:
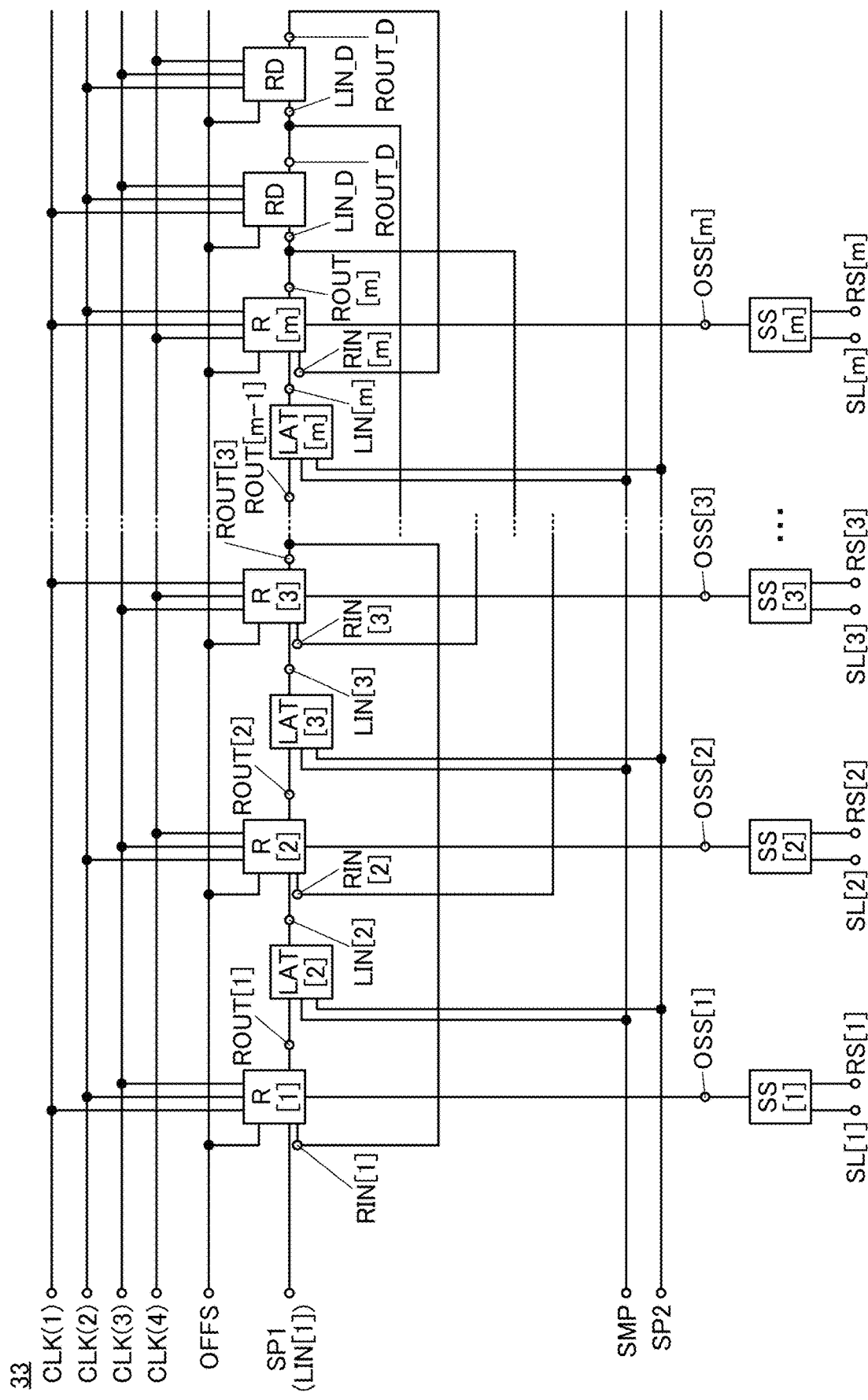
FIG. 10 is a block diagram illustrating a structure example of a row driver circuit.

FIG. 10 illustrates a structure example of the row driver circuit 33, and illustrates a variation example of the row driver circuit 33 illustrated in FIG. 3. The row driver circuit 33 illustrated in FIG. 10 is different from the row driver circuit 33 illustrated in FIG. 3 in that three terminals CLK are electrically connected to one register circuit R. The row driver circuit 33 illustrated in FIG. 10 is different from the row driver circuit 33 illustrated in FIG. 3 in that a signal output to the terminal ROUT from the register circuit R in the stage after the subsequent stage is input to the terminal RIN. The row driver circuit 33 illustrated in FIG. 10 is different from the row driver circuit 33 illustrated in FIG. 3 in including two register circuits RD. Moreover, the row driver circuit 33 illustrated in FIG. 10 is different from the row driver circuit 33 illustrated in FIG. 3 in that the latch circuit LAT[1] is not included. In the row driver circuit 33 illustrated in FIG. 10, the terminal LIN[1] can serve as the terminal SP1. Note that a signal output to the terminal ROUT from the register circuit R in the third and subsequent stages may be input to the terminal RIN. The same applies to the row driver circuit 33 having another structure. In addition, the row driver circuit 33 illustrated in FIG. 10 may include a latch circuit LAT[1].

Figure 11A:
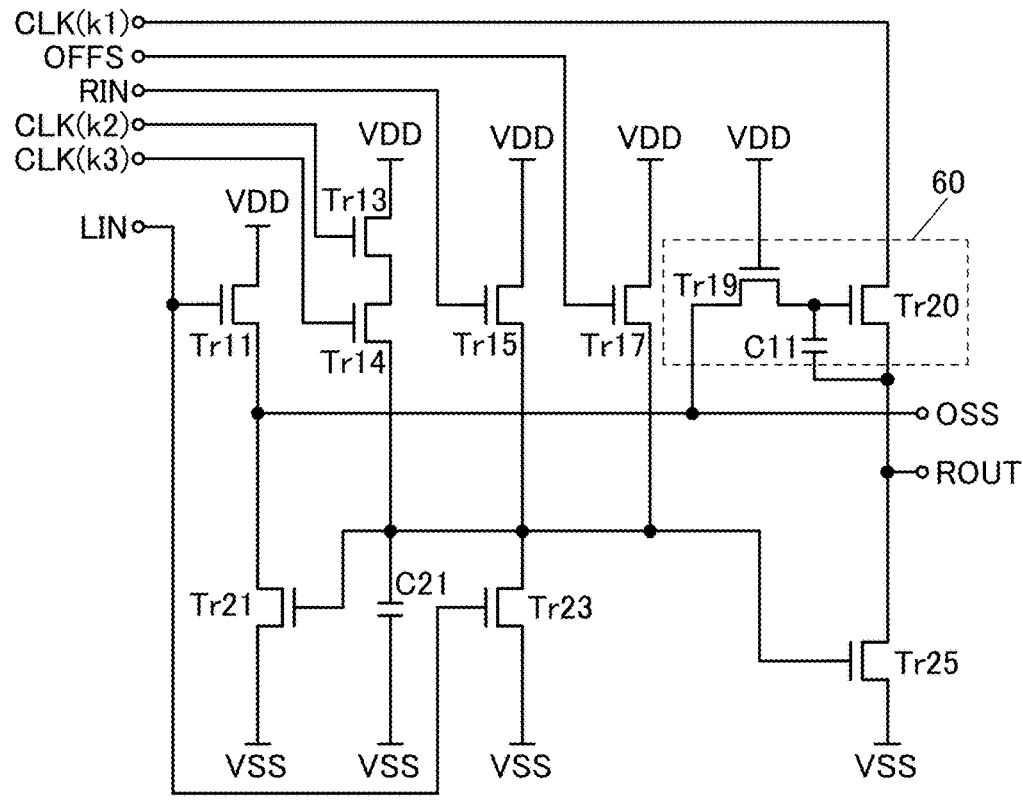
FIG. 11A and FIG. 11B are each a circuit diagram illustrating a structure example of a register circuit.

FIG. 11A is a diagram illustrating an example of a structure of the register circuit R included in the row driver circuit 33 illustrated in FIG. 10, and a variation example of the register circuit R in FIG. 4A. The register circuit R in FIG. 11A is different from the register circuit R in FIG. 4A in including a transistor Tr14.

One of the source and the drain of the transistor Tr13 is electrically connected to one of a source and a drain of the transistor Tr14 in the register circuit R illustrated in FIG. 11A. The other of the source and the drain of the transistor Tr14 is electrically connected to one of the source and the drain of the transistor Tr15, one of the source and the drain of the transistor Tr17, the gate of the transistor Tr21, one of the source and the drain of the transistor Tr23, a gate of the transistor Tr25, and one electrode of the capacitor C21. A gate of the transistor Tr14 is electrically connected to the terminal CLK(k3).

For example, the terminal CLK(k3) can be any one of the terminal CLK(1) to the terminal CLK(4) excluding the terminal CLK which is the same as the terminal CLK(k1) and the terminal CLK which is the same as the terminal CLK(k2).

Specifically, for example, in the register circuit R[1], the terminal CLK(k3) can be the terminal CLK(3). In the register circuit R[2], the terminal CLK(k3) can be the terminal CLK(4). In the register circuit R[3], the terminal CLK(k3) can be the terminal CLK(1).

Figure 11B:
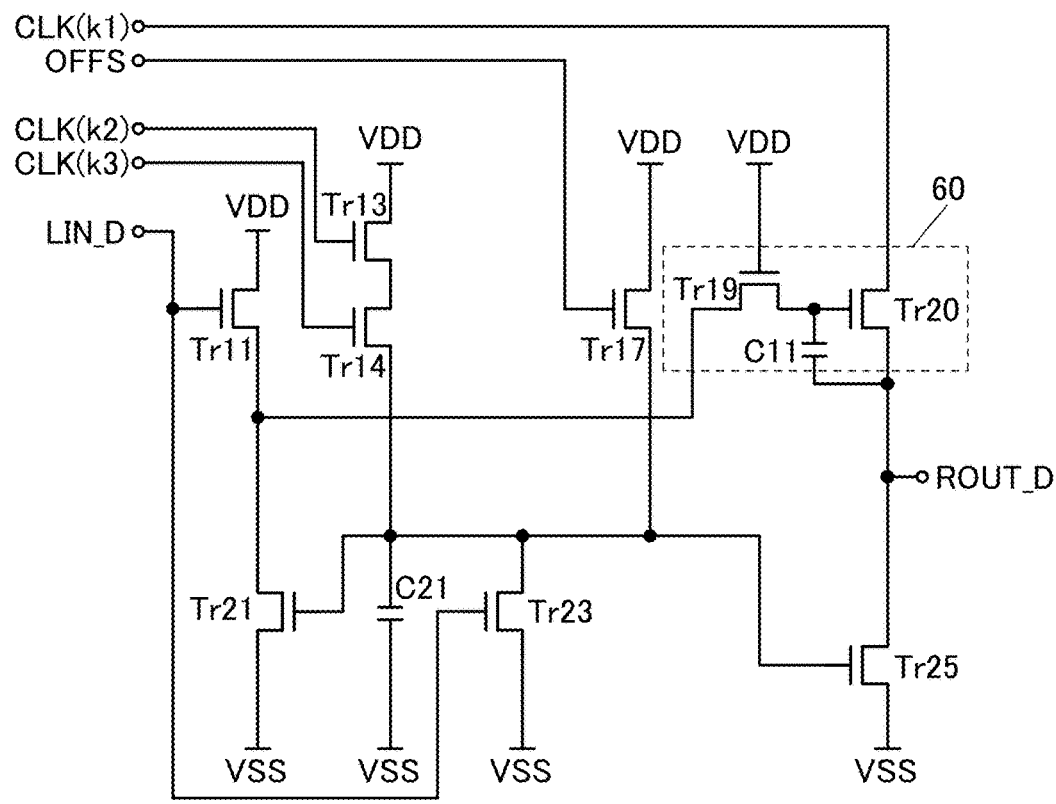

FIG. 11B is a circuit diagram illustrating a structure example of the register circuit RD included in the row driver circuit 33 illustrated in FIG. 10. The register circuit RD is different from the register circuit R illustrated in FIG. 11A in that the transistor Tr15 is not included. In addition, the register circuit RD is different from the register circuit R illustrated in FIG. 11A in that the gate of the transistor Tr11 and the gate of the transistor Tr23 are electrically connected to the terminal LIN_D. Furthermore, the register circuit RD is different from the register circuit R illustrated in FIG. 11A in that the other of the source and the drain of the transistor Tr20, one of the source and the drain of the transistor Tr25, and one electrode of the capacitor C11 are electrically connected to the terminal ROUT_D. Moreover, the register circuit RD is different from the register circuit R illustrated in FIG. 11A in that one of the source and the drain of the transistor Tr11, one of the source and the drain of the transistor Tr19, and one of the source and the drain of the transistor Tr21 are not electrically connected to the terminal OSS.

Figure 12:
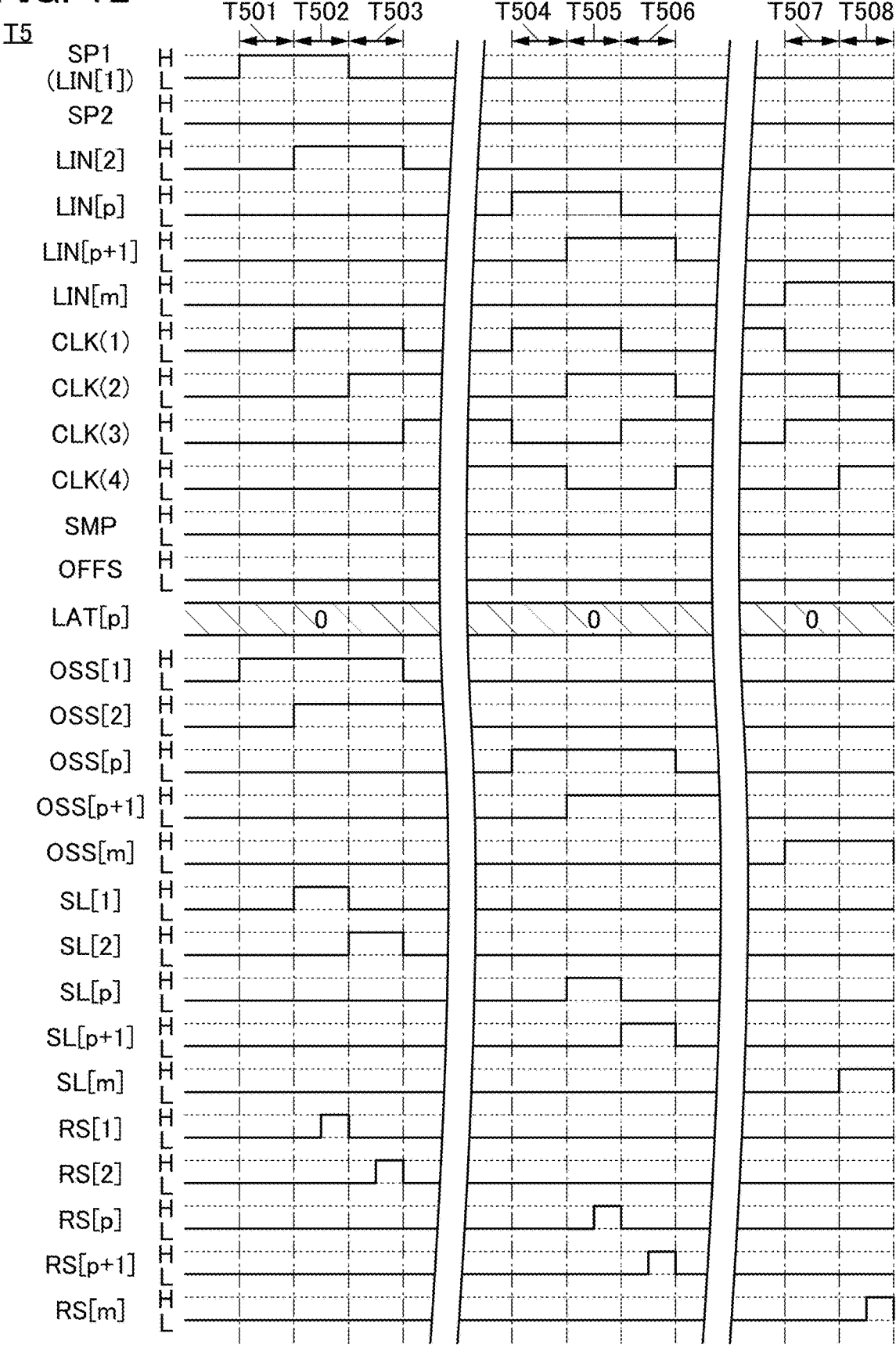
FIG. 12 is a timing chart illustrating an example of a driving method of a row driver circuit.
Figure 13:
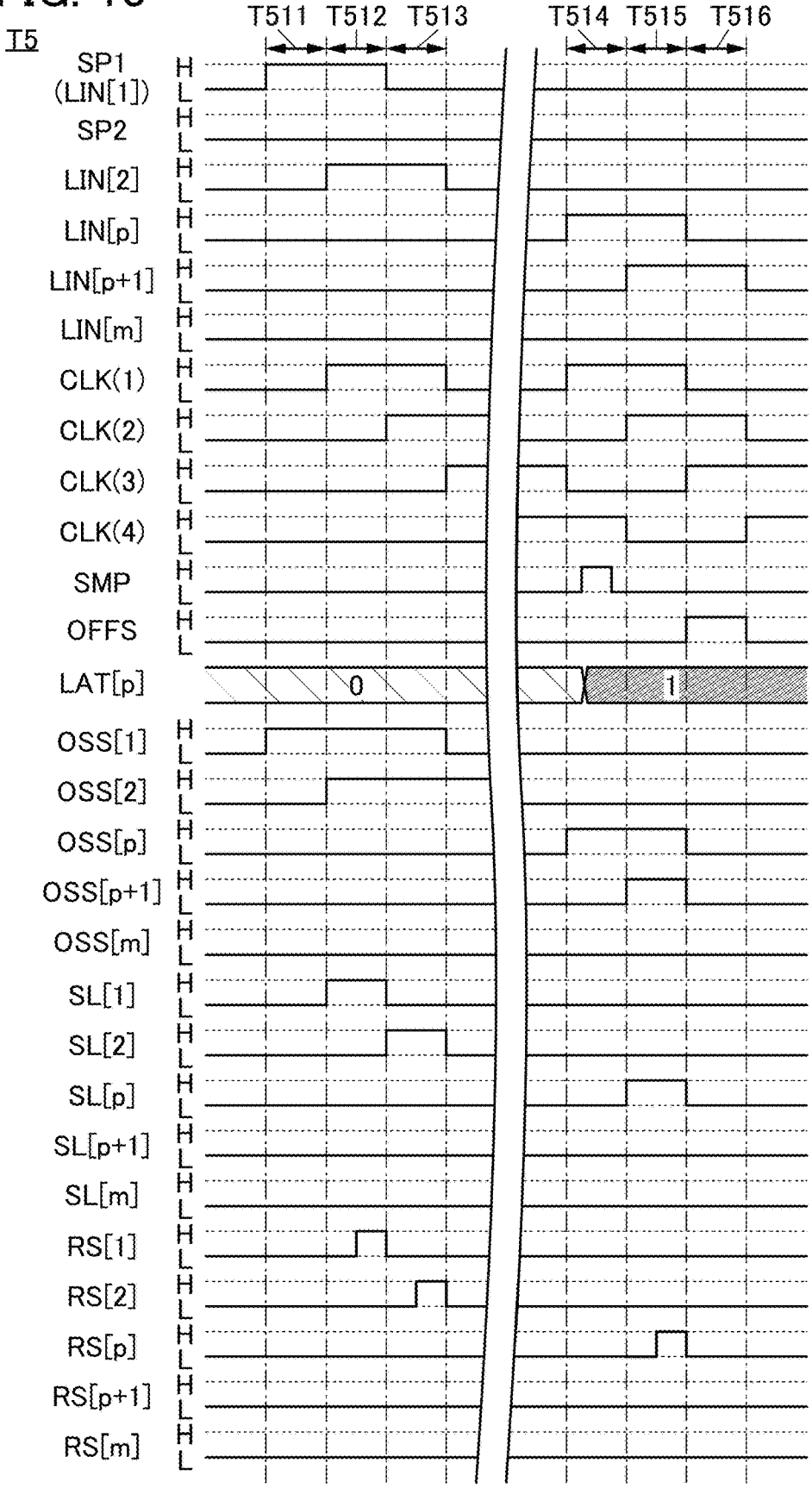
FIG. 13 is a timing chart illustrating an example of a driving method of a row driver circuit.
Figure 14:
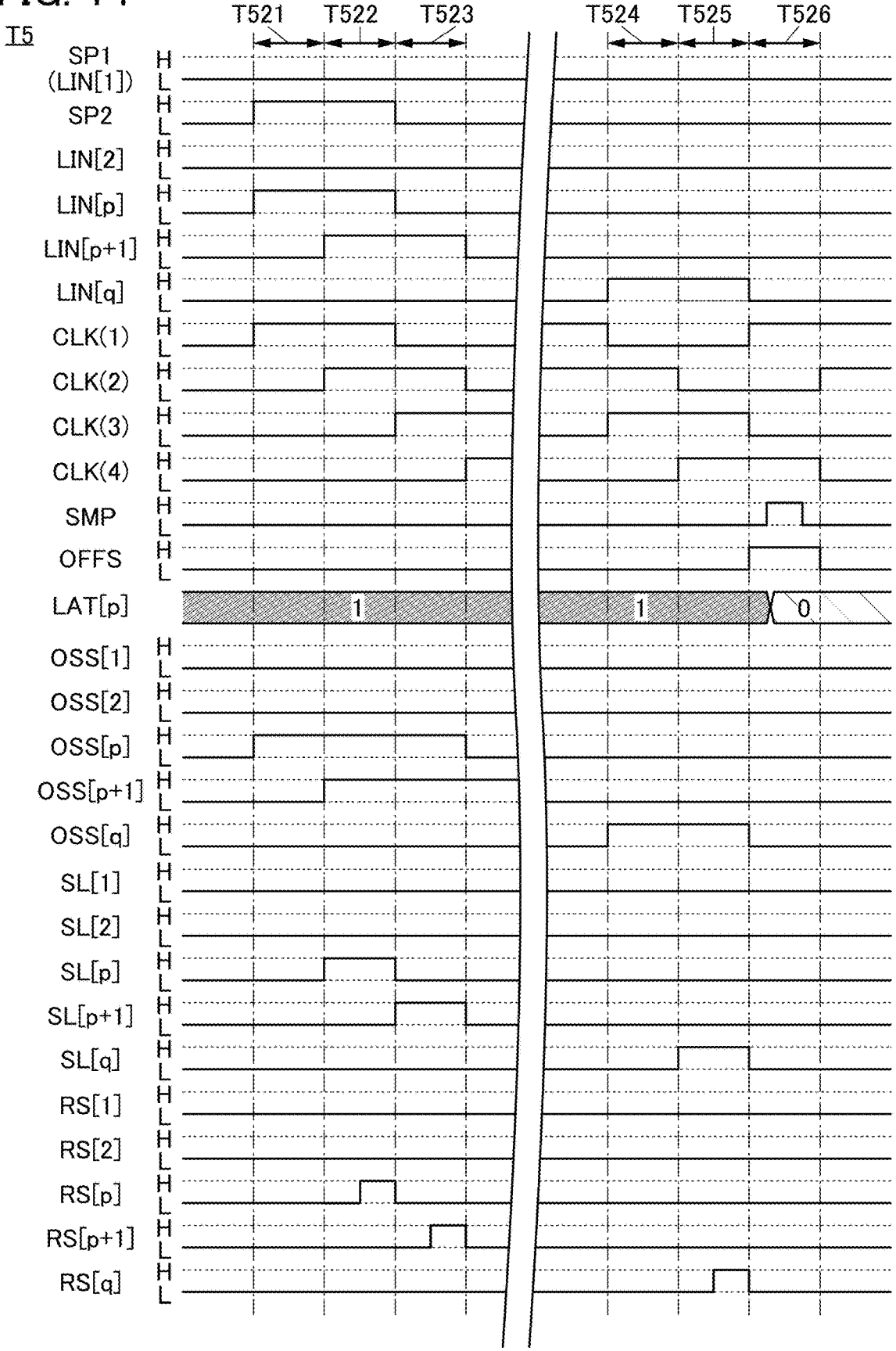
FIG. 14 is a timing chart illustrating an example of a driving method of a row driver circuit.

FIG. 12 to FIG. 14 are timing charts illustrating examples of the driving methods of the row driver circuit 33 illustrated in FIG. 10, and are variation examples of the driving methods in FIG. 7 to FIG. 9. Different points between the driving methods in FIG. 12 to FIG. 14 and the driving methods in FIG. 7 to FIG. 9 are mainly described below.

First, a driving method in FIG. 12 is described. The potential of the terminal SP1 (terminal LIN[1]) becomes a high potential in Period T501 and Period T502, and becomes a low potential in Period T503 to Period T508. The potential of the terminal LIN[2] becomes a high potential in Period T502 and Period T503 and becomes a low potential in Period T501 and Period T504 to Period T508. The potential of the terminal LIN[p] becomes a high potential in Period T504 and Period T505, and becomes a low potential in Period T501 to Period T503 and Period T506 to Period T508. The potential of the terminal LIN[p+1] becomes a high potential in Period T505 and Period T506, and becomes a low potential in Period T501 to Period T504 and in Period T507 and Period T508. The potential of the terminal LIN[m] becomes a high potential in Period T507 and Period T508, and becomes a low potential in Period T501 to Period T506.

The potential of the terminal CLK(1) becomes a high potential in Period T502, Period T503, Period T504, and Period T505, and becomes a low potential in Period T501, Period T506, Period T507, and Period T508. The potential of the terminal CLK(2) becomes a high potential in Period T503, Period T505, Period T506, and Period T507, and becomes a low potential in Period T501, Period T502, Period T504, and Period T508. The potential of the terminal CLK(3) becomes a high potential in Period T506, Period T507, and Period T508, and becomes a low potential in Period T501 to Period T503, Period T504, and Period T505. The potential of the terminal CLK(4) becomes a high potential in Period T504 and Period T508, and becomes a low potential in Period T501 to Period T503, Period T505, Period T506 and Period T507.

Furthermore, the potential of the terminal OSS[1] becomes a high potential in Period T501 to Period T503, and becomes a low potential in Period T504 to Period T508. The potential of the terminal OSS[2] becomes a high potential in Period T502 and Period T503, and becomes a low potential in Period T501, and Period T504 to Period T508. The potential of the terminal OSS[p] becomes a high potential in Period T504 to Period T506, and becomes a low potential in Period T501 to Period T503, Period T507 and Period T508. The potential of the terminal OSS[p+1] becomes a high potential in Period T505 and Period T506, and becomes a low potential in Period T501 to Period T504, Period T507 and Period T508. The potential of the terminal OSS[m] becomes a high potential in Period T507 and Period T508, and becomes a low potential in Period T501 to Period T506.

Next, a driving method in FIG. 13 is described. The potential of the terminal SP1 (terminal LIN[1]) becomes a high potential in Period T511 and Period T512, and a low potential in Period T513 to Period T516. The potential of the terminal LIN[2] becomes a high potential in Period T512 and Period T513 and becomes a low-potential in Period T511 and in Period T514 to Period T516. The potential of the terminal LIN[p] becomes a high potential in Period T514 and Period T515, and becomes a low potential in Period T511 to Period T513 and Period T516. The potential of the terminal LIN[p+1] becomes a high potential in Period T515 and Period T516, and becomes a low potential in Period T511 to Period T514.

The potential of the terminal CLK(1) becomes a high potential in Period T512, Period T513, Period T514, and Period T515, and becomes a low potential in Period T511 and Period T516. The potential of the CLK(2) becomes a high potential in Period T513, Period T515, and Period T516, and becomes a low potential in Period T511, Period T512, and Period T514. The potential of CLK(3) becomes a high potential in Period T516, and becomes a low potential in Period T511 to Period T513, Period T514 and Period T515. The potential of CLK(4) becomes a high potential in Period T514 and becomes a low potential in Period T511 to Period T513, Period T515, and Period T516.

Furthermore, the potential of the terminal OSS[1] becomes a high potential in Period T511 to Period T513, and becomes a low potential in Period T514 to Period T516. The potential of the terminal OSS[2] becomes a high potential in Period T512 and Period T513, and becomes a low potential in Period T511 and Period T514 to Period T516.

A driving method in FIG. 14 is described. The potential of the terminal SP2 becomes a high potential in Period T521 and Period T522, and a low potential in Period T523 to Period T526. The potential of the terminal LIN[p] becomes a high potential in Period T521 and Period T522, and becomes a low potential in Period T523 to Period T526. The potential of the terminal LIN[p+1] becomes a high potential in Period T522 and Period T523, and becomes a low potential in Period T521 and Period T524 to Period T526. The potential of the terminal LIN[q] becomes a high potential in Period T524 and Period T525, and becomes a low potential in Period T521 to Period T523 and Period T526.

The potential of the terminal CLK(1) becomes a high potential in Period T521, Period T522, and Period T526, and becomes a low potential in Period T523, Period T524, and Period T525. The potential of the CLK(2) becomes a high potential in Period T522, Period T523, and Period T524, and becomes a low potential in Period T521, Period T525, and Period T526. The potential of CLK(3) becomes a high potential in Period T523, Period T524, and Period T525, and becomes a low potential in Period T521, Period T522, and Period T526. The potential of the terminal CLK(4) becomes a high potential in Period T525 and Period T526, and becomes a low potential in Period T521 to Period T523 and Period T524.

Furthermore, the potential of the terminal OSS[p] becomes a high potential in Period T521 to Period T523, and becomes a low potential in Period T524 to Period T526. The potential of the terminal OSS[p+1] becomes a high potential in Period T522 and Period T523, and becomes a low potential in Period T521 and Period T524 to Period T526.

In the driving method illustrated in FIG. 12 to FIG. 14, the potentials of the two terminals LIN can be set to high potentials in the same period. For example, in the example in FIG. 12, the potentials of the terminal LIN[1] and the terminal LIN[2] can be set to high potentials in Period T502, and the potentials of the terminal LIN[p] and terminal LIN[p+1] can be set to high potentials in Period T505.

Structure Example_2 of Shift Register Circuit

Figure 15:
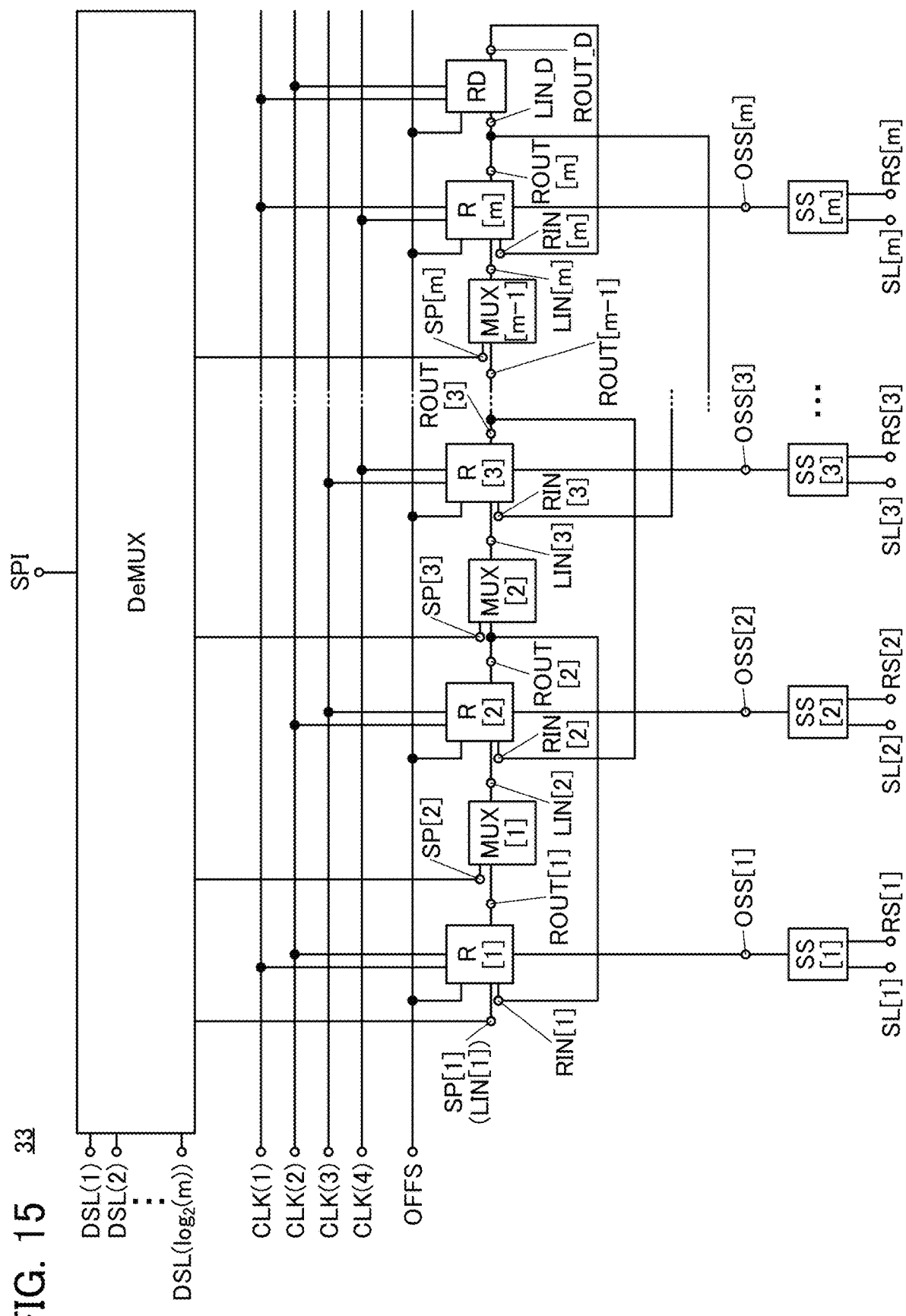
FIG. 15 is a block diagram illustrating a structure example of a row driver circuit.

FIG. 15 is a diagram illustrating a structure example of the row driver circuit 33. Specifically, FIG. 15 is a diagram illustrating a structure example of the shift register circuit included in the row driver circuit 33. The shift register circuit includes a demultiplexer circuit DeMUX, the register circuit R, the register circuit RD, a multiplexer circuit MUX, and the signal supply circuit SS. Here, the register circuit having the structure illustrated in FIG. 15 can include, for example, m register circuits R and m signal supply circuits SS, one register circuit RD, and (m−1) multiplexer circuits MUX.

An input terminal of the demultiplexer circuit DeMUX is electrically connected to the terminal SPI. An output terminal of the demultiplexer circuit DeMUX is electrically connected to a terminal SP[1] to a terminal SP [m]. A selection signal input terminal of the demultiplexer circuit DeMUX is electrically connected to a terminal DSL(1) to a terminal DSL(log$_2$(m)). Note that the terminal SP[1] can serve as the terminal LIN[1].

Here, the selection signal input terminal of the demultiplexer circuit DeMUX can be electrically connected to log$_2$(m) or more terminals DSL. For example, the selection signal input terminals of the demultiplexer circuit DeMUX can be electrically connected to the minimum number of an integer greater than or equal to log$_2$(m), i.e., terminals DSL in number which is expressed by a ceiling function of log$_2$(m). For example, in the case where m is 10, four terminals DSL can be electrically connected to the selection signal input terminals of the demultiplexer circuit DeMUX. In this manner, the selection signal input terminals of the demultiplexer circuit DeMUX are electrically connected to log$_2$(m) or more terminals DSL, and thus the number of m is not limited to a power of two.

In the description below, m is a power of two.

The terminal SP [1] is electrically connected to an input terminal of the register circuit R[1]. The terminal SP[2] to the terminal SP [m] are electrically connected to input terminals of the multiplexer circuit MUX[1] to the multiplexer circuit MUX[m−1], respectively. In other words, an output terminal of the demultiplexer circuit DeMUX is electrically connected to the input terminal of the register circuit R through the terminal SP [1] and to input terminals of the multiplexer circuit MUX[1] to the multiplexer circuit MUX[m−1] through the corresponding terminal SP [2] to terminal SP [m].

The output terminal of the register circuit R[1] is electrically connected to the terminal ROUT[1], and the terminal ROUT[1] is electrically connected to an input terminal of the multiplexer circuit MUX[1]. That is, a signal output from the register circuit R[1] is input to the multiplexer circuit MUX[1] through the terminal ROUT[1].

The output terminals of the multiplexer circuit MUX[1] to the multiplexer circuit MUX[m−1] are electrically connected to the terminal LIN[2] to the terminal LIN[m], respectively, and the terminal LIN[2] to the terminal LIN[m] are electrically connected to input terminals of the register circuit R[2] to the register circuit R[m], respectively. The output terminals of the register circuit R[2] to register circuit R[m−1] are electrically connected to the terminal ROUT[1] to the terminal ROUT[m−1], respectively, and the terminal ROUT[1] to the terminal ROUT[m−1] are electrically connected to the input terminals of the multiplexer circuit MUX[1] to the multiplexer circuit MUX [m−1], respectively.

That is, the register circuit R[1] to register circuit R[m] are connected in series with the multiplexer circuit MUX[1] to the multiplexer circuit MUX[m−1] interposed therebetween. In other words, the series connection of the register circuit R[1] to the register circuit R[m] alternates with the series connection of the multiplexer circuit MUX[1] to the multiplexer circuit MUX[m−1].

As in the row driver circuit 33 illustrated in FIG. 3, the output terminal of the register circuit R[m] is electrically connected to the terminal ROUT[m]. The terminal ROUT[m] is electrically connected to the terminal LIN_D, and the terminal LIN_D is electrically connected to the input terminal of the register circuit RD.

The terminal ROUT[2] to the terminal ROUT[m] are electrically connected to the terminal RIN[1] to the terminal RIN[m−1], respectively, and the terminal RIN[1] to the terminal RIN[m−1] are electrically connected to input terminals of the register circuit R[1] to register circuit R[m−1], respectively. The output terminal of the register circuit RD is electrically connected to the terminal ROUT_D and the terminal ROUT_D is electrically connected to the terminal RIN[m]. The terminal RIN[m] is electrically connected to the input terminal of the register circuit R[m].

In addition, as in the row driver circuit 33 illustrated in FIG. 3, two terminals CLK of the terminal CLK(1) to the terminal CLK(4) are electrically connected to the input terminals of the register circuit R[1] to the register circuit R[m] and the register circuit RD, for example.

The terminal OFFS is electrically connected to the input terminals of the register circuit R[1] to the register circuit R[m] and the input terminal of the register circuit RD. The terminal OSS[1] to the terminal OSS[m] are electrically connected to the output terminals of the register circuit R[1] to register circuit R[m], respectively. The terminal OSS[1] to the terminal OSS[m] are electrically connected to the input terminals of the signal supply circuit SS[1] to the signal supply circuit SS[m], respectively. The terminal SL[1] to the terminal SL[m] and the terminal RS[1] to the terminal RS[m] are electrically connected to the output terminals of the signal supply circuit SS[1] to the signal supply circuit SS[m], respectively.

The demultiplexer circuit DeMUX has a function of outputting a signal input to the terminal SPI to any of the terminal SP[1] to the terminal SP [m], in accordance with signals input to the terminal DSL(1) to the terminal DSL (log$_2$(m)). Here, a start pulse signal is input to the terminal SPI; thus, the terminal SPI and the terminal SP[1] to the terminal SP[m] are start pulse signal input terminals.

A log$_2$(m)-bit digital signal can be input to the terminal DSL. Thus, the value of the digital signal input to the terminal DSL can be "0" to "m−1". The demultiplexer circuit DeMUX can output the start pulse signal input to the terminal SPI to any terminal SP of the terminal SP [1] to the terminal SP[m], which corresponds to the value expressed by the above digital signal. For example, when the value of the digital signal input to the terminal DSL is "0", the demultiplexer circuit DeMUX can output a start pulse signal from the terminal SP[1]. In addition, when the value of the digital signal input to the terminal DSL is "m−1", the demultiplexer circuit DeMUX can output a start pulse signal from the terminal SP [m].

In this specification and the like, in the case where a digital signal is input to the terminal DSL, for example, the signal input to the terminal DSL(1) expresses a least significant bit, and the signal input to the terminal DSL(log$_2$(m)) expresses a most significant bit.

The multiplexer circuit MUX has a function of outputting either the start pulse signal input from the terminal SP or the scan signal input from the terminal ROUT, to the terminal LIN. Thus, either the start pulse signal or the scan signal can be input to the register circuit R[2] to register circuit R[m].

In the row driver circuit 33 having the structure illustrated in FIG. 15, the register circuit R of the register circuit R[1] to register circuit R[m], to which a start pulse signal is input, outputs a scan signal. The scan signal is sequentially transmitted up to the register circuit RD through the terminal ROUT, terminal LIN, and terminal LIN_D. In other words, scanning can be started from the register circuit R to which the start pulse signal is input.

Figure 16A:
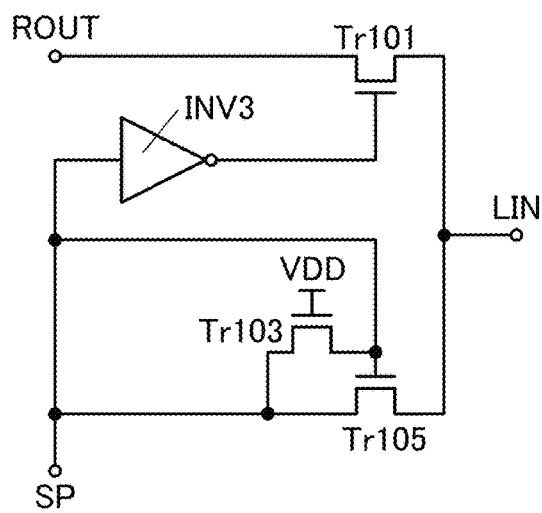
FIG. 16A and FIG. 16B are each a circuit diagram illustrating a structure example of a multiplexer circuit.
Figure 16B:
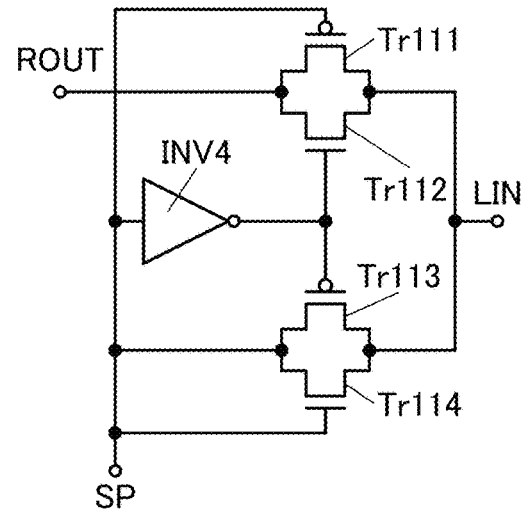

FIG. 16A and FIG. 16B are each a circuit diagram illustrating a structure example of the multiplexer circuit MUX. The multiplexer circuit MUX in FIG. 16A includes a transistor Tr101, a transistor Tr103, a transistor Tr105, and an inverter circuit INV3. The transistor Tr101, the transistor Tr103, and the transistor Tr105 can be, for example, n-channel transistors. The inverter circuit INV3 can have a structure illustrated in FIG. 5A2, for example.

In the case where the potential of the terminal SP is a low potential in the multiplexer circuit MUX having the structure in FIG. 16A, the transistor Tr101 is in an on state and the transistor Tr105 is in an off state. Thus, a signal input to the terminal ROUT is output to the terminal LIN. On the other hand, in the case where the potential of the terminal SP is a high potential, the transistor Tr101 is in an off state and the transistor Tr105 is in an on state. Thus, a signal input from the terminal SP is output to the terminal LIN.

The multiplexer circuit MUX in FIG. 16B includes a transistor Tr111, a transistor Tr112, a transistor Tr113, a transistor Tr114, and an inverter circuit INV4. The transistor Tr111 and the transistor Tr113 can be p-channel transistors, and the transistor Tr112 and the transistor Tr114 can be n-channel transistors. The inverter circuit INV4 can have a structure illustrated in FIG. 5B2, for example.

In the case where the potential of the terminal SP is a low potential in the multiplexer circuit MUX having the structure in FIG. 16B, the transistor Tr111 and the transistor Tr112 are in on states and the transistor Tr113 and the transistor Tr114 are in off states. Thus, a signal input to the terminal ROUT is output to the terminal LIN. On the other hand, in the case where the potential of the terminal SP is a high potential, the transistor Tr111 and the transistor Tr112 are in off states and the transistor Tr113 and the transistor Tr114 are in on states. Thus, a signal input from the terminal SP is output to the terminal LIN.

As described above, in the period in which a high-potential signal is input to the terminal SP as a start pulse signal, the multiplexer circuit MUX having the structure illustrated in FIG. 16A or FIG. 16B can output the start pulse signal to the terminal LIN. In contrast, in the period in which the start pulse signal is not input to the terminal SP, the multiplexer circuit MUX can output the signal input from the terminal ROUT to the terminal LIN.

FIG. 17A is a circuit diagram illustrating a structure example of the demultiplexer circuit DeMUX. The demultiplexer circuit DeMUX includes a demultiplexer circuit D.

The demultiplexer circuit DeMUX has a structure in which one path is branched into two paths in every stage, and includes m paths in total. In other words, the demultiplexer circuits D are connected to each other in a tournament system. An input terminal of the demultiplexer circuit D in the first stage is electrically connected to the terminal SPI. Output terminals of each of the demultiplexer circuits D in the $\log_2(m)$-th stage, which is the final stage, are electrically connected to two terminals SP.

Selection signal input terminals of the demultiplexer circuit D are electrically connected to the terminal DSL and a terminal DSLB. In this case, a complementary signal of a signal input to the terminal DSL is input to the terminal DSLB. For example, when a 1-bit digital signal with the value of "0" is input to the terminal DSL(1), a 1-bit digital signal with the value of "1" is input to a terminal DSLB(1). In contrast, when a 1-bit digital signal with the value of "1" is input to the terminal DSL(1), a 1-bit digital signal with the value of "0" is input to the terminal DSLB(1). The same applies to a terminal DSLB(2) to a terminal DSLB($\log_2$(m)).

Having the structure illustrated in FIG. 17A, the demultiplexer circuit DeMUX can output a signal input to the terminal SPI, to the terminals SP corresponding to the values expressed by the signals input to the terminal DSL(1) to the terminal DSL($\log_2$ (m)).

FIG. 17B1, FIG. 17B2, and FIG. 17B3 are circuit diagrams illustrating structure examples of the demultiplexer circuit D. The demultiplexer circuit D having the structure illustrated in FIG. 17B1 includes a transistor Tr121, a transistor Tr122, a transistor Tr123, and a transistor Tr124. The transistor Tr121 to the transistor Tr124 can be n-channel transistors, for example.

In the demultiplexer circuit D having the structure illustrated in FIG. 17B1, the terminal DSL is electrically connected to one of a source and a drain of the transistor Tr121. The other of the source and the drain of the transistor Tr121 is electrically connected to a gate of the transistor Tr123. The terminal DSLB is electrically connected to one of a source and a drain of the transistor Tr122. The other of the source and the drain of the transistor Tr122 is electrically connected to a gate of the transistor Tr124. One of a source and a drain of the transistor Tr123 and one of a source and a drain of the transistor Tr124 are electrically connected to the input terminal of the demultiplexer circuit D. The other of the source and the drain of the transistor Tr123 is electrically connected to a first output terminal of the demultiplexer circuit D. The other of the source and the drain of the transistor Tr124 is electrically connected to a second output terminal of the demultiplexer circuit D. Furthermore, a high potential can be supplied to a gate of the transistor Tr121 and a gate of the transistor Tr122.

In the demultiplexer circuit D having the structure illustrated in FIG. 17B1, when the potential of the terminal DSL is a high potential and the potential of the terminal DSLB is a low potential, the transistor Tr123 is in an on state and the transistor Tr124 is in an off state. Thus, a signal input from the input terminal of the demultiplexer circuit D is output from the first output terminal of the demultiplexer circuit D. In contrast, when the potential of the terminal DSL is a low potential and the potential of the terminal DSLB is a high potential, the transistor Tr123 is in an off state and the transistor Tr124 is in an on state. Thus, the signal input from the input terminal of the demultiplexer circuit D is output from the second output terminal of the demultiplexer circuit D.

FIG. 17B2 is a variation example of the demultiplexer circuit D illustrated in FIG. 17B1. The demultiplexer circuit D illustrated in FIG. 17B2 is different from the demultiplexer circuit D illustrated in FIG. 17B1 in that a transistor Tr125 and a transistor Tr126 are included.

In the demultiplexer circuit D having the structure illustrated in FIG. 17B2, one of a source and a drain of the transistor Tr125 is electrically connected to the second output terminal of the demultiplexer circuit D, and a gate of the transistor Tr125 is electrically connected to the gate of the transistor Tr123. One of a source and a drain of the transistor Tr126 is electrically connected to the first output terminal of the demultiplexer circuit D, and a gate of the transistor Tr126 is electrically connected to the gate of the transistor Tr124. A low potential can be supplied to the other of the source and the drain of the transistor Tr125 and the other of the source and the drain of the transistor Tr126.

In the demultiplexer circuit D having the structure illustrated in FIG. 17B2, when the potential of the terminal DSL is a high potential and the potential of the terminal DSLB is a low potential, the transistor Tr123 and the transistor Tr125 are in on states and the transistor Tr124 and the transistor Tr126 are in off states. Thus, the signal input from the input terminal of the demultiplexer circuit D is output from the first output terminal of the demultiplexer circuit D and the potential of the second output terminal of the demultiplexer circuit D becomes a low potential. On the other hand, in the case where the potential of the terminal DSL is a low potential and the potential of the terminal DSLB is a high potential, the transistor Tr123 and the transistor Tr125 are in off states and the transistor Tr124 and the transistor Tr126 are in on states. Thus, the signal input from the input terminal of the demultiplexer circuit D is output from the second output terminal of the demultiplexer circuit D and the potential of the first output terminal of the demultiplexer circuit D becomes a low potential.

The demultiplexer circuit D having the structure illustrated in FIG. 17B3 includes a transistor Tr131, a transistor Tr132, a transistor Tr133, and a transistor Tr134. The transistor Tr131 and the transistor Tr133 can be n-channel transistors, and the transistor Tr132 and the transistor Tr134 can be p-channel transistors.

In the demultiplexer circuit D having the structure illustrated in FIG. 17B3, the terminal DSL is electrically connected to a gate of the transistor Tr131 and a gate of the transistor Tr134. The terminal DSLB is electrically connected to a gate of the transistor Tr132 and a gate of the transistor Tr133. An input terminal of the demultiplexer circuit D is electrically connected to one of a source and a drain of the transistor Tr131, one of a source and a drain of the transistor Tr132, one of a source and a drain of the transistor Tr133, and one of a source and a drain of the transistor Tr134. The other of the source and the drain of the transistor Tr131 and the other of the source and the drain of the transistor Tr132 are electrically connected to the first output terminal of the demultiplexer circuit D. The other of the source and the drain of the transistor Tr133 and the other of the source and the drain of the transistor Tr134 are electrically connected to the second output terminal of the demultiplexer circuit D.

In the demultiplexer circuit D having the structure illustrated in FIG. 17B3, when the potential of the terminal DSL is a high potential and the potential of the terminal DSLB is a low potential, the transistor Tr131 and the transistor Tr132 are in on states and the transistor Tr133 and the transistor Tr134 are in off states. Thus, the signal input from the input terminal of the demultiplexer circuit D is output from the first output terminal of the demultiplexer circuit D. On the other hand, when the potential of the terminal DSL is a low potential and the potential of the terminal DSLB is a high potential, the transistor Tr131 and the transistor Tr132 are in off states and the transistor Tr133 and the transistor Tr134 are in on states. Thus, the signal input from the input terminal of the demultiplexer circuit D is output from the second output terminal of the demultiplexer circuit D.

Figure 18:
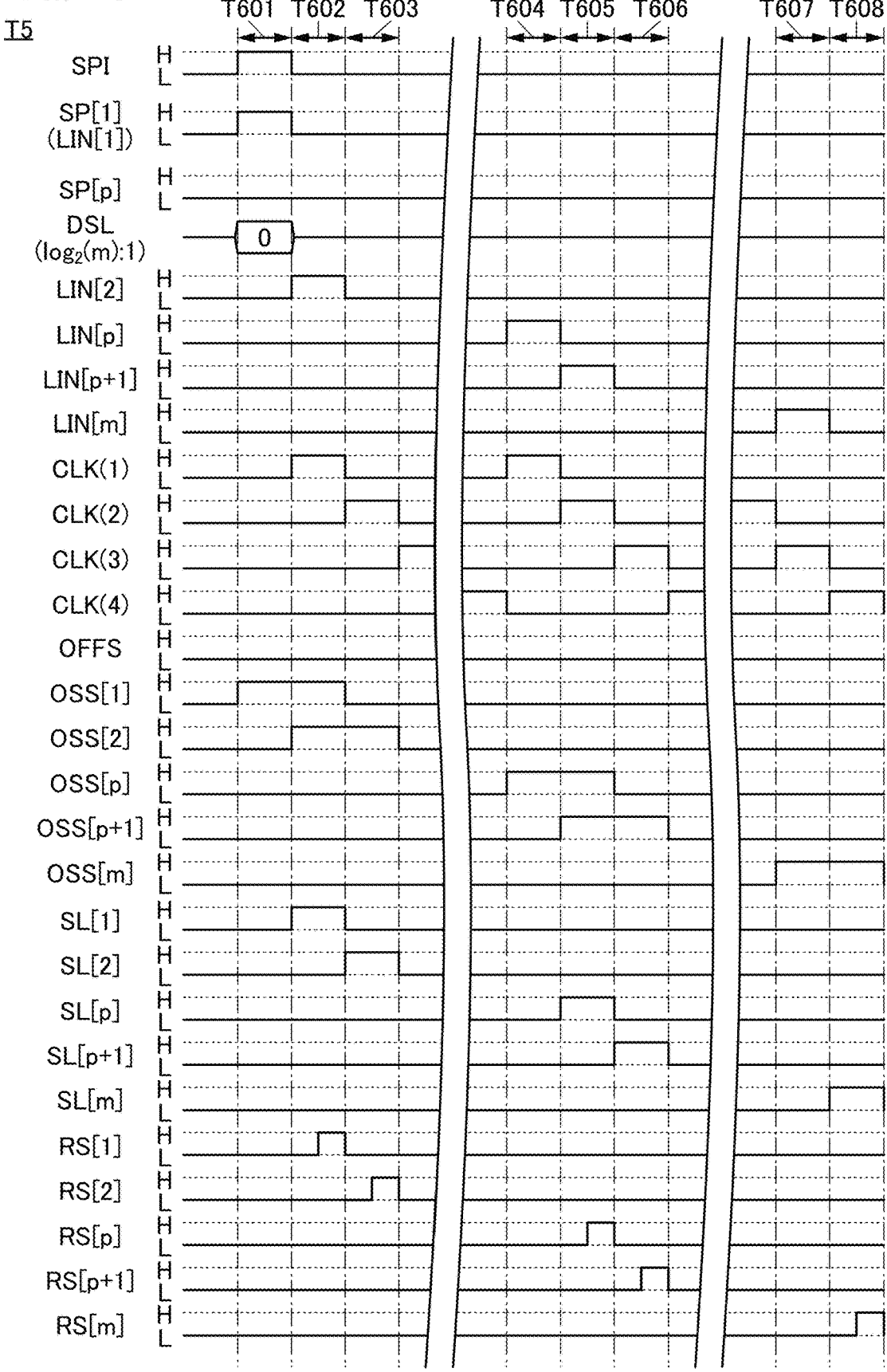
FIG. 18 is a timing chart illustrating an example of a driving method of a row driver circuit.

The row driver circuit 33 illustrated in FIG. 15 can be driven by the method illustrated in FIG. 6A and FIG. 6B. FIG. 18 is a timing chart illustrating the details of a driving method for driving the row driver circuit 33 illustrated in FIG. 15 in the mode illustrated in FIG. 6A. FIG. 18 illustrates an example of a driving method of the row driver circuit 33 with divided periods, Period T601 to Period T608.

In Period T601, a high-potential signal is input as a start pulse signal to the terminal SPI. A digital signal "0" is input to the terminal DSL. Thus, the start pulse signal is input to the terminal SP [1].

The potentials of the terminal LIN[1] to the terminal LIN[m], the potentials of the terminal CLK(1) to the terminal CLK(4), the potential of the terminal OFFS, the potentials of the terminal OSS[1] to the terminal OSS[m], the potentials of the terminal SL[1] to the terminal SL [m], and the potentials of the terminal RS[1] to the terminal RS[m] in Period T601 to Period T608 can be similar to the potentials in Period T501 to Period T508 illustrated in FIG. 7.

By driving the row driver circuit 33 by the method illustrated in FIG. 18, captured-image data can be sequentially read out from the pixels 31 in the first to m-th rows.

Figure 19:
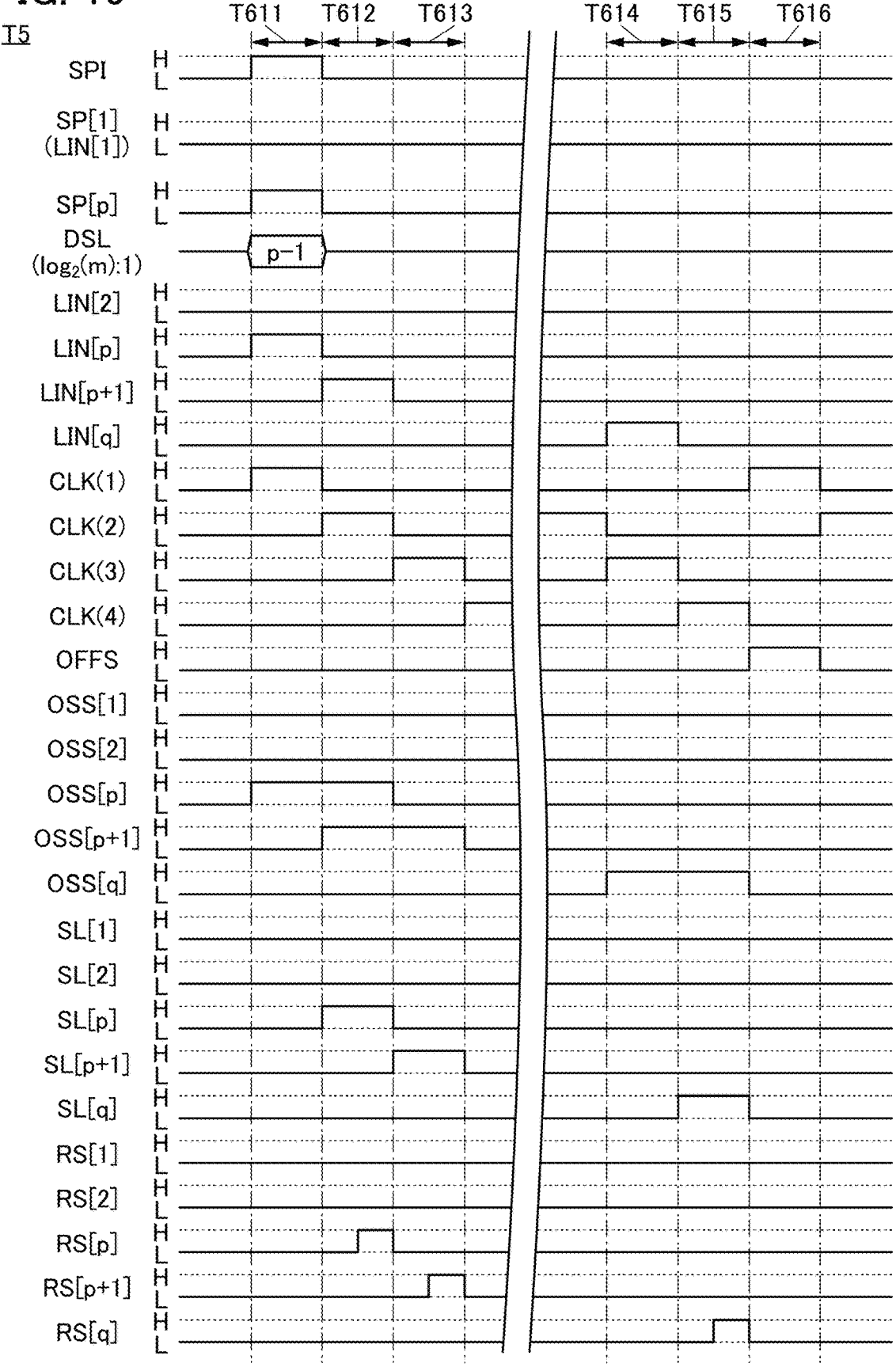
FIG. 19 is a timing chart illustrating an example of a driving method of a row driver circuit.

FIG. 19 is a timing chart illustrating the details of a driving method for driving the row driver circuit 33 illustrated in FIG. 15 in the mode illustrated in FIG. 6B. FIG. 19 illustrates an example of a driving method of the row driver circuit 33 with divided periods, Period T611 to Period T616.

In Period T611, a high-potential signal is input as a start pulse signal to the terminal SPI. In addition, a digital signal, "p–1", is input to the terminal DSL. Thus, the start pulse signal is input to the terminal SP [p], and the potential of the terminal LIN[p] becomes a high potential.

The potentials of the terminal LIN[1] to the terminal LIN[m], the potentials of the terminal CLK(1) to the terminal CLK(4), the potential of the terminal OFFS, the potentials of terminal OSS[1] to the terminal OSS[m], the potentials of the terminal SL[1] to the terminal SL [m], the potentials of the terminal RS[1] to the terminal RS[m] in Period T611 to Period T616 can be similar to those in the potentials in Period T521 to Period T526 illustrated in FIG. 9.

By driving the row driver circuit 33 by the method illustrated in FIG. 19, captured-image data can be sequentially read out from the pixels 31 in the p-th to q-th rows.

As described above, the operations illustrated in FIG. 18 and FIG. 19 are performed in the readout period by the row driver circuit 33, whereby the semiconductor device of one embodiment of the present invention can perform authentication such as fingerprint authentication. As described above, in the period illustrated in FIG. 6A, the readout period per row of the pixels 31 can be shortened compared with the period illustrated in FIG. 6B. Accordingly, Period T605 illustrated in FIG. 18 can be shorter than Period T612 in FIG. 19. Therefore, the transmission rate of a scan signal in the case where the row driver circuit 33 is driven by the method illustrated in FIG. 18 can be higher than the transmission rate of a scan signal in the case where the row driver circuit 33 is driven by the method illustrated in FIG. 19.

In the operation illustrated in FIG. 19, any of the register circuit R[2] to the register circuit R[m] can be driven without an input of a scan signal from the register circuit R in the previous stage. Thus, any of the register circuit R[2] to the register circuit R[m] can be operated regardless of the operation of the register circuit R in the previous stage.

Figure 20:
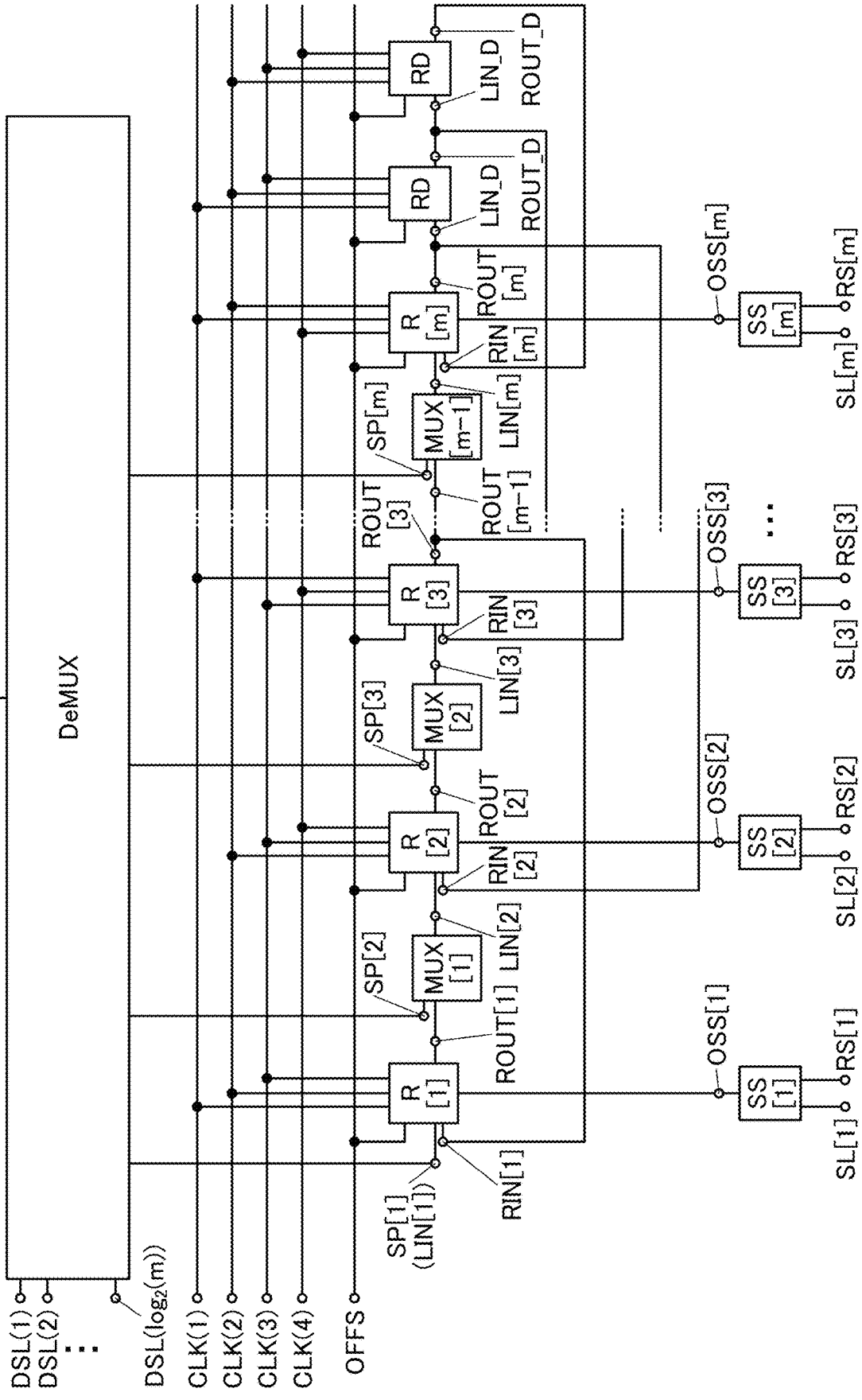
FIG. 20 is a block diagram illustrating a structure example of a row driver circuit.

FIG. 20 illustrates a structure example of the row driver circuit 33, and is a variation example of the row driver circuit 33 illustrated in FIG. 15. The row driver circuit 33 illustrated in FIG. 20 is different from the row driver circuit 33 illustrated in FIG. 15 in that three terminals CLK are electrically connected to one register circuit R. The row driver circuit 33 illustrated in FIG. 20 is different from the row driver circuit 33 illustrated in FIG. 15 in that a signal input to the terminal ROUT from the register circuit R in the stage after the subsequent stage is input to the terminal RIN.

The row driver circuit 33 illustrated in FIG. 20 is different from the row driver circuit 33 illustrated in FIG. 15 in that two register circuits RD are included.

The register circuit R included in the row driver circuit 33 illustrated in FIG. 20 can have the structure illustrated in FIG. 11A, and the register circuit RD can have the structure illustrated in FIG. 11B.

Figure 21:
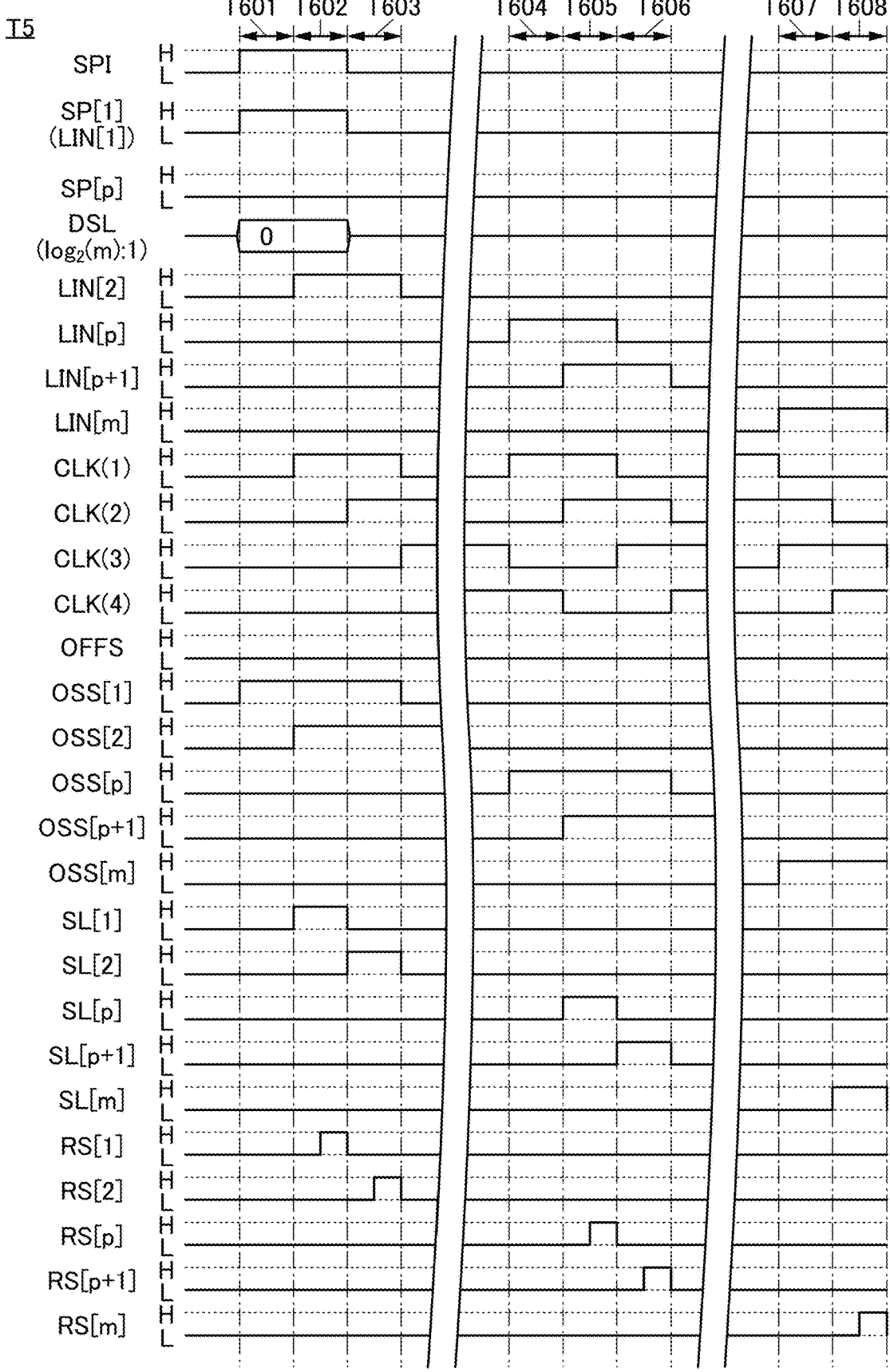
FIG. 21 is a timing chart illustrating an example of a driving method of a row driver circuit.
Figure 22:
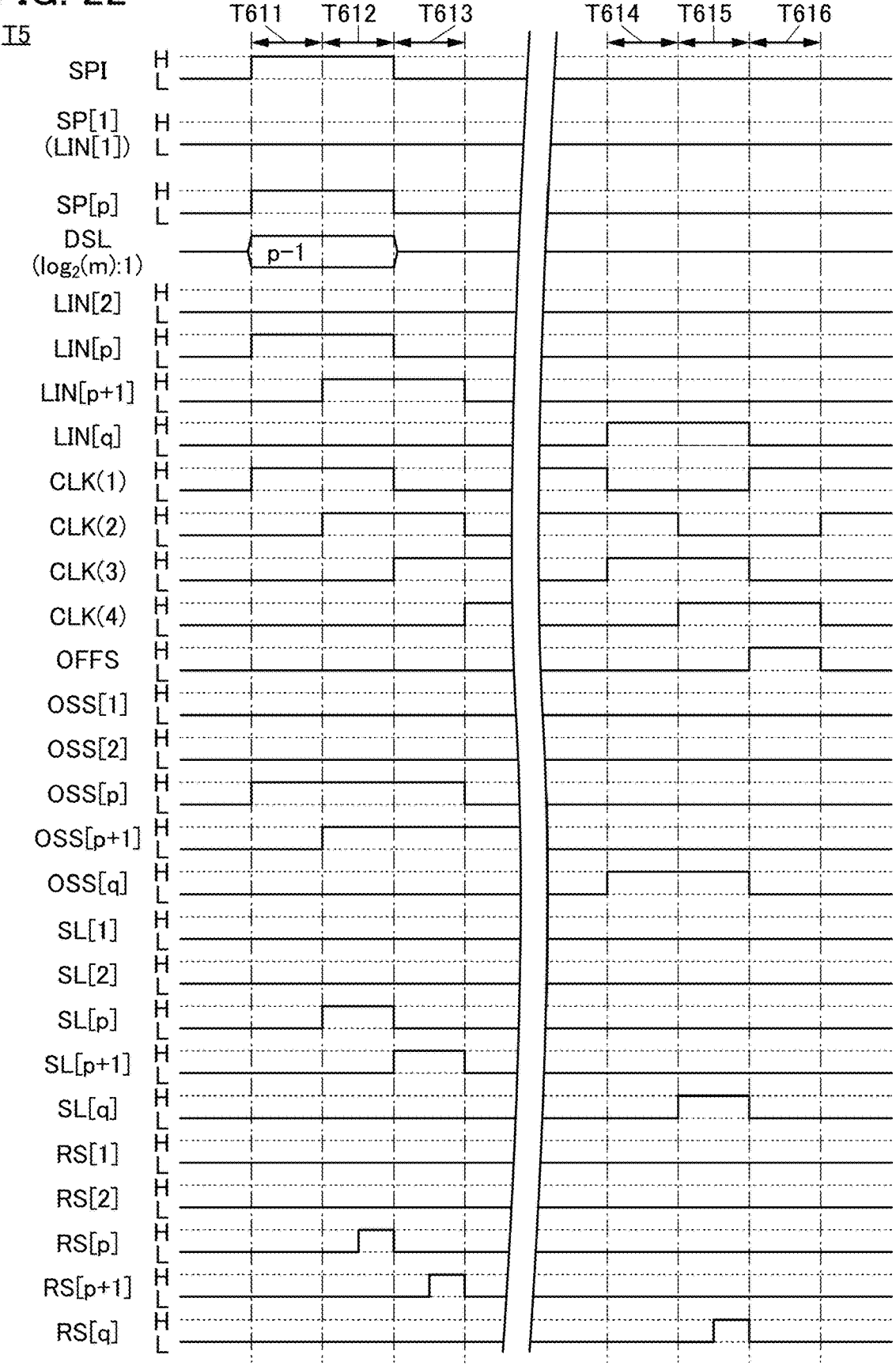
FIG. 22 is a timing chart illustrating an example of a driving method of a row driver circuit.

FIG. 21 and FIG. 22 are timing charts illustrating examples of the driving methods of the row driver circuit 33 illustrated in FIG. 20, and are variation examples of the driving methods illustrated in FIG. 18 and FIG. 19. The following mainly describes different points between the driving methods in FIG. 21 and FIG. 22 and the driving methods in FIG. 18 and FIG. 19.

In the driving method in FIG. 21, the potential of the terminal SPI and the potential of the terminal SP[1] (LIN[1]) become high potentials in Period T601 and Period T602 and become low potentials in Period T603 to Period T608. In Period T601 and Period T602, a digital signal "0" is input to the terminal DSL.

In the driving method illustrated in FIG. 22, the potential of the terminal SPI and the potential of the terminal SP [p] become high potentials in Period T611 and Period T612 and become low potentials in Period T613 to Period T616. In Period T611 and Period T612, a digital signal "p−1" is input to the terminal DSL.

In the driving methods in FIG. 21 and FIG. 22, the potentials of the two terminals LIN can be high potentials in the same period, as in the driving method illustrated in FIG. 12 to FIG. 14. Thus, as described above, by keeping the transistor Tr11 included in the register circuit R in on state as described above, the signal supplying circuit SS electrically connected to the register circuit R can output signals to the terminal SL and the terminal RS.

Structure Example_3 of Shift Register Circuit

Figure 23:
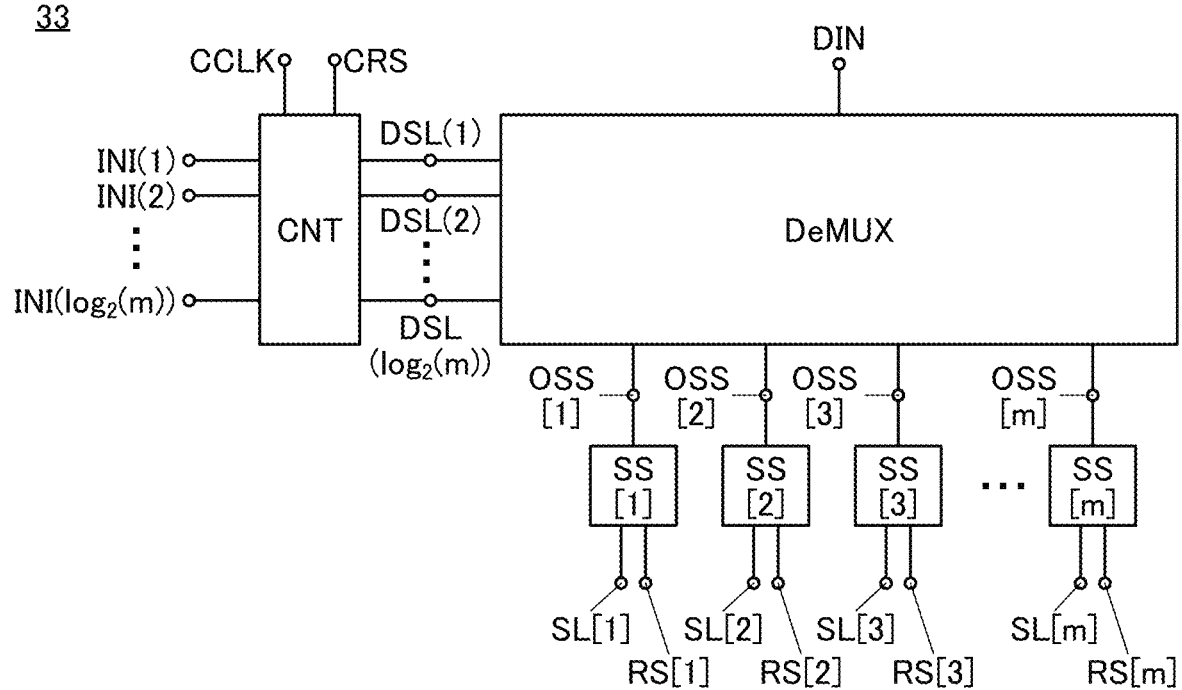
FIG. 23 is a block diagram illustrating a structure example of a row driver circuit.

FIG. 23 is a diagram illustrating a structure example of the row driver circuit 33. Specifically, FIG. 23 is a diagram illustrating a structure example of the shift register circuit included in the row driver circuit 33. The shift register circuit includes a counter circuit CNT, the demultiplexer circuit DeMUX, and the signal supply circuit SS. Here, m signal supply circuit SS can be provided for the shift register circuit illustrated in FIG. 23, for example.

Input terminals of the counter circuit CNT are electrically connected to a terminal CCLK, a terminal CRS, and a terminal INI(1) to a terminal INI($\log_2$(m)). Output terminals of the counter circuit CNT are electrically connected to a terminal DSL(1) to a terminal DSL($\log_2$ (m)). A clock signal can be input to the terminal CCLK. Thus, the terminal CCLK is a clock signal input terminal.

The terminal DSL(1) to the terminal DSL($\log_2$(m)) are electrically connected to the selection signal input terminals of the demultiplexer circuit DeMUX. In other words, the output terminals of the counter circuit CNT are each electrically connected to the demultiplexer circuit DeMUX through the terminal DSL.

The output terminals of the demultiplexer circuit DeMUX are electrically connected to the terminal OSS[1] to the terminal OSS[m]. As in the row driver circuit 33 illustrated in FIG. 3, for example, the OSS[1] to the terminal OSS[m] are electrically connected to the input terminals of the signal supply circuit SS[1] to the signal supply circuit SS[m], respectively. In other words, the output terminals of the demultiplexer circuit DeMUX are electrically connected to the input terminals of the signal supply circuit SS[1] to the signal supply circuit SS[m] through the terminal OSS[1] to the terminal OSS[m]. In addition, the terminal SL[1] to the terminal SL[m] and terminal RS[1] to the terminal RS[m] are electrically connected to the respective output terminals of the signal supply circuit SS[1] to the signal supply circuit SS[m].

The counter circuit CNT has a function of counting in accordance with a clock signal input to the terminal CCLK with a value expressed by a signal input to the terminal INT as an initial value. For example, the counter circuit CNT has a function of counting the number of rises of the clock signal input to the terminal CCLK. Note that the counter circuit CNT may have a function of counting the number of falls of the clock signal input to the terminal CCLK, or may have a function of counting the total number of rises and falls of the clock signal input to the terminal CCLK. When a signal is input to the terminal CRS, the result of counting by the counter circuit CNT can be reset. Thus, the signal which is input to the terminal CRS is a counting-reset signal.

The demultiplexer circuit DeMUX has a function of outputting a signal input to the terminal DIN, to any of the terminal OSS[1] to the terminal OSS[m] in accordance with signals input from the terminal DSL(1) to the terminal DSL($\log_2$(m)). As described above, the signal input to the terminal DSL can be a $\log_2$(m)-bit digital signal.

In the row driver circuit 33 having the structure illustrated in FIG. 23, first, the demultiplexer circuit DeMUX outputs the signal input to the terminal DIN to the terminal OSS corresponding to the value expressed by the digital signal input to the terminal INT. The value of the digital signal input to the terminal DSL is changed with counting by the counter circuit CNT. In response to this, the terminal OSS to which the demultiplexer circuit DeMUX outputs the signal is also changed.

The row driver circuit 33 illustrated in FIG. 23 can be driven by the methods illustrated in FIG. 6A and FIG. 6B. Below is described an example of a driving method of the row driver circuit 33 illustrated in FIG. 23 in the case where the counter circuit CNT counts the number of rises of the clock signal input to the terminal CCLK.

Figure 24:
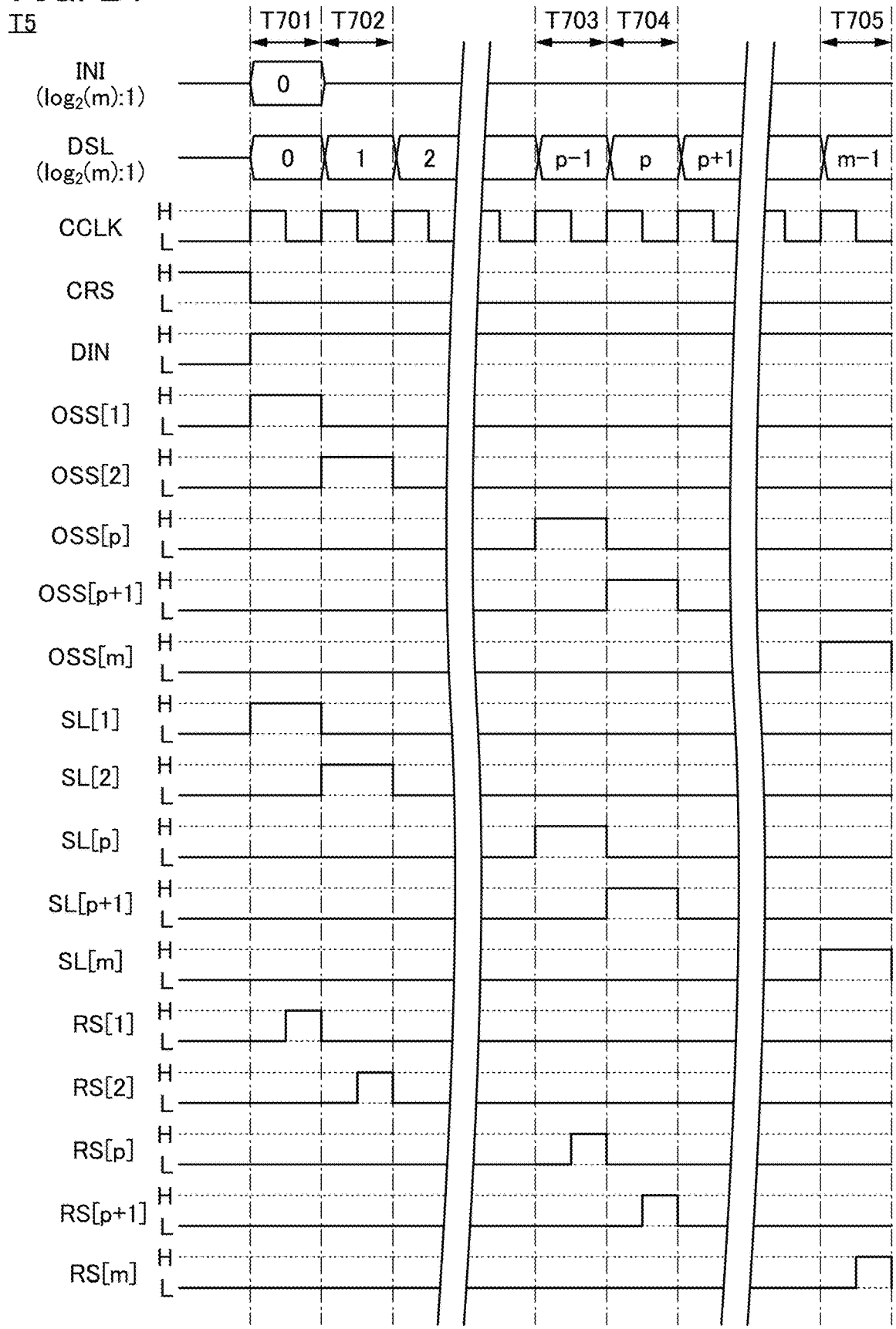
FIG. 24 is a timing chart illustrating an example of a driving method of a row driver circuit.

FIG. 24 is a timing chart illustrating the details of a driving method for driving the row driver circuit 33 illustrated in FIG. 23 in the mode in FIG. 6A. In FIG. 24, an example of a driving method of the row driver circuit 33 is illustrated with divided periods, Period T701 to Period T705. In Period T701 to Period T705, the number of rises and the number of falls of the clock signal input to the terminal CCLK are each one.

Prior to Period T701, the potential of the terminal CRS is a high potential and the potential of the terminal DIN is a low potential.

In Period T701, the potential of the terminal CRS is set to a low potential. In this state, when a digital signal "0" is input to the terminal INT, the digital signal "0" is input to the terminal DSL. In addition, a high-potential signal is input to the terminal DIN. Thus, the potential of the terminal OSS[1] becomes a high potential. In this manner, a selection signal is output from the terminal SL[1], and a reset signal is output from the terminal RS[1].

In Period T702, the counter circuit CNT performs counting, whereby the value of the digital signal input to the terminal DSL becomes "1". In addition, the potential of the terminal DIN is a high potential. Thus, the potential of the terminal OSS[2] becomes a high potential. In this manner, a selection signal is output from the terminal SL[2], and a reset signal is output from the terminal RS[2].

In Period T703, the value of the digital signal input to the terminal DSL becomes "p−1". In addition, the potential of the terminal DIN is a high potential. Thus, the potential of the terminal OSS[p] becomes a high potential. In this manner, a selection signal is output from the terminal SL[p], and a reset signal is output from the terminal RS[p].

In Period T704, the counter circuit CNT performs counting, whereby the value of the digital signal input to the terminal DSL becomes "p". In addition, the potential of the terminal DIN is a high potential. Thus, the potential of the terminal OSS[p+1] becomes a high potential. In this manner, a selection signal is output from the terminal SL[p+1] and a reset signal is output from the terminal RS[p+1].

In Period T705, the value of the digital signal input to the terminal DSL becomes "m−1". In addition, the potential of the terminal DIN is a high potential. Thus, the potential of the terminal OSS[m] becomes a high potential. In this manner, a selection signal is output from the terminal SL[m], and a reset signal is output from the terminal RS[m].

In the above manner, in the driving method illustrated in FIG. 24, the demultiplexer circuit DeMUX sequentially outputs signals to the terminal OSS[1] to the terminal OSS[m], in accordance with a clock signal input to the terminal CCLK. In response to the signal, selection signals are output to the terminal SL[1] to the terminal SL[m] sequentially, and reset signals are output to the terminal RS[1] to the terminal RS[m] sequentially. Thus, captured-image data can be sequentially read out from the pixels 31 in the first to m-th rows.

Figure 25:
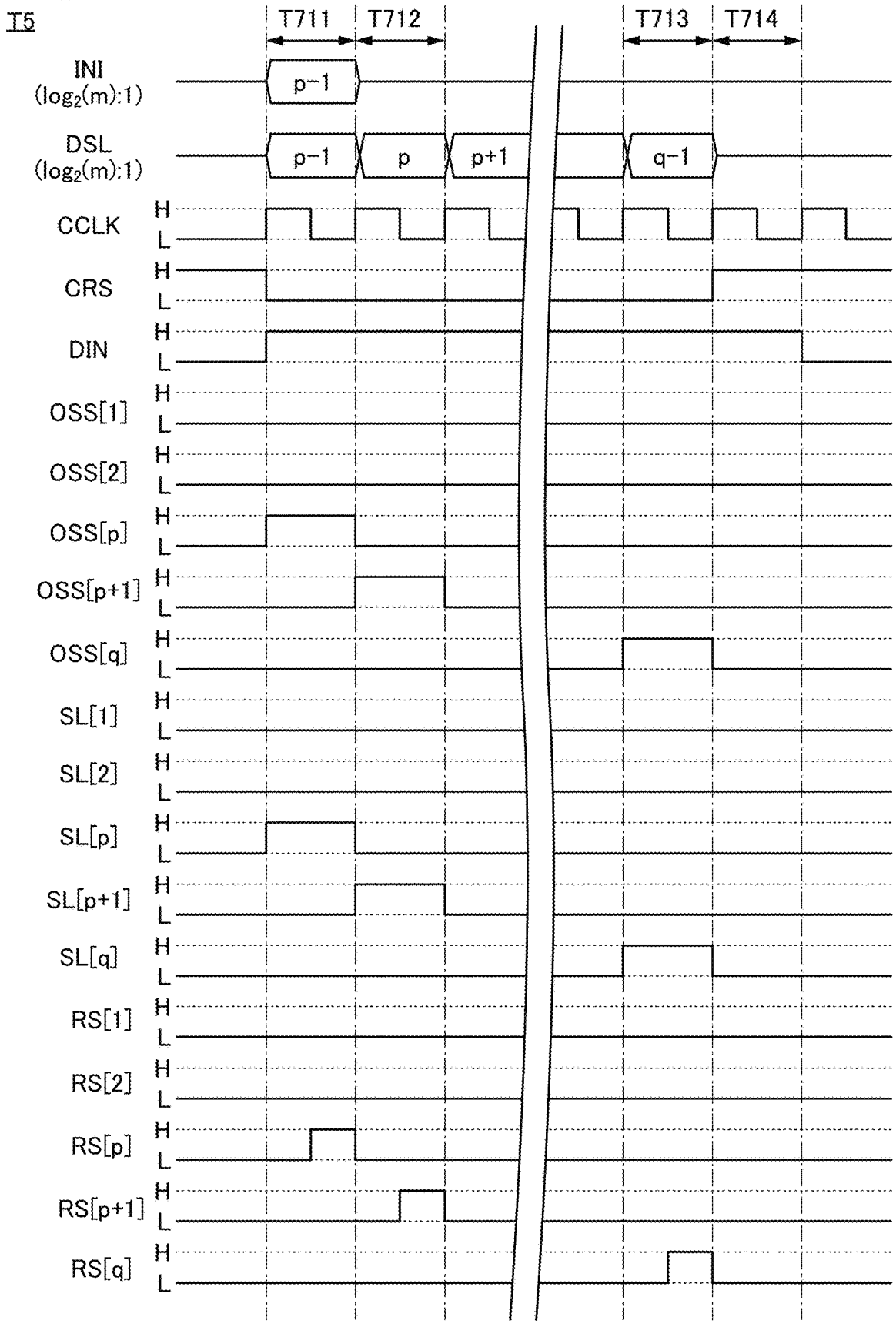
FIG. 25 is a timing chart illustrating an example of a driving method of a row driver circuit.

FIG. 25 is a timing chart illustrating details of the driving method illustrated in FIG. 6B, and illustrates an example of the driving method of the row driver circuit 33 with divided periods, Period T711 to Period T714. In the driving method illustrated in FIG. 25, sequential scanning is performed on from the pixels 31 in the p-th up to the pixels 31 in the q-th so that captured-image data is read out from the pixels 31 in the p-th to q-th rows. Here, in Period T711 to Period T714, the number of rises and the number of falls of the clock signal input to the terminal CCLK are each one.

Prior to Period T711, the potential of the terminal CRS is a high potential and the potential of the terminal DIN is a low potential.

In Period T711, the potential of the terminal CRS is set to a low potential. In this state, when a digital signal "p−1" is input to the terminal INI, the digital signal "p−1" is input to the terminal DSL. In addition, a high-potential signal is input to the terminal DIN. Thus, the potential of the terminal OSS[p] becomes a high potential. In this manner, a selection signal is output from the terminal SL[p] and a reset signal is output from the terminal RS[p].

In Period T712, the counter circuit CNT performs counting, whereby the value of the digital signal input to the terminal DSL becomes "p". In addition, the potential of the terminal DIN is a high potential. Thus, the potential of the terminal OSS[p+1] becomes a high potential. In this manner, a selection signal is output from the terminal SL[p+1] and a reset signal is output from the terminal RS[p+1].

In Period T713, the value of the digital signal input to the terminal DSL becomes "q−1". In addition, the potential of the terminal DIN is a high potential. Thus, the potential of the terminal OSS[q] becomes a high potential. In this manner, a selection signal is output from the terminal SL[q] and a reset signal is output from the terminal RS[q].

In Period T714, the potential of the terminal CRS is set to a high potential. Thus, the counting result obtained by the counter circuit CNT is reset, so that the demultiplexer circuit DeMUX stops outputting a high-potential signal to the terminal OSS. Furthermore, after Period T714, the potential of the terminal DIN is set to a low potential.

As described above, in the driving method illustrated in FIG. 25, the demultiplexer circuit DeMUX sequentially outputs signals to the terminal OSS[p] to the terminal OSS[q] in accordance with a clock signal input to the terminal CCLK. In response to the signal, selection signals are output to the terminal SL[p] to the terminal SL[q] sequentially, and reset signals are output to the terminal RS[p] to the terminal RS[q] sequentially. Thus, captured-image data can be sequentially read out from the pixels 31 in the p-th to q-th rows.

As described above, the operations illustrated in FIG. 24 and FIG. 25 are performed in the readout period by the row driver circuit 33, whereby the semiconductor device of one embodiment of the present invention can perform authentication such as fingerprint authentication. As described above, in the period shown in FIG. 6A, the readout period per row of the pixels 31 can be shortened compared with that in FIG. 6B. Accordingly, Period T703 in FIG. 24 can be shorter than Period T711 in FIG. 25. Therefore, the transmission rate of a scan signal in the case where the row driver circuit 33 is driven by the method illustrated in FIG. 24 can be higher than the transmission rate of a scan signal in the case where the row driver circuit 33 is driven by the method illustrated in FIG. 25.

Structure Example_4 of Shift Register Circuit

Figure 26:
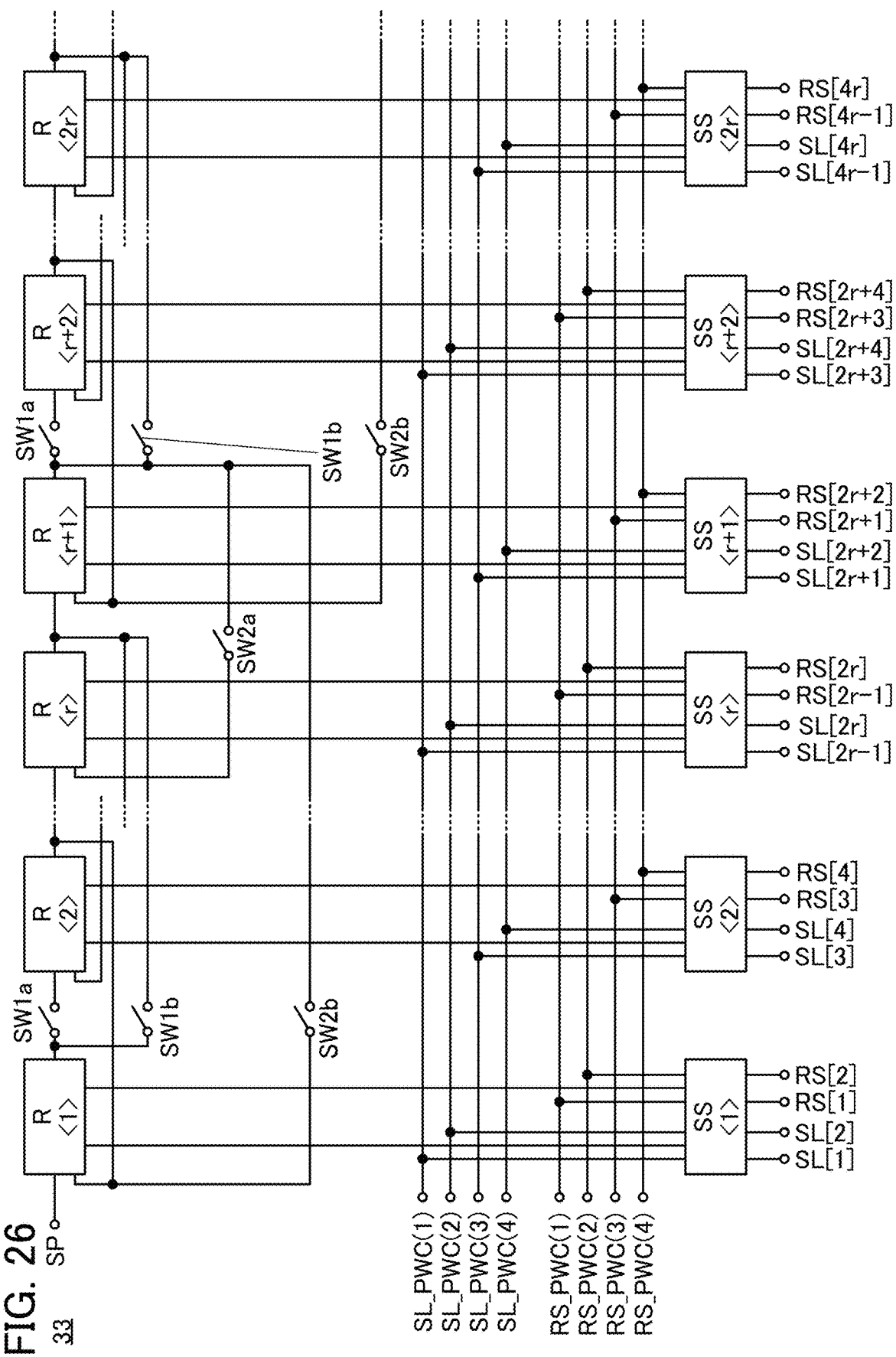
FIG. 26 is a block diagram illustrating a structure example of a row driver circuit.

FIG. 26 is a diagram illustrating a structure example of the row driver circuit 33. Specifically, FIG. 26 is a diagram illustrating a structure example of the shift register circuit included in the row driver circuit 33. The shift register circuit includes the register circuit R, a switch SW1a, a switch SW1b, and the signal supply circuit SS. Here, the switch SW1a and the switch SW1b can be transistors, for example. Each of the switch SW1a and the switch SW1b may include a plurality of transistors.

Here, the number of the register circuits R provided in the row driver circuit 33 illustrated in FIG. 26 can be smaller than m. For example, the number can be m/2. The following description is performed on the case where m/2 register circuits R are provided in the row driver circuit 33. Note that the number of the register circuits R provided in the row driver circuit 33 may be m/3, m/4, or smaller than m/4. For example, the following description can be referred to for such cases by replacing the number as necessary. For example, as many signal supply circuits SS as the register circuits R can be provided in the row diver circuit 33.

In this specification, for example, m/2 register circuits R are referred to as a register circuit R<1> to a register circuit R<m/2>, and m/2 signal supply circuits SS are referred to as a signal supply circuit SS<1> to a signal supply circuit SS<m/2> so as to be distinguished from each other. In FIG. 26, the register circuit R<1>, the register circuit R<2>, the register circuit R<r>, the register circuit R<r+1>, the register circuit R<r+2>, the register circuit <2r>, the signal supply circuit SS<1>, the signal supply circuit SS<2>, the signal supply circuit SS<r>, the signal supply circuit SS<r+1>, the signal supply circuit SS<r+2>, and the signal supply circuit SS<2r> are illustrated (r represents an integer greater than or equal to 2 and less than or equal to m/2).

The terminal SP is electrically connected to an input terminal of the register circuit R<1>. In addition, an output terminal of the register circuit R<1> is electrically connected to one terminal of the switch SW1a, and the other terminal of the switch SW is electrically connected to an input terminal of the register circuit R<2>.

The register circuit R<2> to the register circuit R<r+1> are connected to each other in series. Specifically, for example, an output terminal of the register circuit R<2> is electrically connected to an input terminal of the register circuit R<3>, an output terminal of the register circuit R<3> is electrically connected to an input terminal of the register circuit R<4>, and an output terminal of the register circuit R<r> is electrically connected to an input terminal of the register circuit R<r+1>.

An output terminal of the register circuit R<r+1> is electrically connected to one terminal of the switch SW1a, and the other terminal of the switch SW is electrically connected to an input terminal of the register circuit R<r+2>. In addition, the register circuit R<r+2> to the register circuit R<2r+1> are connected to each other in series.

As described above, for example, the register circuit R<1> to the register circuit R<m/2> can be connected in series via the switch SW1a every r register circuits R.

In addition, the output terminal of the register circuit R<1> that is electrically connected to one terminal of the switch SW1a is also electrically connected to one terminal of the switch SW1b. The other terminal of the switch SW1b is electrically connected to the input terminal of the input terminals of the register circuit R<r+1> which is electrically connected to the output terminal of the register circuit R<r>. Similarly, the output terminal of the register circuit R<r+1> that is electrically connected to the one terminal of the switch SW1a is also electrically connected to the other terminal of the switch SW1b. The other terminal of the switch SW1b is electrically connected to the input terminal of the input terminals of the register circuit R<2r+1> which is electrically connected to the output terminal of the register circuit R<2r>.

As described above, it can be said that, for example, the register circuit R<1>, the register circuit R<r+1>, and the register circuit R<2r+1> are connected to each other in series via the switch SW1b. In this manner, for example, the register circuit R<1> to the register circuit R<m/2−r+1> can be connected in series via the switch SW1b every r register circuits R.

The output terminal of the register circuit R is electrically connected to the input terminal of the signal supply circuit SS. In addition, two terminals SL_PWC of a terminal SL_PWC(1) to a terminal SL_PWC(4) are electrically connected to input terminals of the signal supply circuit SS. Moreover, two terminals RS_PWC of a terminal RS_PWC(1) to a terminal RS_PWC(4) are electrically connected to input terminals of the signal supply circuit SS. In the example illustrated in FIG. 26, the terminal SL_PWC(1), the terminal SL_PWC(2), the terminal RS_PWC(1), and the terminal RS_PWC(2) are electrically connected to the signal supply circuit SS<1>, the signal supply circuit SS<r>, and the signal supply circuit SS<r+2>. In addition, the terminal SL_PWC(3), the terminal SL_PWC(4), the terminal RS_PWC(3), and the terminal RS_PWC(4) are electrically connected to the signal supply circuit SS<2>, the signal supply circuit SS<r+1>, and the signal supply circuit SS<2r>. Note that the numbers of the terminal SL_PWC and terminal RS_PWC included in the row driver circuit 33 are not limited to 4, and the numbers of the terminal SL_PWC and the terminal RS_PWC electrically connected to one signal supply circuit SS are not limited to two.

Note that the terminal SL_PWC and the terminal RS_PWC can also be electrically connected to the input terminals of the signal supply circuit SS illustrated in FIG. 3, FIG. 10, FIG. FIG. 20, and FIG. 23.

The following description is made on the case where r is an odd number; however, the following description can be applied to the case where r is an even number by appropriately changing the numbers of the terminal SL_PWC and the terminal RS_PWC electrically connected to the signal supply circuit SS. Note that in the case where, for example, m/3 registers circuits R and m/3 signal supply circuits SS are provided in the shift register circuit included in the row driver circuit 33, three terminals SL_PWC and three terminals RS_PWC can be electrically connected to the input terminal of one signal supply circuit SS.

The terminal SL and the terminal RS are electrically connected to output terminals of the signal supply circuit SS. Here, as many terminals SL as the terminals SL_PWC electrically connected to the input terminals of the signal supply circuit SS can be electrically connected to the output terminals of the signal supply circuit SS. In addition, as many terminals RS as the terminals RS_PWC electrically connected to the input terminals of the signal supply circuit SS can be electrically connected to the output terminals of the signal supply circuit SS. In FIG. 26, the output terminals of one signal supply circuit SS is electrically connected to two terminals SL and two terminals RS. Specifically, for example, the terminal SL [1], the terminal SL [2], the terminal RS[1], and the terminal RS[2] can be electrically connected to the output terminals of the signal supply circuit SS<1>, and the terminal SL[3], the terminal SL[4], the terminal RS[3], and the terminal RS[4] can be electrically connected to the output terminals of the signal supply circuit SS<2>. In addition, a terminal SL[2r−1], a terminal SL[2r], a terminal RS[2r−1], and a terminal RS[2r] can be electrically connected to the output terminals of the signal supply circuit SS<r>, and a terminal SL[2r+1], a terminal SL[2r+2], a terminal RS[2r+1], and a terminal RS[2r+2] can be electrically connected to the output terminals of the register circuit R<r+1>.

A plurality of terminals SL and a plurality of terminals RS are electrically connected to one signal supply circuit SS, so that the number of the register circuit R provided in the row driver circuit 33 can be reduced. Thus, the area occupied by the row driver circuit 33 can be reduced, so that the semiconductor device 10 can be downsized.

Although details are described later, the signal supply circuit SS can output a signal corresponding to a signal input to the terminal SL_PWC from the terminal SL and can output a signal corresponding to a signal input to the terminal RS_PWC from the terminal RS.

A start pulse signal is input to the terminal SP. Thus, the terminal SP is a start pulse signal input terminal. In the case where the start pulse signal is input to the terminal SP, the switch SW1a is in an on state and the switch SW1b is in an off state, the register circuit R<1> to the register circuit R<m/2> sequentially output signals. That is, all the register circuits R can output signals. Thus, in the case where the switch SW1a is in an on state and the switch SW1b is in an off state, for example, the register circuit R<2> can be referred to as a register circuit R in the stage subsequent to the register circuit R<1>.

In the case where the start pulse signal is input to the terminal SP, the switch SW1a is in an off state, and the switch SW1b is in an on state, the register circuit R<r+1> outputs a signal after the register circuit R<1> outputs a signal. That is, signals are not output from the register circuit R<2> to the register circuit R<r>. After the register circuit R<r+1> outputs a signal, the register circuit R<2r+1> outputs a signal. In this manner, signals can be sequentially output from register circuits up to the register circuit R<m/2−r+1>. In other words, one register circuit R of r register circuits R can output a signal. Thus, in the case where the switch SW1a is in an off state and the switch SW1b is in an on state, the register circuit R<r+1> can be referred to as a register circuit R in the stage subsequent to the register circuit R<1>.

The row driver circuit 33 having the structure illustrated in FIG. 26 can be driven by the first mode and the second mode. Specifically, in the first mode, the switch SW1a is in an on state and the switch SW1b is in an off state. Thus, for example, signals can be output from all of the terminal SL[1] to the terminal SL[m] and all of the terminal RS[1] to the terminal RS[m]. In the second mode, the switch SW1a is in an off state and the switch SW1b is an on state. Thus, signals can be output from some of the terminals SL and some of the terminals RS, specifically, m/r terminals SL and m/r terminals RS.

As illustrated in FIG. 2A and FIG. 2B1, the terminal SL and the terminal RS are electrically connected to the pixels 31. Thus, in the first mode where signals are output from all the terminals SL and all the terminals RS, captured-image data can be read out from all the pixels 31. Accordingly, captured-image data read out from the pixels 31 can have high accuracy.

The semiconductor device 10 including the row driver circuit 33 having the structure illustrated in FIG. 26 can perform authentication such as fingerprint authentication as illustrated in FIG. 1B. In the case of performing authentication, the row driver circuit 33 having the structure illustrated in FIG. 26 is preferably driven in the first mode for higher accuracy of authentication.

In addition, the semiconductor device 10 including the row driver circuit 33 having the structure illustrated in FIG. 26 can detect the position of a detection object such as a finger that touches or approaches the pixel portion 30 in FIG. 2A. In other words, the semiconductor device including the row driver circuit 33 having the structure illustrated in FIG. 26 has a function of a touch sensor or a near touch sensor. Here, in the second mode where signals are output from some of the terminals SL and some of the terminals RS, the number of the register circuits R to be driven can be reduced as compared with that in the first mode. Thus, the row driver circuit 33 can be driven at high speed, and the imaging unit 15 can perform imaging at a high frame frequency. Therefore, in the case where the semiconductor device 10 including the row driver circuit 33 having the structure illustrated in FIG. 26 functions as a touch sensor or a near source sensor, the semiconductor device 10 is preferably driven in the second mode so that the motion of the detection object can be accurately detected.

As described above, the semiconductor device 10 including the row driver circuit 33 having the structure illustrated in FIG. 26 can increase the accuracy of authentication and can detect the motion of a detection object such as a finger with high accuracy, for example.

Here, as described above, a signal that is output from the register circuit R and is supplied to the register circuit R in the subsequent stage is also preferably supplied to the register circuit R in the previous stage. This can prevent malfunction of the register circuit R in the previous stage. For example, in the case where the switch SW1a is in an on state and the switch SW1b is in an off state, it is possible to prevent output of signals from the terminal SL[1], the terminal SL[2], the terminal RS[1], and the terminal RS[2] electrically connected to register circuit R<1> after signals are output from the terminal SL[3], the terminal SL[4], the terminal RS[3], and the terminal RS[4] electrically connected to the register circuit R<2>. In addition, for example, in the case where the switch SW1a is in an off state and the switch SW1b is in an on state, it is possible to prevent output of signals from the terminal SL[1], the terminal SL [2], the terminal RS[1], and the terminal RS[2] electrically connected to register circuit R<1> after signals are output from the terminal SL[2r+1], the terminal SL[2r+2], the terminal RS[2r+1], and the terminal RS[2r+2] electrically connected to the register circuit R<r+1>.

Which register circuit R can be the register circuit R in the previous stage depends on the driving mode of the semiconductor device 10. For example, in the case where the semiconductor device 10 is driven in the first mode, the register circuit R in the previous stage of the register circuit R<r+1> can be the register circuit R<r>, and in the case where the semiconductor device is driven in the second mode, the register circuit R can be the register circuit R<1>. Thus, the switch SW2a and the switch SW2b are provided in the shift register circuit included in the row driver circuit 33. The switch SW2a and the switch SW2b can be transistors, for example. Each of the switch SW2a, and switch SW2b may include a plurality of transistors.

For example, the output terminal of the register circuit R<r+1> is electrically connected to the input terminal of the register circuit R<r> via the switch SW2a. In addition, the output terminal of the register circuit R<r+1> is electrically connected to the input terminal of the register circuit R<1> via the switch SW2b. In the case where the semiconductor device 10 is driven in the first mode, the switch SW2a is in an on state and the switch SW2b is in an off state. In the case where the semiconductor device 10 is driven in the second mode, the switch SW2a is in an off state and the switch SW2b is in an on state. Thus, in the case where the semiconductor device is driven in the first mode, for example, a signal that is output from the register circuit R<r+1> and is supplied to the register circuit R<r+2> can also be supplied to the register circuit R<r>. In the case where the semiconductor device 10 is driven in the second mode, for example, a signal that is output from the register circuit R<r+1> and is supplied to the register circuit R<2r+1> can also be supplied to the register circuit R<1>.

Although not illustrated in FIG. 26, an output terminal of the register circuit R<2r+1> and an input terminal of the register circuit R<2r> can be electrically connected to each other via the switch SW2a, for example. In addition, an output terminal of the register circuit R<2r+1> and an input terminal of the register circuit R<r+1> can be electrically connected to each other via the switch SW2b. Furthermore, for example, an output terminal of the register circuit R<m/2−r+1> and an input terminal of the register circuit R<m/2−r> are electrically connected to each other via the switch SW2a, and an output terminal of the register circuit R<m/2−r+1> and an input terminal of the register circuit R<m/2−2r+1> are electrically connected to each other via the switch SW2b.

Figure 27:
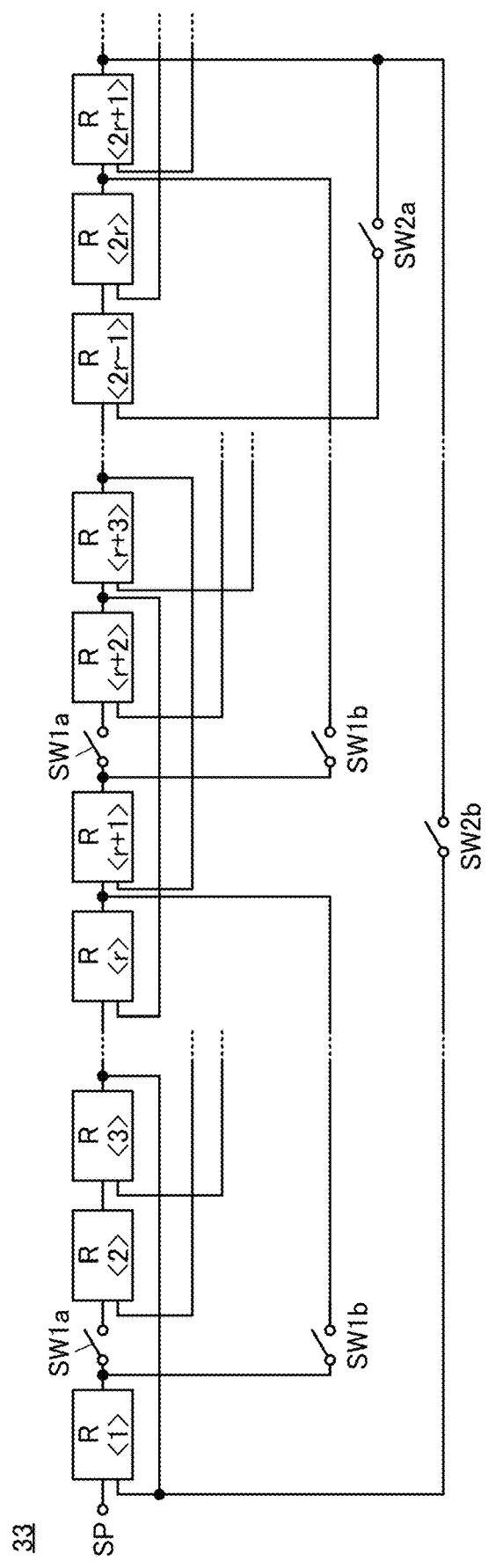
FIG. 27 is a block diagram illustrating a structure example of a row driver circuit.

Although FIG. 26 illustrates a structure in which a signal that is output from the register circuit R and is supplied to the register circuit R in the subsequent stage is also to the register circuit R in the previous stage, one embodiment of the present invention is not limited to the structure. For example, a signal that is output from the register circuit R and is supplied to the register circuit R in the subsequent stage may be supplied to the register circuit R in the stage before the previous stage, instead of the register circuit R in the previous stage. FIG. 27 illustrates a structure example of the row driver circuit 33 in the case where a signal that is output from the register circuit R and is supplied to the register circuit R in the stage before the previous stage, instead of the register circuit R in the subsequent stage. Note that in FIG. 27, the terminal SL_PWC, the terminal RS_PWC, the terminal SL, and the terminal RS are not illustrated.

In the row driver circuit 33 illustrated in FIG. 27, when the semiconductor device 10 is driven in the first mode, a signal output from the register circuit R<3> can be supplied to the register circuit R<1>. In addition, when the semiconductor device 10 is driven in the second mode, a signal output from the register circuit R<2r+1> can be supplied to the register circuit R<1>. Note that a signal that is output from the register circuit R and is to be supplied to the register circuit R in the subsequent stage may be supplied to the register circuit R in the three or more stages before. The same applies to the row driver circuit 33 having another structure.

Figure 28A:
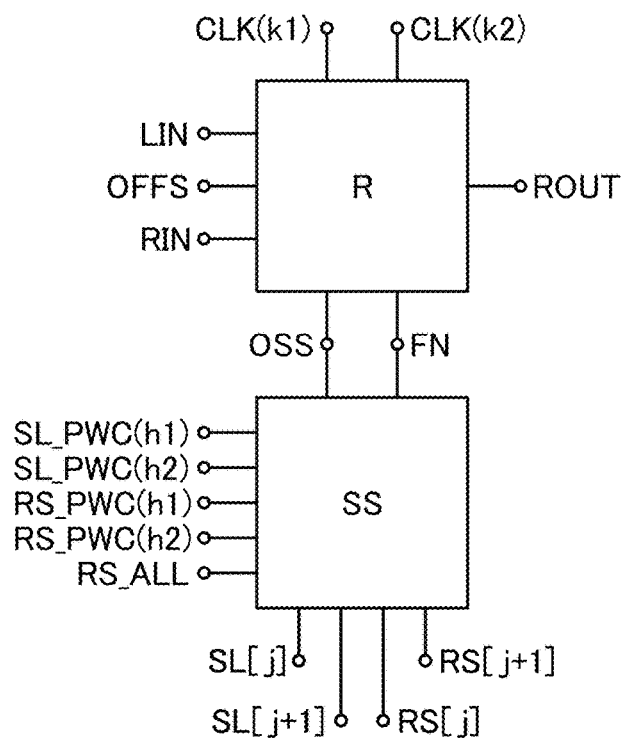
FIG. 28A is a block diagram illustrating an example of terminals electrically connected to a register circuit and a signal supply circuit.

FIG. 28A illustrates an example of terminals electrically connected to the register circuit R and terminals electrically connected to the signal supply circuit SS. The terminal CLK(k1), the terminal CLK(k2), the terminal LIN, the terminal OFFS, and the terminal RIN are electrically connected to the input terminals of the register circuit R. The terminal ROUT, the terminal OSS, and the terminal FN are electrically connected to output terminals of the register circuit R. The terminal OSS, the terminal FN, a terminal SL_PWC(h1), a terminal SL_PWC(h2), a terminal RS_PWC(h1), a terminal RS_PWC(h2), and a terminal RS_ALL are electrically connected to the input terminals of the signal supply circuit SS. A terminal SL[j], a terminal SL[j+1], a terminal RS[j], and a terminal RS[j+1] (j is an integer greater than or equal to 1 and less than or equal to m−1) are electrically connected to output terminals of the signal supply circuit SS. The register circuit R and the signal supply circuit SS are electrically connected to each other via the terminal OSS and via the terminal FN.

The terminal SL_PWC(h1) and the terminal SL_PWC (h2) illustrated in FIG. 28A can be any of the terminal SL_PWC(1) to the terminal SL_PWC(4), for example, and the terminal RS_PWC(h1) and the terminal RS_PWC(h2) can be any of the terminal RS_PWC(1) to the terminal RS_PWC(4), for example. For example, in the register circuit R<1>, the terminal SL_PWC(h1), the terminal SL_PWC(h2), the terminal RS_PWC(h1), and the terminal RS_PWC(h2) can be a terminal SL_PWC(1), a terminal SL_PWC(2), a terminal RS_PWC(1), and a terminal RS_PWC(2), respectively. In addition, in the register circuit R<2>, the terminal SL_PWC(h1), the terminal SL_PWC (h2), the terminal RS_PWC(h1), and the terminal RS_PWC (h2) can be a terminal SL_PWC(3), a terminal SL_PWC(4), a terminal RS_PWC(3), and a terminal RS_PWC(4), respectively.

As described above, a clock signal can be input to the terminal CLK(k1) and the terminal CLK(k2). Furthermore, by inputting a signal to the terminal RS_ALL, for example, reset signals can be output from all the terminals RS. Thus, electric charges stored in the capacitor 56, the capacitor 57, and the like included in the pixel 31 illustrated in FIG. 2B1 can be reset. Thus, in Period T1 illustrated in FIG. 2B2, for example, the reset operation can be performed by inputting a signal to the terminal RS_ALL.

Figure 28B:
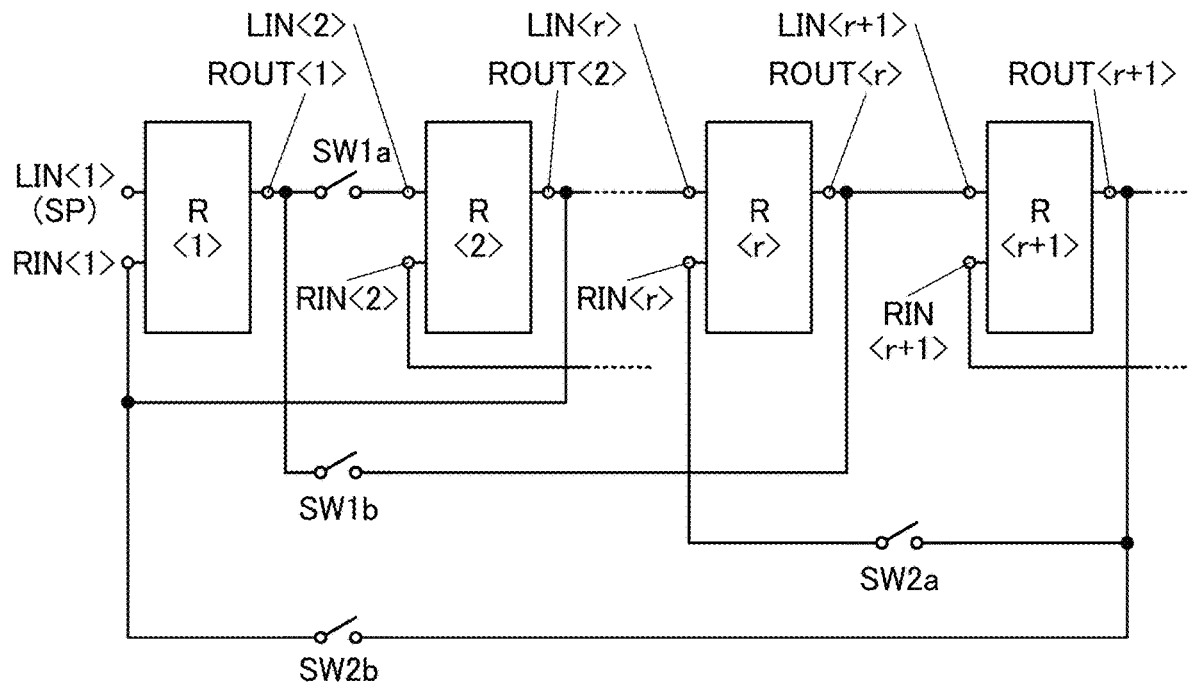
FIG. 28B is a diagram illustrating connections in the register circuit.

FIG. 28B illustrates the terminal LIN, the terminal RIN, and the terminal ROUT, and the terminal LIN and the terminal RIN are electrically connected to input terminals of the terminals that are electrically connected to the register circuit R<1>, the register circuit R<2>, the register circuit <r>, and the register circuit R<r+1> and the terminal ROUT is electrically connected to an output terminal of the above terminals. For example, in FIG. 28B, the terminal LIN, the terminal RIN, and the terminal ROUT electrically connected to the register circuit R<1> are denoted by a terminal LIN<1>, a terminal RIN<1>, and a terminal ROUT<1>, respectively.

A start pulse signal is input to the terminal LIN<1>. Thus, the terminal LIN<1> is a terminal SP.

The terminal ROUT<1> is electrically connected to a terminal LIN<2> via the switch SW1a and to a terminal LIN<r+1> via the switch SW1b. A terminal ROUT<2> is electrically connected to a terminal LIN<3> (not illustrated) and the terminal RIN<1>. A terminal ROUT<r> is electrically connected to a terminal LIN<r+1>. Although not illustrated, a terminal ROUT<r+1> is electrically connected to a terminal LIN<r+2> via the switch SW1a and to a terminal LIN<2r+1> via the switch SW1b. A terminal ROUT<r+1> is electrically connected to a terminal RIN<r> via the switch SW2a and to the terminal RIN<1> via the switch SW2b.

Figure 29A:
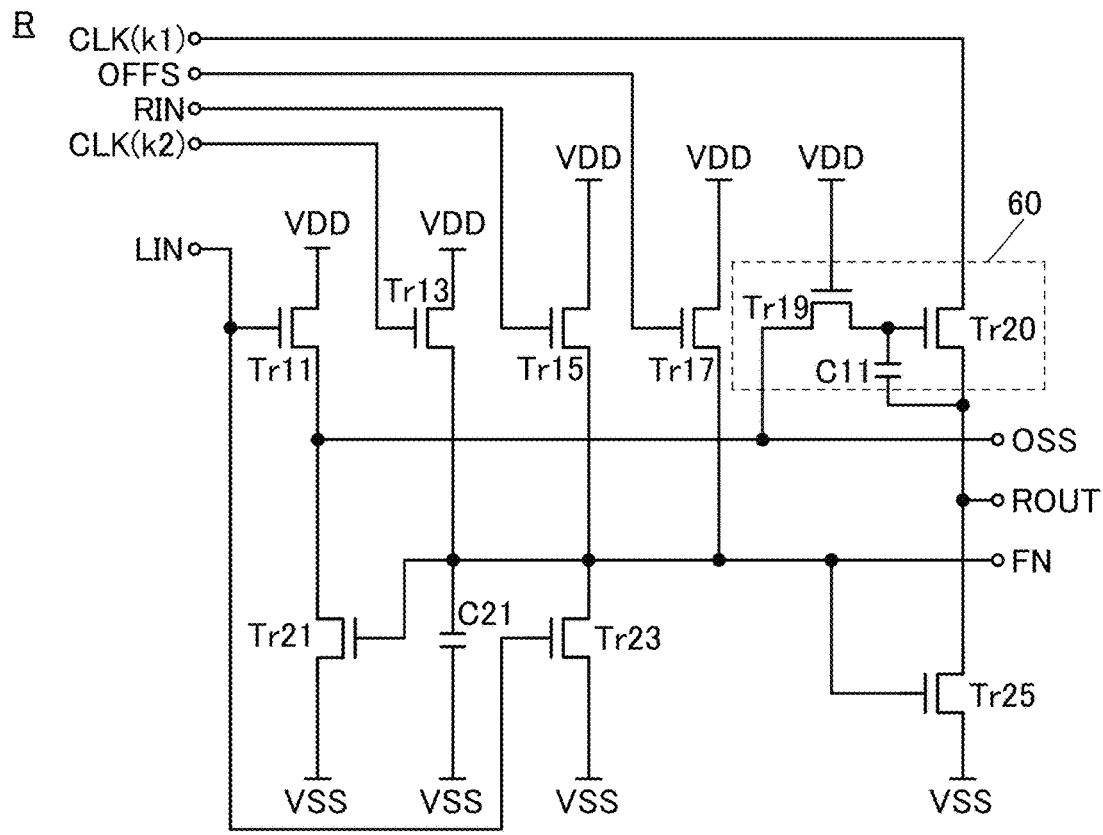
FIG. 29A and FIG. 29B are circuit diagrams illustrating a structure example of a register circuit.

FIG. 29A is a circuit diagram illustrating a structure example of the register circuit R. In the register circuit R illustrated in FIG. 29A, the terminal FN is electrically connected to one of the source and the drain of the transistor Tr13, one of the source and the drain of the transistor Tr15, one of the source and the drain of the transistor Tr17, the gate of the transistor Tr21, one of the source and the drain of the transistor Tr23, the gate of the transistor Tr25, and one electrode of the capacitor C21.

Figure 29B:
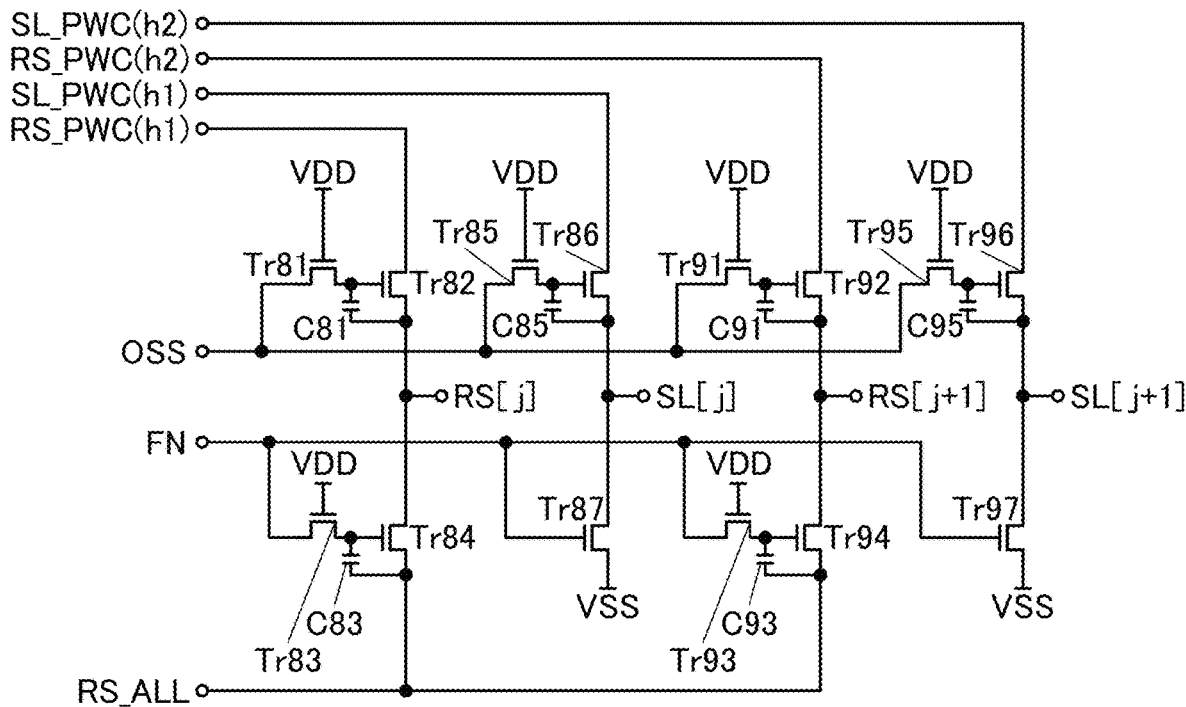

FIG. 29B is a circuit diagram illustrating a structure example of the signal supply circuit SS. The signal supply circuit SS includes a transistor Tr81, a transistor Tr82, a transistor Tr83, a transistor Tr84, a transistor Tr85, a transistor Tr86, a transistor Tr87, a transistor Tr91, a transistor Tr92, a transistor Tr93, a transistor Tr94, a transistor Tr95, a transistor Tr96, a transistor Tr97, a capacitor C81, a capacitor C83, a capacitor C85, a capacitor C91, a capacitor C93, and a capacitor C95.

In the signal supply circuit SS having the structure illustrated in FIG. 29B, the terminal OSS is electrically connected to one of a source and a drain of the transistor Tr81, one of a source and a drain of the transistor Tr85, one of a source and a drain of the transistor Tr91, and one of a source and a drain of the transistor Tr95. The terminal FN is electrically connected to one of a source and a drain of the transistor Tr83, a gate of the transistor Tr87, one of a source and a drain of the transistor Tr93, and a gate of the transistor Tr97.

The terminal SL_PWC(h1) is electrically connected to one of a source and a drain of the transistor Tr86. The terminal SL_PWC(h2) is electrically connected to one of a source and a drain of the transistor Tr96. The terminal RS_PWC(h1) is electrically connected to one of a source and a drain of the transistor Tr82. The terminal RS_PWC (h2) is electrically connected to one of a source and a drain of the transistor Tr92.

The terminal SL[j] is electrically connected to the other of the source and the drain of the transistor Tr86, one of a source and a drain of the transistor Tr87, and one electrode of the capacitor C85. The terminal SLU+11 is electrically connected to the other of the source and the drain of the transistor Tr96, one of a source and a drain of the transistor Tr97, and one electrode of the capacitor C95. The terminal RS[j] is electrically connected to the other of the source and the drain of the transistor Tr82, the other of a source and a drain of the transistor Tr84, and one electrode of the capacitor C81. The terminal RS[j+1] is electrically connected to the other of the source and the drain of the transistor Tr92, the other of a source and a drain of the transistor Tr94, and one electrode of the capacitor C91.

The other of the source and the drain of the transistor Tr81, a gate of the transistor Tr82, and the other electrode of the capacitor C81 are electrically connected to each other. The other of the source and the drain of the transistor Tr83, a gate of the transistor Tr84, and the other electrode of the capacitor C83 are electrically connected to each other. The other of the source and the drain of the transistor Tr85, a gate of the transistor Tr86, and the other electrode of the capacitor C85 are electrically connected to each other. The other of the source and the drain of the transistor Tr91, a gate of the transistor Tr92, and the other electrode of the capacitor C91 are electrically connected to each other. The other of the source and the drain of the transistor Tr93, a gate of the transistor Tr94, and the other electrode of the capacitor C93 are electrically connected to each other. The other of the source and the drain of the transistor Tr95, a gate of the transistor Tr96, and the other electrode of the capacitor C95 are electrically connected to each other. The transistor Tr81, the transistor Tr83, the transistor Tr85, the transistor Tr91, the transistor Tr93, or the transistor Tr95 is provided in the signal supply circuit SS, whereby the circuit provided in the signal supply circuit SS can be a bootstrap circuit. Note that in the signal supply circuit SS, the transistor Tr81, the transistor Tr83, the transistor Tr85, the transistor Tr91, the transistor Tr93, or the transistor Tr95 may be omitted. In this case, in the structure of the signal supply circuit SS, the capacitor C81, the capacitor C83, the capacitor C85, the capacitor C91, the capacitor C93, or the capacitor C95 may be omitted.

In description below, the transistor Tr81 to the transistor Tr87, and the transistor Tr91 to the transistor Tr97 are n-channel transistors; however, the description below can be referred to for a case where a p-channel transistor is included, by reversing the high/low relationship between potentials as appropriate, for example.

High potentials can be supplied to a gate of the transistor Tr81, a gate of the transistor Tr83, a gate of the transistor Tr85, a gate of the transistor Tr91, a gate of the transistor Tr93, and a gate of the transistor Tr95. In addition, low potentials can be supplied to the other of the source and the drain of the transistor Tr87 and the other of the source and the drain of the transistor Tr97.

When a high-potential signal is input to the terminal OSS, the transistor Tr82, the transistor Tr86, the transistor Tr92, and the transistor Tr96 are turned on. Accordingly, when the potential of the terminal FN is a low potential, the potential of the terminal RS[j] can be equal to the potential of the terminal RS_PWC(h1), the potential of the terminal SL [j] can be equal to the potential of the terminal SL_PWC(h1), the potential of the terminal RS[/+1] can be equal to the potential of the terminal RS_PWC(h2), and the potential of the terminal SL[j+1] can be equal to the potential of the terminal SL_PWC(h2). In other words, the signal supply circuit SS can output a signal input to the terminal RS_PWC (h1) to the terminal RS[j], output a signal input to the terminal SL_PWC(h1) to the terminal SL[j], output a signal input to the terminal RS_PWC(h2) to the terminal RS[j+1], and output a signal input to the terminal SL_PWC(h2) to the terminal SL [1+1].

When a high-potential signal is input to the terminal FN, the transistor Tr84, the transistor Tr87, the transistor Tr94, and the transistor Tr97 are turned on. Thus, when the potential of the terminal OSS is a low potential, the potential of the terminal RS can be equal to the potential of the terminal RS_ALL. That is, the signal supply circuit SS can output a signal input to the terminal RS_ALL to the terminal RS.

Note that the structure illustrated in FIG. 29B can be applied to the input terminals of the signal supply circuits SS illustrated in FIG. 3, FIG. 10, FIG. 15, FIG. 20, and FIG. 23.

Figure 30:
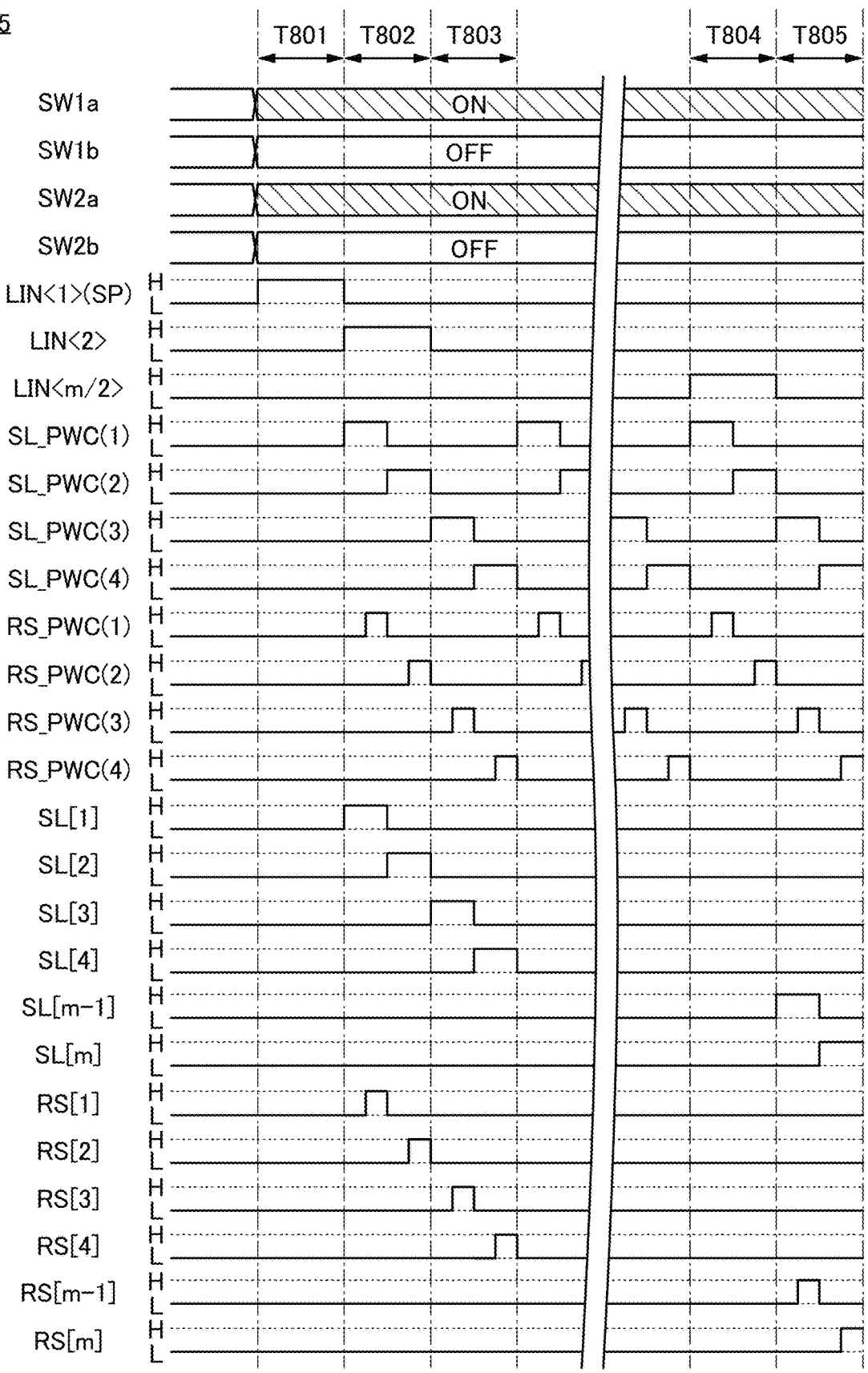
FIG. 30 is a timing chart illustrating an example of a driving method of a row driver circuit.
Figure 31:
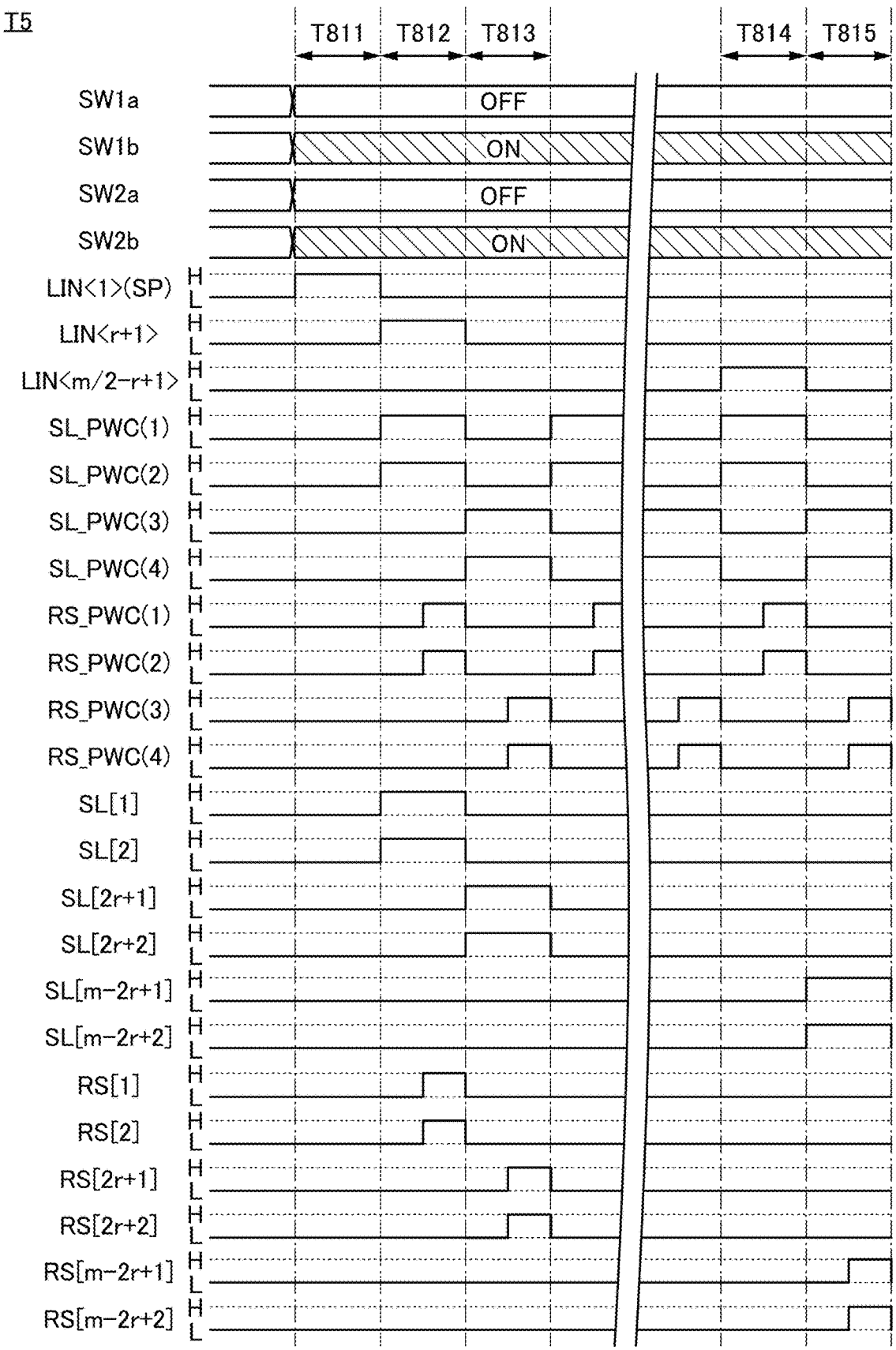
FIG. 31 is a timing chart illustrating an example of a driving method of a row driver circuit.

FIG. 30 and FIG. 31 are timing charts illustrating examples of driving methods of the row driver circuit 33 in FIG. 26. Specifically, FIG. 30 and FIG. 31 each illustrates an example of a driving method of the shift register circuit included in the row driver circuit 33 in Period T5 as the readout period illustrated in FIG. 2B2. FIG. 30 illustrates an example of a driving method in the first mode, and illustrates the example of the driving method of the row driver circuit 33 with divided periods, Period T801 to Period T805. FIG. 31 illustrates an example of a driving method in the second mode, and illustrates the example of the driving method of the row driver circuit 33 with divided periods, Period T811 to Period T815.

First, the example of the driving method of the row driver circuit 33 in the first mode is described. As illustrated in FIG. 30, in Period T801 to Period T805, the switch SW1a and the switch SW2a are in on states and the switch SW1b and the switch SW2b are in off states. Thus, the semiconductor device 10 including the row driver circuit 33 having the structure illustrated in FIG. 26 is driven in the first mode.

First, in Period T801, a high-potential signal is input as a start pulse signal to the terminal LIN<1>. Thus, in the next period, Period T802, a signal input to the terminal SL_PWC (1) can be output from the terminal SL[1], a signal input to the terminal SL_PWC(2) can be output from the terminal SL[2], a signal input to the terminal RS_PWC(1) can be output from the terminal RS[1], and a signal input to the terminal RS_PWC(2) can be output from the terminal RS[2]. In Period T802, a selection signal is input to the terminal SL_PWC(1), a reset signal is input to the terminal RS_PWC(1), then a selection signal is input to the terminal SL_PWC(2), and a reset signal is input to the terminal RS_PWC(2). Thus, after the selection signal is output from the terminal SL[1], the reset signal is output from the terminal RS[1], then the selection signal is output from the terminal SL[2] and the reset signal is output from the terminal RS[2].

In Period T802, a high-potential signal is output from the terminal ROUT<1>. As described above, since the switch SW1a is in an on state and the switch SW1b is in an off state, the high-potential signal output from the terminal ROUT<1> is input to the terminal LIN<2>. When the high-potential signal is input to the terminal LIN<2>, a signal input to the terminal SL_PWC(3) can be output from the terminal SL[3], a signal input to the terminal SL_PWC (4) can be output from the terminal SL[4], a signal input to the terminal RS_PWC(3) can be output from the terminal RS[3], and a signal input to the terminal RS_PWC(4) can be output from the terminal RS[4] in the next period, Period T803.

In Period T803, a selection signal is input to the terminal SL_PWC(3) and a reset signal is input to the terminal RS_PWC(3), then a selection signal is input to the terminal SL_PWC(4) and a reset signal is input to a terminal RS_PWC(4). Thus, the selection signal is output from the terminal SL[3], the reset signal is output from the terminal RS[3], then, the selection signal is output from the terminal SL[4], and the reset signal is output from the terminal RS[4].

In Period T803, a high-potential signal is output from the terminal ROUT<2>. The signal is supplied to the terminal LIN<3> and the terminal RIN<1>.

In Period T804, a high-potential signal is input to the terminal LIN<m/2>. Thus, in the next period, Period T805, a signal input to the terminal SL_PWC(3) can be output from the terminal SL[m−1], a signal input to the terminal SL_PWC(4) can be output from the terminal SL[m], a signal input to the terminal RS_PWC(3) can be output from the terminal RS[m−1], and a signal input to the terminal RS_PWC(4) can be output from the terminal RS[m]. Note that in Period T804, a selection signal is input to the terminal SL_PWC(1) and a reset signal is input to the terminal RS_PWC(1), then a selection signal is input to the terminal SL_PWC(2), and a reset signal is input to the terminal RS_PWC(2). Thus, although not illustrated in FIG. 30, the selection signal is output from a terminal SL[m−3], the reset signal is output from a terminal RS[m−3], then, the selection signal is output from a terminal SL[m−2], and the reset signal is output from a terminal RS[m−2].

In Period T805, a selection signal is input to the terminal SL_PWC(3), a reset signal is input to the terminal RS_PWC(3), then a selection signal is input to the terminal SL_PWC(4), and a reset signal is input to the terminal RS_PWC(4). Thus, the selection signal is output from the terminal SL[m−1], the reset signal is output from the terminal RS[m−1], then the selection signal is output from the terminal SL[m], and the reset signal is output from the terminal RS[m].

In Period T805, a high-potential signal is output from a terminal ROUT<m/2>. The signal is supplied to a terminal RIN<m/2−1>.

As described above, the start pulse signal input to the terminal LIN<1> in Period T801 in the driving method illustrated in FIG. 30 is sequentially transmitted from the register circuit R<1> to the register circuit R<m/2> in Period T802 to Period T805. In response to this, selection signals are output from the terminal SL[1] to the terminal SL[m] sequentially, and reset signals are output from the terminal RS[1] to the terminal RS[m] sequentially. Thus, captured-image data can be sequentially read out from the pixels 31 in the first to m-th rows.

Next, an example of a driving method of the row driver circuit 33 in the second mode is described. As illustrated in FIG. 31, in Period T811 to Period T815, the switch SW1a and the switch SW2a are in off states and the switch SW1b and the switch SW2b are in on states. Thus, the semiconductor device 10 including the row driver circuit 33 having the structure illustrated in FIG. 26 is driven in the second mode.

First, in Period T811, a high-potential signal is input as a start pulse signal to the terminal LIN<1>. Thus, in the next period, Period T812, a signal input to the terminal SL_PWC(1) can be output from the terminal SL[1], a signal input to the terminal SL_PWC(2) can be output from the terminal SL[2], a signal input to the terminal RS_PWC(1) can be output from the terminal RS[1], and a signal input to the terminal RS_PWC(2) can be output from the terminal RS[2].

In Period T812, selection signals are input to the terminal SL_PWC(1) and the terminal SL_PWC(2), and reset signals are input to the terminal RS_PWC(1) and the terminal RS_PWC(2). Thus, the selection signals are output from the terminal SL[1] and the terminal SL[2] and the reset signals are output from the terminal RS[1] and the terminal RS[2].

In Period T812, a high-potential signal is output from the terminal ROUT<1>. As described above, since the switch SW1a is in an off state and the switch SW1b is in an on state, the high-potential signal output from the terminal ROUT<1> is input to the terminal LIN<r+1>. When the high-potential signal is input to the terminal LIN<r+1>, a signal input to the terminal SL_PWC(3) can be output from the terminal SL[2r+1], a signal input to the terminal SL_PWC(4) can be output from the terminal SL[2r+2], a signal input to the terminal RS_PWC(3) can be output from the terminal RS[2r+1], and a signal input to the terminal RS_PWC(4) can be output from the terminal RS[2r+2] in the next period, Period T813.

In Period T813, selection signals are input to the terminal SL_PWC(3) and the terminal SL_PWC(4) and reset signals are input to the terminal RS_PWC(3) and the terminal RS_PWC(4). Thus, the selection signals are output from the terminal SL[2r+1] and the terminal SL[2r+2] and the reset signals are output from the terminal RS[2r+1] and the terminal RS[2r+2].

In Period T813, a high-potential signal is output from the terminal ROUT<r+1>. As described above, the switch SW1a and the switch SW2a are in off states and the switch SW1b and the switch SW2b are in on states. Thus, the signal output from the terminal ROUT<r+1> is supplied to the terminal LIN<2r+1> and the terminal RIN<1>.

In Period T814, a high-potential signal is input to the terminal LIN<m/2−r+1>. Thus, in the next period, Period T815, the signal input to the terminal SL_PWC(3) can be output from a terminal SL[m−2r+1], the signal input to the terminal SL_PWC(4) can be output from a terminal SL[m−2r+2], the signal input to the terminal RS_PWC(3) can be output from a terminal RS[m−2r+1], and the signal input to the terminal RS_PWC(4) can be output from a terminal RS[m−2r+2]. Note that in Period T814, selection signals are input to the terminal SL_PWC(1) and the terminal SL_PWC(2) and reset signals are input to the terminal RS_PWC(1) and the terminal RS_PWC(2). Thus, although not illustrated in FIG. 31, the selection signals are output from the terminal SL[m−4r+1] and the terminal SL[m−4r+2] and the reset signals are output from the terminal RS[m−4r+1] and the terminal RS[m−4r+2].

In Period T815, selection signals are input to the terminal SL_PWC(3) and the terminal SL_PWC(4) and reset signals are input to the terminal RS_PWC(3) and the terminal RS_PWC(4). Thus, the selection signals are output from the terminal SL[m−2r+1] and the terminal SL[m−2r+2], and the reset signals are output from the terminal RS[m−2r+1] and the terminal RS[m−2r+2].

In Period T815, a high-potential signal is output from the terminal ROUT<m/2−r+1>. The signal is supplied to the terminal RIN<m/2−2r+1>.

As described above, in the driving method in FIG. 31, the start pulse signal input to the terminal LIN<1> in Period T811 is sequentially transmitted from the register circuit R<1> to the register circuit R<m/2−r+1> in Period T812 to Period T815 via one of r register circuits R. In response to this, selection signals are sequentially output from the terminal SL and reset signals are sequentially output from the terminal RS, whereby captured-image data can be read out from the pixels 31.

In the driving method illustrated in FIG. 31, the plurality of terminals SL concurrently output selection signals and the plurality of terminals RS concurrently output reset signals. For example, in Period T812, the terminal SL[1] and the terminal SL[2] concurrently output selection signals and the terminal RS[1] and the terminal RS[2] concurrently output reset signals. Thus, the intensity of a signal representing the captured-image data, which is output from the pixel 31 in reading the captured-image data, can be increased. Thus, detection with the readout captured-image data can be performed with a high accuracy. For example, a position in the pixel portion which a detection object such as a finger touches or is close to, can be detected with a high accuracy.

Structure Example_2 of Semiconductor Device

Figure 32:
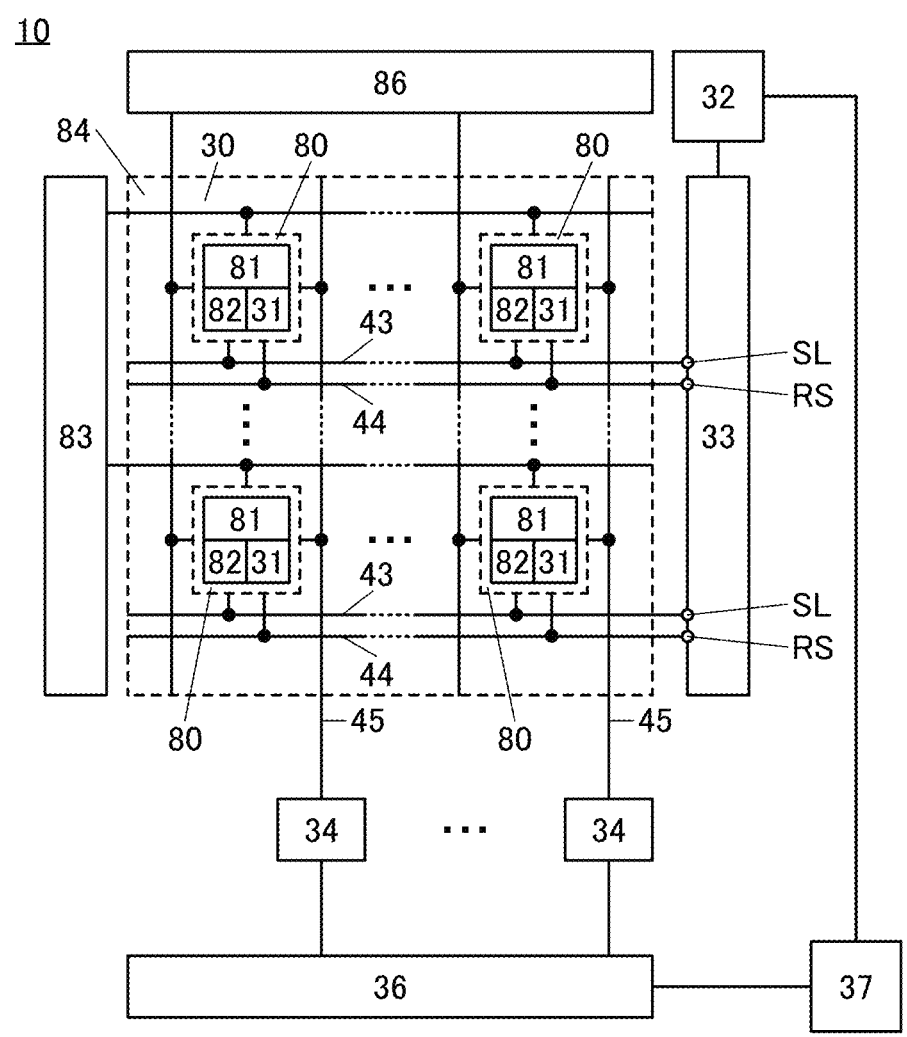
FIG. 32 is a block diagram illustrating a structure example of a semiconductor device.

FIG. 32 is a block diagram illustrating a structure example of the semiconductor device 10. The semiconductor device 10 includes the light-emitting unit 13 and the imaging unit 15 as illustrated in FIG. 1A. Note that the boundary between the light-emitting unit 13 and the imaging unit 15 is not illustrated in FIG. 32, but the semiconductor device 10 in FIG. 32 includes the imaging unit 15 in FIG. 2A. Thus, the description of the components illustrated in FIG. 2A is omitted here as appropriate.

The semiconductor device 10 includes a pixel portion 84 in which pixels 80 are arranged in matrix. Furthermore, the semiconductor device 10 includes a gate driver circuit 83 and a data driver circuit 86 in addition to the control circuit 32, the row driver circuit 33, the CDS circuit 34, the readout circuit 36, and the detection circuit 37.

The pixel 80 can include a pixel 81 and a pixel 82 in addition to the pixel 31. For example, the pixel 81 has a function of emitting light for displaying an image on the pixel portion 84. The pixel 82 has a function of emitting light toward a detection object. In other words, the pixel 82 has a function of emitting the light 23 illustrated in FIG. 1A, FIG. 1B, and the like. Here, the pixel 81, the pixel 82, and the pixel 31 can be referred to as subpixels.

The pixel 31 includes a light-emitting element (also referred to as a light-emitting device) that emits visible light, for example. The pixel 82 includes a light-emitting element that emits infrared light.

As the light-emitting element, an EL element such as an OLED (Organic Light Emitting Diode) or a QLED (Quantum-dot Light Emitting Diode) is preferably used. Examples of a light-emitting substance included in the EL element include a substance emitting fluorescent light (a fluorescent material), a substance emitting phosphorescent light (a phosphorescent material), a substance exhibiting thermally activated delayed fluorescence (a thermally activated delayed fluorescence (TADF) material), and an inorganic compound (e.g., a quantum dot material). An LED such as a micro-LED (Light Emitting Diode) can be used as the light-emitting element. The gate driver circuit 83 is electrically connected to the pixel 81 and the pixel 82 through gate lines. The data driver circuit 86 is electrically connected to the pixel 81 and the pixel 82 through data lines.

The gate driver circuit 83 has a function of selecting the pixel 81 and the pixel 82 to which data showing the emission intensity of the light-emitting element are to be written. The data driver circuit 86 has a function of generating data showing the emission intensity of the light-emitting element included in the pixel 81 and data showing the emission intensity of the light-emitting element included in the pixel 82. The gate driver circuit 83 and the data driver circuit 86 are driver circuits for driving the pixels 81 and the pixels 82.

Note that a driver circuit for driving the pixel 81 and a driver circuit for driving the pixel 82 may be separately provided. The function of the pixel 82 is mainly to emit light toward a detection object. Accordingly, all the pixels 82 may emit light with the same luminance. In this case, a driver circuit for driving the pixel 82 can have a simple structure without having a high-functional sequential circuit, for example.

Figure 33:
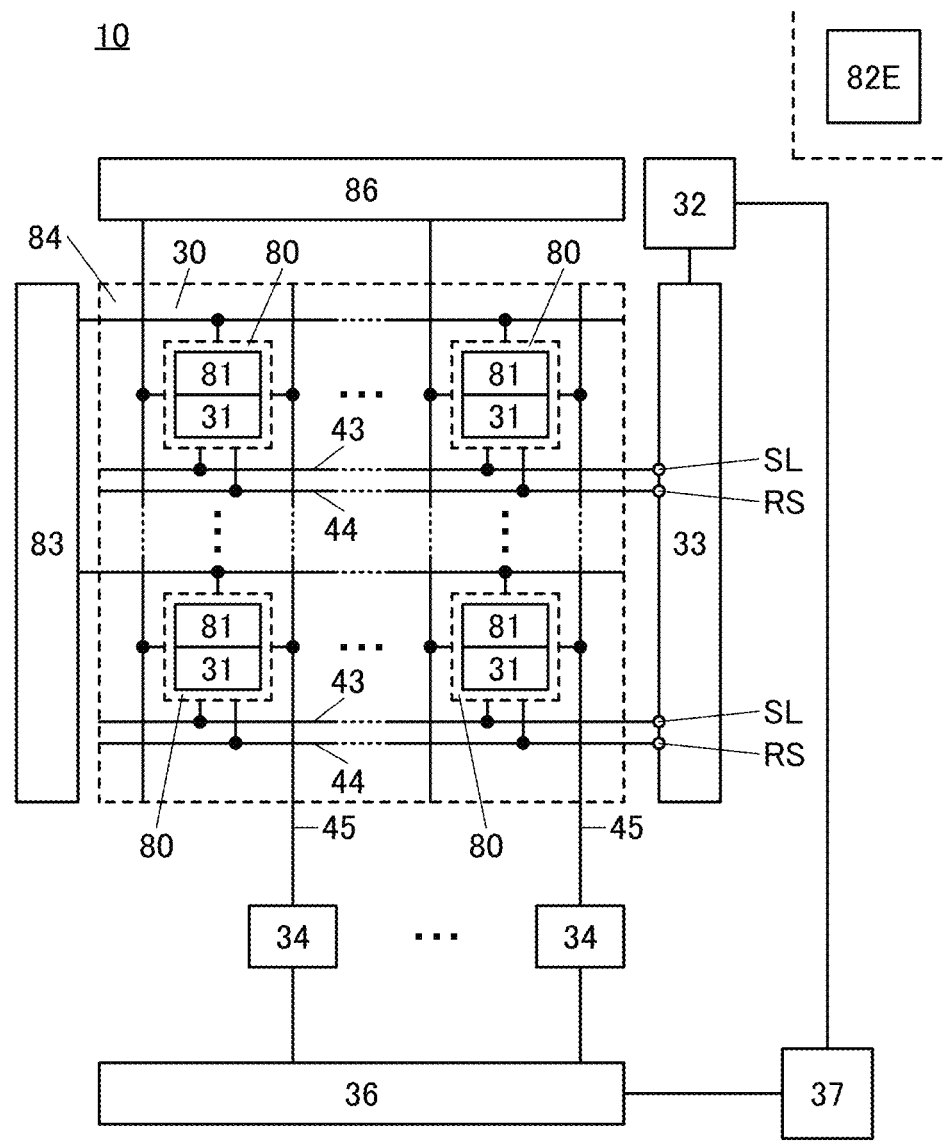
FIG. 33 is a block diagram illustrating a structure example of a semiconductor device.

FIG. 33 is a block diagram illustrating a structure example of a semiconductor device 10, which is a variation example of the semiconductor device 10 illustrated in FIG. 32. The semiconductor device 10 in FIG. 33 is different from the semiconductor device 10 illustrated in FIG. 32 in that the pixel 80 include no pixel 82.

In the semiconductor device 10 illustrated in FIG. 33, a light source 82E that emits light toward a detection object is provided outside the pixel portion 84. For example, an LED that emits near-infrared light with high luminance can be used as the light source 82E. Since the light source 82E is provided outside the pixel portion 84, the light source 82E can be turned on by control different from the control for the semiconductor device 10.

Note that the arrangement position and the number of light source 82E illustrated in FIG. 33 are just an example and the arrangement position and the number of light source 82E are not limited thereto. The light source 82E is one component of a device in which the semiconductor device 10 is provided. Alternatively, the light source 82E may be another device that is different from the semiconductor device 10.

Note that the structure of the pixel 80 is not limited to the structures illustrated in FIG. 32 and FIG. 33, and a variety of structure modes can be employed.

Example_2 of Pixel Structure

Figure 34A:
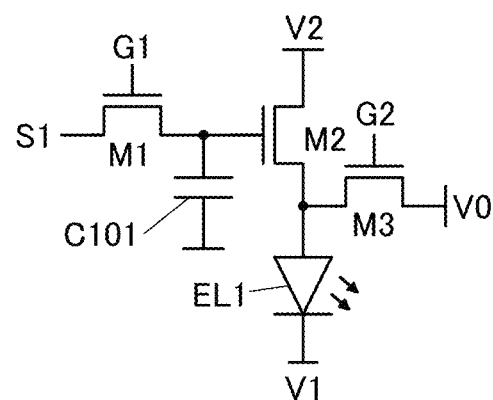
FIG. 34A to FIG. 34C are circuit diagrams illustrating structure examples of pixels.

FIG. 34A is a circuit diagram illustrating a structure example of a pixel circuit PIX1 that can be used for the pixel 81 and the pixel 82. The pixel circuit PIX1 includes a light-emitting element ELL a transistor M1, a transistor M2, a transistor M3, and a capacitor C101. Here, an example in which a light-emitting diode is used as the light-emitting element EL1 is illustrated. An organic EL element that emits visible light or an organic EL element that emits infrared light is preferably used as the light-emitting unit ELL One of a source and a drain of the transistor M1 is electrically connected to a wiring Si. The other of the source and the drain of the transistor M1 is electrically connected to a gate of the transistor M2 and the other electrode of the capacitor C101. A gate of the transistor M1 is electrically connected to a wiring G1. One of a source and a drain of the transistor M2 is electrically connected to a wiring V2. The other of the source and the drain of the transistor M2 is electrically connected to an anode of the light-emitting element EL1 and one of a source and a drain of the transistor M3. The other of the source and the drain of the transistor M3 is electrically connected to a wiring V0. A gate of the transistor M3 is electrically connected to a wiring G2. A cathode of the light-emitting element EL1 is electrically connected to a wiring V1.

The wiring G1 and the wiring G2 can be electrically connected to the gate driver circuit 83 in FIG. 32 and FIG. 33. The wiring Si can be electrically connected to the data driver circuit 86 illustrated in FIG. 32 and FIG. 33.

A constant potential is supplied to each of the wiring V1 and the wiring V2. Light emission can be performed when the anode side of the light-emitting element EL1 is set to a high potential and the cathode side is set to a low potential. The transistor M1 is controlled by a signal supplied to the wiring G1 and functions as a selection transistor for controlling a selection state of the pixel circuit PIX1. The transistor M2 functions as a driving transistor that controls a current flowing through the light-emitting element ELL in accordance with a potential supplied to the gate.

When the transistor M1 is in an on state, a potential supplied to the wiring Si is supplied to the gate of the transistor M2, and the emission luminance of the light-emitting element EL1 can be controlled in accordance with the potential. The transistor M3 is controlled by a signal supplied to the wiring G2. When the transistor M3 is turned on, the potential between the transistor M3 and the light-emitting element EL1 can be reset to a potential supplied from the wiring V0. Thus, a potential can be written to the gate of the transistor M2 in a state where the source potential of the transistor M2 is stabilized.

Figure 34B:
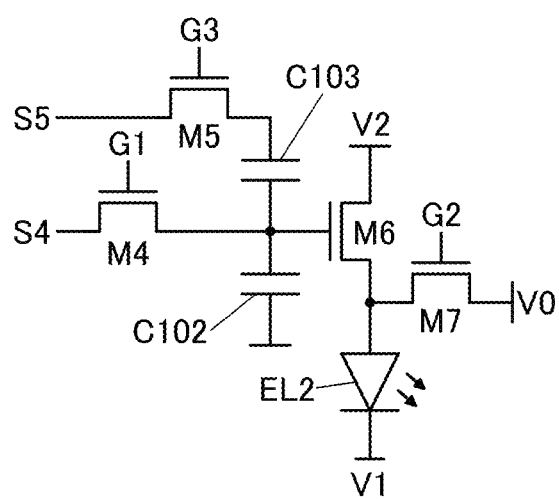

FIG. 34B illustrates an example of a pixel circuit PIX2 which is different from the pixel circuit PIX1. The pixel circuit PIX2 has a function of boosting a voltage. The pixel circuit PIX2 includes a light-emitting element EL2, a transistor M4, a transistor M5, a transistor M6, a transistor M7, a capacitor C102, and a capacitor C103. Here, an example in which a light-emitting diode is used as the light-emitting element EL2 is described.

One of a source and a drain of the transistor M4 is electrically connected to a wiring S4. The other of the source and the drain of the transistor M4 is electrically connected to a gate of the transistor M6, one electrode of the capacitor C102, and one electrode of the capacitor C103. A gate of the transistor M4 is electrically connected to the wiring G1. One of a source and a drain of the transistor M5 is electrically connected to a wiring S5. The other of the source and the drain of the transistor M5 is electrically connected to the other electrode of the capacitor C103. A gate of the transistor M5 is electrically connected to a wiring G3.

One of a source and a drain of the transistor M6 is electrically connected to the wiring V2. The other of the source and the drain of the transistor M6 is electrically connected to one of a source and a drain of the transistor M7 and an anode of the light-emitting element EL2. The other of the source and the drain of the transistor M7 is electrically connected to the wiring V0. A gate of the transistor M7 is electrically connected to the wiring G2. A cathode of the light-emitting element EL2 is electrically connected to the wiring V1.

The wiring G1 to the wiring G3 can be electrically connected to the gate driver circuit 83 in FIG. 32 and FIG. 33. The wiring S4 and the wiring S5 can be electrically connected to the data driver circuit 86 illustrated in FIG. 32 and FIG. 33.

The transistor M4 is controlled by a signal supplied to the wiring G1, and the transistor M5 is controlled by a signal supplied to the wiring G3. The transistor M6 functions as a driving transistor that controls a current flowing through the light-emitting element EL2, in accordance with a potential supplied to the gate.

The emission luminance of the light-emitting element EL2 can be controlled in accordance with the potential supplied to the gate of the transistor M6. The transistor M7 is controlled by a signal supplied to the wiring G2. When the transistor M7 is turned on, the potential between the transistor M6 and the light-emitting element EL2 can be reset to a constant potential supplied from the wiring V0. Thus, in the state where the source potential of the transistor M6 is stable, a potential can be written to the gate of the transistor M6. In addition, when the potential supplied from the wiring V0 is set to the same potential as the potential of the wiring V1 or a potential lower than that of the wiring V1, light emission of the light-emitting element EL2 can be inhibited.

The function of boosting a voltage, which the pixel circuit PIX2 has, will be described below.

First, a potential "D1" of the wiring S4 is supplied to the gate of the transistor M6 through the transistor M4, and at timing overlapping with this, a reference potential "$V_{ref}$" is supplied to the other electrode of the capacitor C103 through the transistor M5. At this time, "$D1-V_{ref}$" is held in the capacitor C103. Next, the gate of the transistor M6 is set to be floating, and a potential "D2" of the wiring S5 is supplied to the other electrode of the capacitor C103 through the transistor M5. Here, the potential "D2" is a potential for addition.

At this time, the potential of the gate of the transistor M6 is $D1+(C3/(C3+C2+C_{M6}))\times(D2-V_{ref})$, where C3 is the capacitance value of the capacitor C103, C2 is the capacitance value of the capacitor C102, and $C_{M6}$ is the capacitance value of the gate of the transistor M6. Here, assuming that the value of C3 is sufficiently larger than the value of $C2+C_{M6}$, $C3/(C3+C2+C_{M6})$ approximates 1. Thus, it can be said that the potential of the gate of the transistor M6 approximates "$D1+(D2-V_{ref})$". Then, when D1=D2 and $V_{ref}=0$, "$D1+(D2-V_{ref})$"="2D1".

That is, when the circuit is designed appropriately, a potential approximately twice the potential that can be input from the wiring S4 or the wiring S5 can be supplied to the gate of the transistor M6.

Owing to such an action, a high voltage can be generated even when a general-purpose driver IC is used. Thus, the voltage to be input can be low and power consumption can be reduced.

Figure 34C:
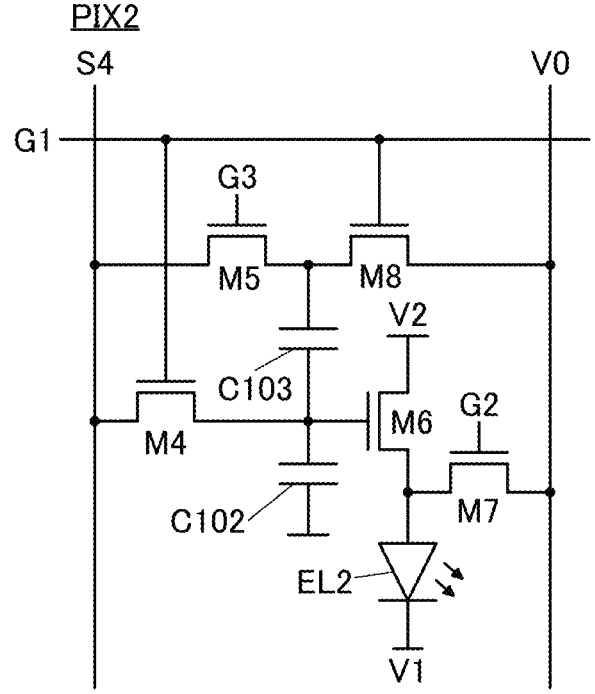

Alternatively, the pixel circuit PIX2 may have a structure illustrated in FIG. 34C. The pixel circuit PIX2 illustrated in FIG. 34C differs from the pixel circuit PIX2 illustrated in FIG. 34B in including a transistor M8. In the pixel circuit PIX2 in FIG. 34C, one of a source and a drain of the transistor M8 is electrically connected to the other of the source and the drain of the transistor M5 and the other electrode of the capacitor C103. The other of the source and the drain of the transistor M8 is electrically connected to the wiring V0. A gate of the transistor M8 is electrically connected to the wiring G1. One of the source and the drain of the transistor M5 is electrically connected to the wiring S4.

As described above, in the pixel circuit PIX2 illustrated in FIG. 34B, the operations of supplying the reference potential and the potential for addition to the other electrode of the capacitor C103 through the transistor M5 are performed. In this case, the two wirings S4 and S5 are necessary and the reference potential and the potential for addition need to be rewritten alternately in the wiring S5.

In the pixel circuit PIX2 illustrated in FIG. 34C, although the transistor M8 is additionally provided, the wiring S5 can be omitted because a dedicated path for supplying the reference potential is provided. Furthermore, since the gate of the transistor M8 can be connected to the wiring G1 and the wiring V0 can be used as a wiring for supplying the reference potential, a wiring connected to the transistor M8 is not additionally provided. Moreover, alternate rewriting of the reference potential and the potential for addition with one wiring is not performed, which makes it possible to achieve high-speed operation with low power consumption.

Note that in FIG. 34B and FIG. 34C, "D1B", an inversion potential of "D1", may be used as the reference potential "$V_{ref}$". In this case, a potential approximately three times the potential that can be input from the wiring S4 or the wiring S5 can be supplied to the gate of the transistor M6. Note that the inversion potential refers to a potential such that the absolute value of the difference between the potential and a reference potential is the same (or substantially the same) as that of the difference between the original potential and the reference potential, and the potential is different from the original potential. The relation $V_0=(D1+D1B)/2$ is preferably satisfied, where "D1" is the original potential, "D1B" is the inversion potential, and $V_0$ is the reference potential.

Note that in the semiconductor device of one embodiment of the present invention, the light-emitting element may be made to emit light in a pulsed manner for displaying an image. A reduction in the driving time of the light-emitting element can reduce the power consumption of the semiconductor device and suppress heat generation of the semiconductor device. An organic EL element is particularly preferable because of its favorable frequency characteristics. The frequency can be higher than or equal to 1 kHz and lower than or equal to 100 MHz, for example.

Structure Example_3 of Semiconductor Device

Figure 35:
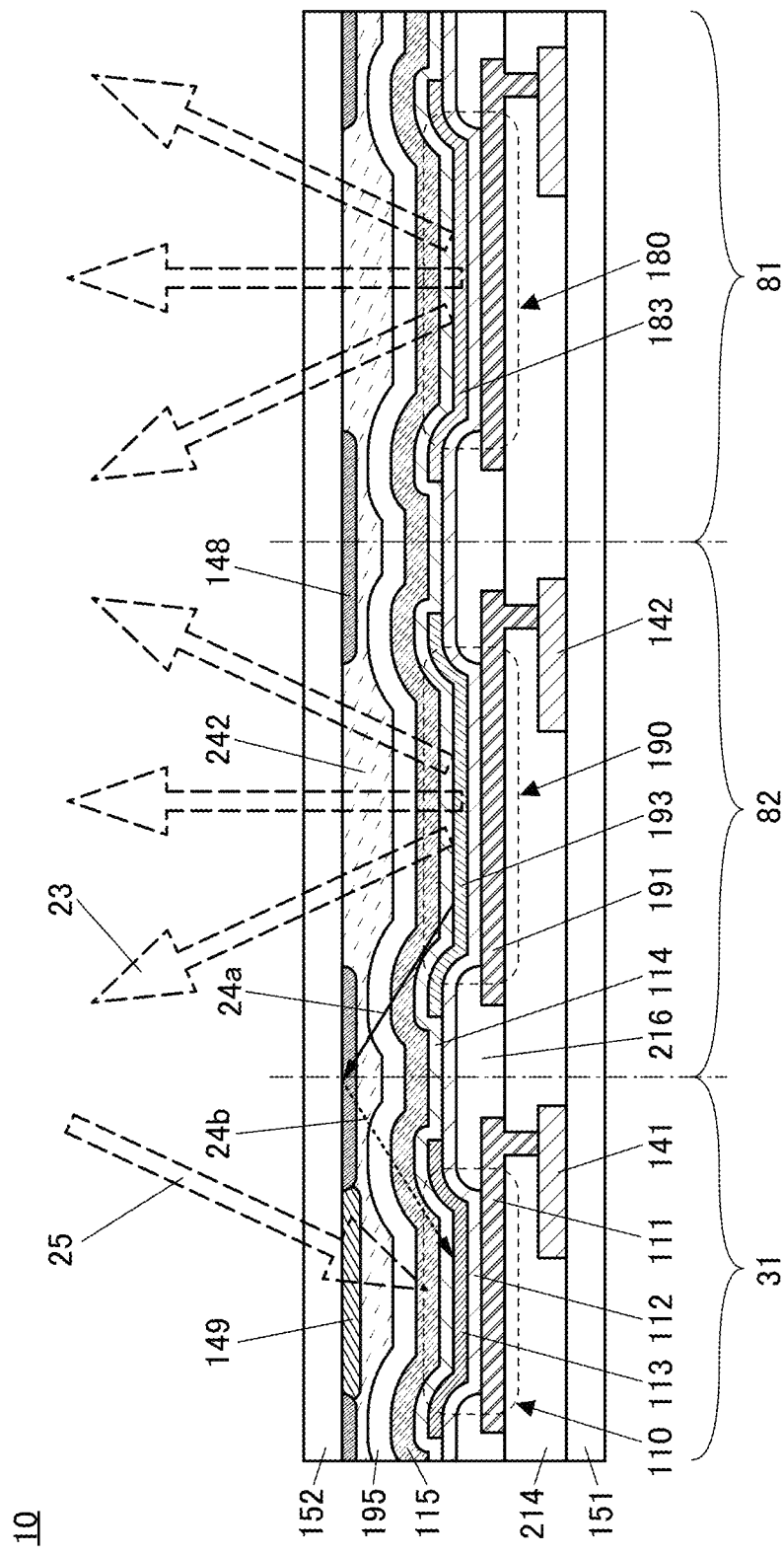
FIG. 35 is a cross-sectional view illustrating a structure example of a semiconductor device.

FIG. 35 is a cross-sectional view illustrating a structure example of the semiconductor device 10. The semiconductor device 10 includes a light-receiving element 110, a light-emitting element 190, and a light-emitting element 180. The light-receiving element 110 corresponds to an organic photodiode included in the pixel 31. The light-emitting element 190 corresponds to an organic EL element (emitting infrared light) included in the pixel 82. The light-emitting element 180 corresponds to an organic EL element (emitting visible light) included in the pixel 81.

The structures other than the light-emitting layer can be the same in the organic EL element (the light-emitting element 180) included in the pixel 81 and the organic EL element (the light-emitting element 190) included in the pixel 82. Therefore, the light-emitting element 190 will be described in detail here, and description of the light-emitting element 180 will be omitted.

The light-receiving element 110 includes a pixel electrode 111, a common layer 112, a photoelectric conversion layer 113, a common layer 114, and a common electrode 115. The light-emitting element 190 includes a pixel electrode 191, the common layer 112, a light-emitting layer 193, the common layer 114, and the common electrode 115. Note that the light-emitting element 180 includes a light-emitting layer 183 that is different from the light-emitting layer 193.

The pixel electrode 111, the pixel electrode 191, the common layer 112, the photoelectric conversion layer 113, the light-emitting layer 193, the common layer 114, and the common electrode 115 may each have a single-layer structure or a stacked-layer structure.

The pixel electrode 111 and the pixel electrode 191 are positioned over an insulating layer 214. The pixel electrode 111 and the pixel electrode 191 can be formed using the same material in the same step.

The common layer 112 is positioned over the pixel electrode 111 and the pixel electrode 191. The common layer 112 is a layer shared by the light-receiving element 110 and the light-emitting element 190.

The photoelectric conversion layer 113 includes a region that overlaps with the pixel electrode 111 with the common layer 112 therebetween. The light-emitting layer 193 includes a region that overlaps with the pixel electrode 191 with the common layer 112 therebetween. The photoelectric conversion layer 113 includes a first organic compound. The light-emitting layer 193 includes a second organic compound different from the first organic compound.

The common layer 114 is positioned over the common layer 112, the photoelectric conversion layer 113, and the light-emitting layer 193. The common layer 114 is a layer shared by the light-receiving element 110 and the light-emitting element 190.

The common electrode 115 includes a region that overlaps with the pixel electrode 111 with the common layer 112, the photoelectric conversion layer 113, and the common layer 114 therebetween. The common electrode 115 further includes a region overlapping with the pixel electrode 191 with the common layer 112, the light-emitting layer 193, and the common layer 114 therebetween. The common electrode 115 is a layer shared by the light-receiving element 110 and the light-emitting element 190.

In the semiconductor device 10, an organic compound is used for the photoelectric conversion layer 113 of the light-receiving element 110. In the light-receiving element 110, the layers other than the photoelectric conversion layer 113 can have structures in common with the layers in the light-emitting element 190 (organic EL element). Therefore, the light-receiving element 110 can be formed concurrently with the formation of the light-emitting element 190 only by adding a step of depositing the photoelectric conversion layer 113 to the manufacturing process of the light-emitting element 190. The light-emitting element 190 and the light-receiving element 110 can be formed over one substrate. Accordingly, the light-receiving element 110 can be incorporated into a display device without a significant increase in the number of manufacturing steps. The light-receiving element 110 and the light-emitting element 190 may include layers separately formed, in addition to the photoelectric conversion layer 113 and the light-emitting layer 193.

The semiconductor device 10 includes the light-receiving element 110, the light-emitting element 190, a transistor 141, a transistor 142, and the like between a pair of substrates (a substrate 151 and a substrate 152). Here, the transistor 141 can be a transistor 51 illustrated in, for example, FIG. 2B1. The transistor 142 can be the transistor M2 or the transistor M3 illustrated in FIG. 34A, the transistor M6 or the transistor M7 illustrated in FIG. 34B and FIG. 34C.

In the light-receiving element 110, the common layer 112, the photoelectric conversion layer 113, and the common layer 114, which are positioned between the pixel electrode 111 and the common electrode 115, can each be an organic layer (a layer including an organic compound). The pixel electrode 111 preferably has a function of reflecting visible light and infrared light. The common electrode 115 has a function of transmitting visible light and infrared light.

The light-receiving element 110 has a function of detecting light. Specifically, the light-receiving element 110 is a photoelectric conversion element that converts the incident light (visible light, infrared light, or light containing both visible light and infrared light) into an electrical signal.

A light-blocking layer 148 is provided on a surface of the substrate 152 on the substrate 151 side. The light-blocking layer 148 has opening portions in a position overlapping with the light-receiving element 110 and in a position overlapping with the light-emitting element 190. Providing the light-blocking layer 148 can control the range where the light-receiving element 110 detects light.

A material that blocks light emitted by the light-emitting element 190 can be used for the light-blocking layer 148. The light-blocking layer 148 preferably absorbs visible light and infrared light. The light-blocking layer 148 can be formed using a metal material or a resin material containing pigment (e.g., carbon black) or dye, for example. The light-blocking layer 148 may have a stacked-layer structure of a red color filter, a green color filter, and a blue color filter.

A filter 149 that filters out light with wavelengths shorter than the wavelength of visible light may be provided in the opening portion of the light-blocking layer 148 which is provided in the position overlapping with the light-receiving element 110. For example, a long pass filter that filters out light (ultraviolet light) having shorter wavelengths than visible light or the like can be used as the filter 149. For example, an inorganic insulating film as well as a resin film or the like can be used as the filter that filters out ultraviolet light. Providing the filter 149 can inhibit ultraviolet light from entering the light-receiving element 110, so that visible light and infrared light can be detected with less noise.

Figure 36A:
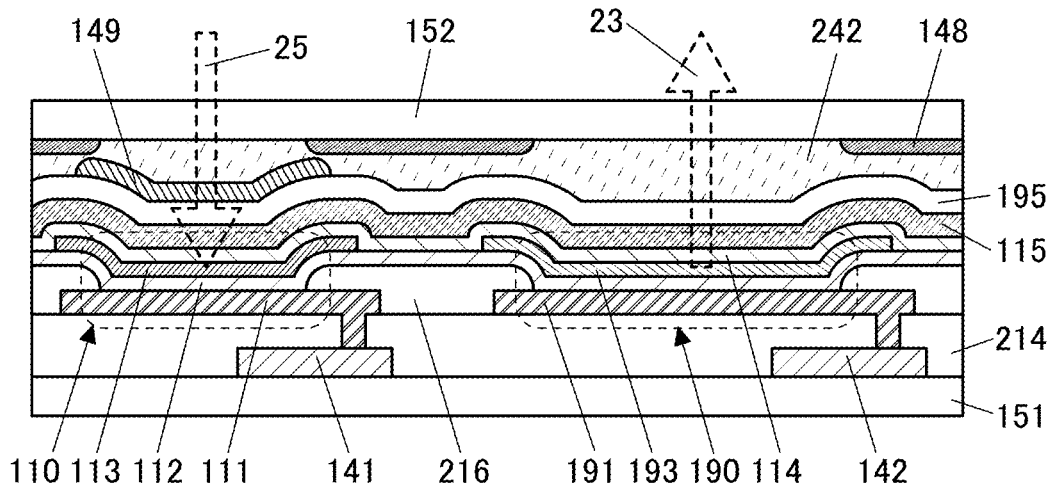
FIG. 36A to FIG. 36C are cross-sectional views each illustrating a structure example of a semiconductor device.

Note that the filter 149 may be provided to be stacked over the light-receiving element 110, as illustrated in FIG. 36A.

Figure 36B:
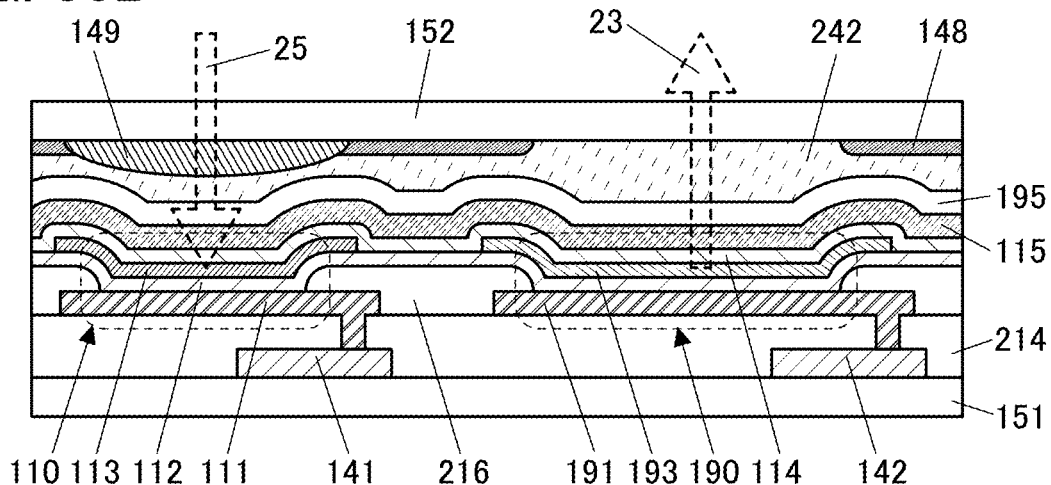

Alternatively, the filter 149 may have a lens shape as illustrated in FIG. 36B. The lens-type filter 149 is a convex lens having a convex surface on the substrate 151 side. Note that the filter 149 may be positioned so that the convex surface is on the substrate 152 side. In the case where both the light-blocking layer 148 and the lens-type filter 149 are formed on the same surface of the substrate 152, their formation order is not limited. Although FIG. 36B illustrates an example in which the lens filter 149 is formed first, the light-blocking layer 148 may be formed first. In FIG. 36B, end portions of the lens filter 149 are covered with the light-blocking layer 148.

In the structure illustrated in FIG. 36B, the light 25 enters the light-receiving element 110 through the lens-type filter 149. When the filter 149 is a lens-type filter, the image capturing range of the light-receiving element 110 can be narrowed to be inhibited from overlapping with the image capturing range of an adjacent light-receiving element 110. Thus, a clear image with little blurring can be captured. In addition, when the filter 149 is a lens-type filter, the opening of the light-blocking layer 148 over the light-receiving element 110 can be large. Thus, the amount of light entering the light-receiving element 110 can be increased, so that light detection sensitivity can be increased.

The lens-type filter 149 can be directly formed on the substrate 152 or the light-receiving element 110. Alternatively, a separately formed microlens array or the like may be bonded to the substrate 152.

Figure 36C:
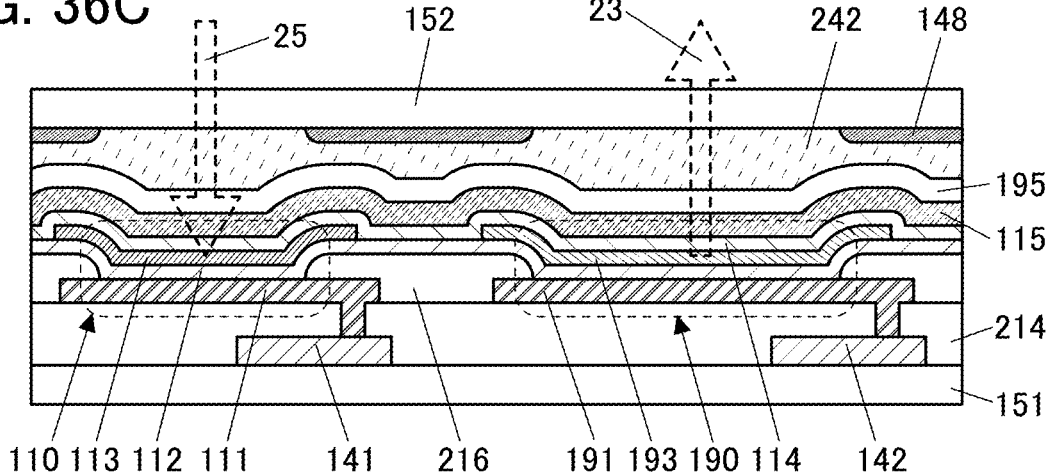

Alternatively, a structure without the filter 149 may be employed as illustrated in FIG. 36C. The filter 149 can be omitted in the case where the light-receiving element 110 has characteristics such that it has no sensitivity to ultraviolet light or has sensitivity to visible light and infrared light sufficiently higher than that to ultraviolet light. In this case, a lens having a shape similar to that of the lens filter 149 illustrated in FIG. 36B may be provided to overlap the light-receiving element 110.

Here, the light-receiving element 110 can detect the light 25 which is reflected by the detection object like a finger, of the light 23 emitted from the light-emitting element 190. However, in some cases, part of light emitted from the light-emitting element 190 is reflected inside the semiconductor device 10 and enters the light-receiving element 110 without through a detection object.

The light-blocking layer 148 can reduce the influence of such stray light. For example, in the case where the light-blocking layer 148 is not provided, light 24a emitted from the light-emitting element 190 illustrated in FIG. 35 is reflected by the substrate 152 or the like and reflected light 24b enters the light-receiving element 110 in some cases. Providing the light-blocking layer 148 can inhibit entry of the reflected light 24b into the light-receiving element 110. Hence, noise can be reduced, and the accuracy of light detection of the light-receiving element 110 can be increased.

In the light-emitting element 190, the common layer 112, the light-emitting layer 193, and the common layer 114, which are positioned between the pixel electrode 191 and the common electrode 115, can each also be referred to as an EL layer. The pixel electrode 191 preferably has a function of reflecting at least infrared light.

The light-emitting element 190 has a function of emitting infrared light. Specifically, the light-emitting element 190 is an electroluminescent element that emits light 23 to the substrate 152 side when voltage is applied between the pixel electrode 191 and the common electrode 115.

The pixel electrode 111 is electrically connected to a source or a drain of the transistor 141 through an opening provided in the insulating layer 214. An end portion of the pixel electrode 111 is covered with a partition 216.

The pixel electrode 191 is electrically connected to a source or a drain of the transistor 142 through an opening provided in the insulating layer 214. An end portion of the pixel electrode 191 is covered with the partition 216.

The transistor 141 and the transistor 142 are over and in contact with the same layer (the substrate 151 in FIG. 35).

At least part of a circuit electrically connected to the light-receiving element 110 and a circuit electrically connected to the light-emitting element 190 are preferably formed using the same material in the same step. In this case, the thickness of the display apparatus can be smaller and the fabrication process can be simpler than in the case where the two circuits are separately formed.

The light-receiving element 110 and the light-emitting element 190 are preferably covered with a protective layer 195. In the example illustrated in FIG. 35, the protective layer 195 is provided over and in contact with the common electrode 115. Providing the protective layer 195 can inhibit entry of impurities such as water into the light-receiving element 110 and the light-emitting element 190, so that the reliability of the light-receiving element 110 and the light-emitting element 190 can be increased. The protective layer 195 and the substrate 152 are bonded to each other with an adhesive layer 242.

Figure 37A:
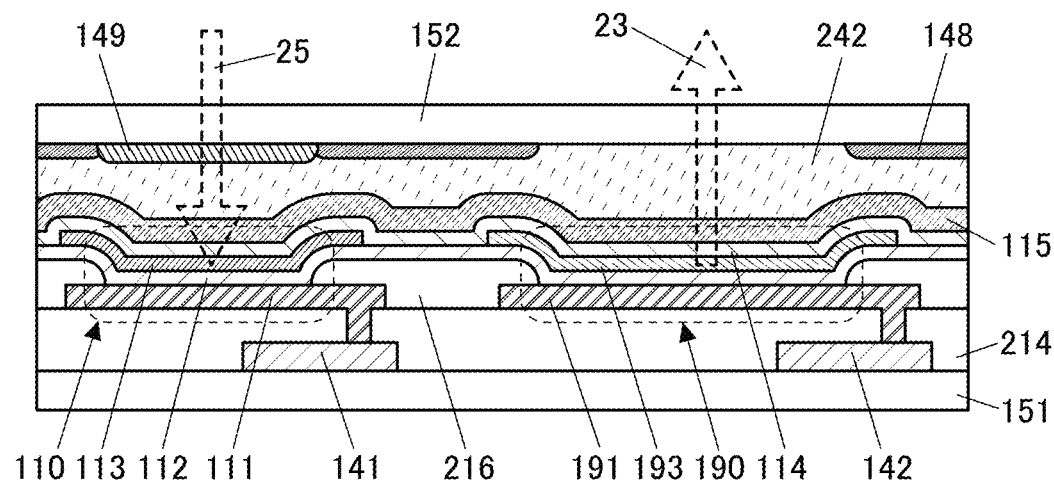
FIG. 37A and FIG. 37B are cross-sectional views each illustrating a structure example of a semiconductor device.

Alternatively, a structure in which no protective layer 195 is provided over the light-receiving element 110 and over the light-emitting element 190 may be employed, as illustrated in FIG. 37A. In this case, the common electrode 115 and the substrate 152 are bonded to each other with the adhesive layer 242.

Figure 37B:
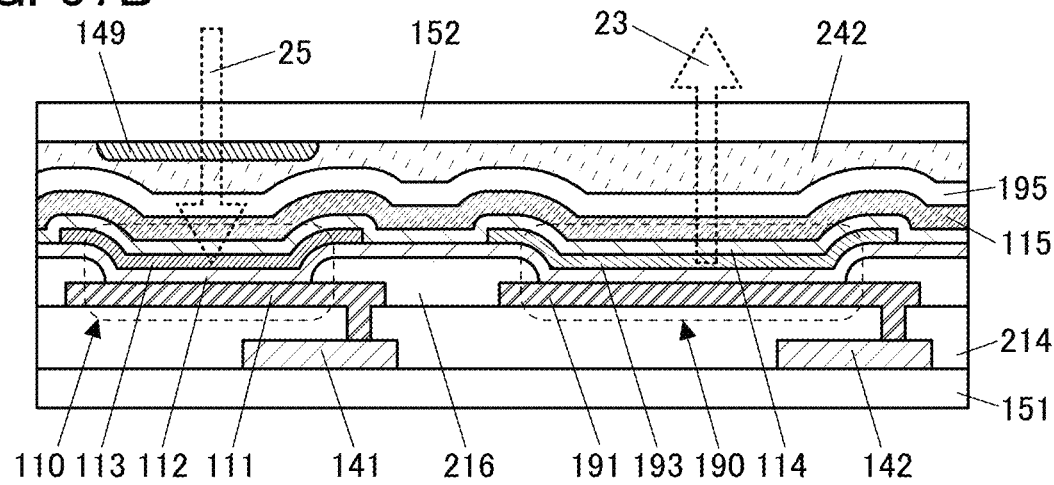

Alternatively, a structure without the light-blocking layer 148 may be employed, as illustrated in FIG. 37B. In this case, the amount of light which the light-emitting element 190 emits to the outside and the amount of light received by the light-receiving element 110 can be increased, so that the detection sensitivity can be increased.

Figure 38:
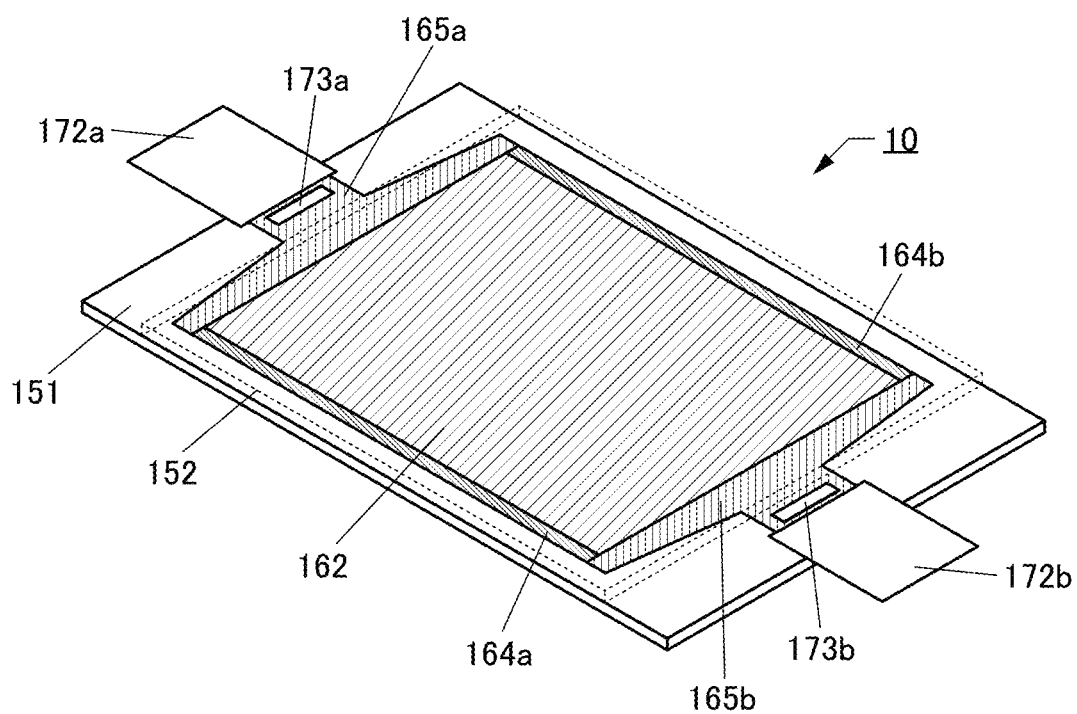
FIG. 38 is a perspective view illustrating a structure example of a semiconductor device.

FIG. 38 illustrates a perspective view of the semiconductor device 10. The semiconductor device 10 has a structure in which the substrate 151 and the substrate 152 are bonded to each other. In FIG. 38, the substrate 152 is denoted by a dashed line.

The semiconductor device 10 includes a display portion 162, a circuit 164a, a circuit 164b, a wiring 165a, a wiring 165b, and the like. FIG. 38 illustrates an example in which an IC (integrated circuit) 173a, an FPC 172a, an IC 173b, and an FPC 172b are mounted on the semiconductor device 10. Therefore, the structure illustrated in FIG. 38 can be regarded as a display module including the semiconductor device 10, the ICs, and the FPCs.

A gate driver circuit for performing display can be used as the circuit 164*a*. A row driver circuit for performing image capturing (light detection) can be used as the circuit 164*b*.

A signal and electric power can be supplied to the circuit 164*a* through the wiring 165*a*, for example. The signal and the electric power can be input to the wiring 165*a* through the FPC 172*a* from the outside of the semiconductor device 10, for example. Alternatively, the IC 173*a* can generate the signal and the electric power and output them to the wiring 165*a*. In addition, a signal and electric power can be supplied to the circuit 164*b* through the wiring 165*b*. Although FIG. 38 illustrates an example in which the IC 173*a* and the IC 173*b* are provided on the substrate 151 by a COG (Chip On Glass) method, a TCP (Tape Carrier Package) method, a COF (Chip On Film) method, or the like may be used. For example, an IC having a function of a data driver circuit that is electrically connected to the pixel 81 and the pixel 82 described above can be used as the IC 173*a*. For example, an IC having a function of a signal processing circuit of a readout circuit electrically connected to the pixel 31 described above can be used as the IC 173*b*.

Note that the driver circuits may be provided over the substrate 151 as well as the transistors included in the pixel circuit, for example.

Figure 39:
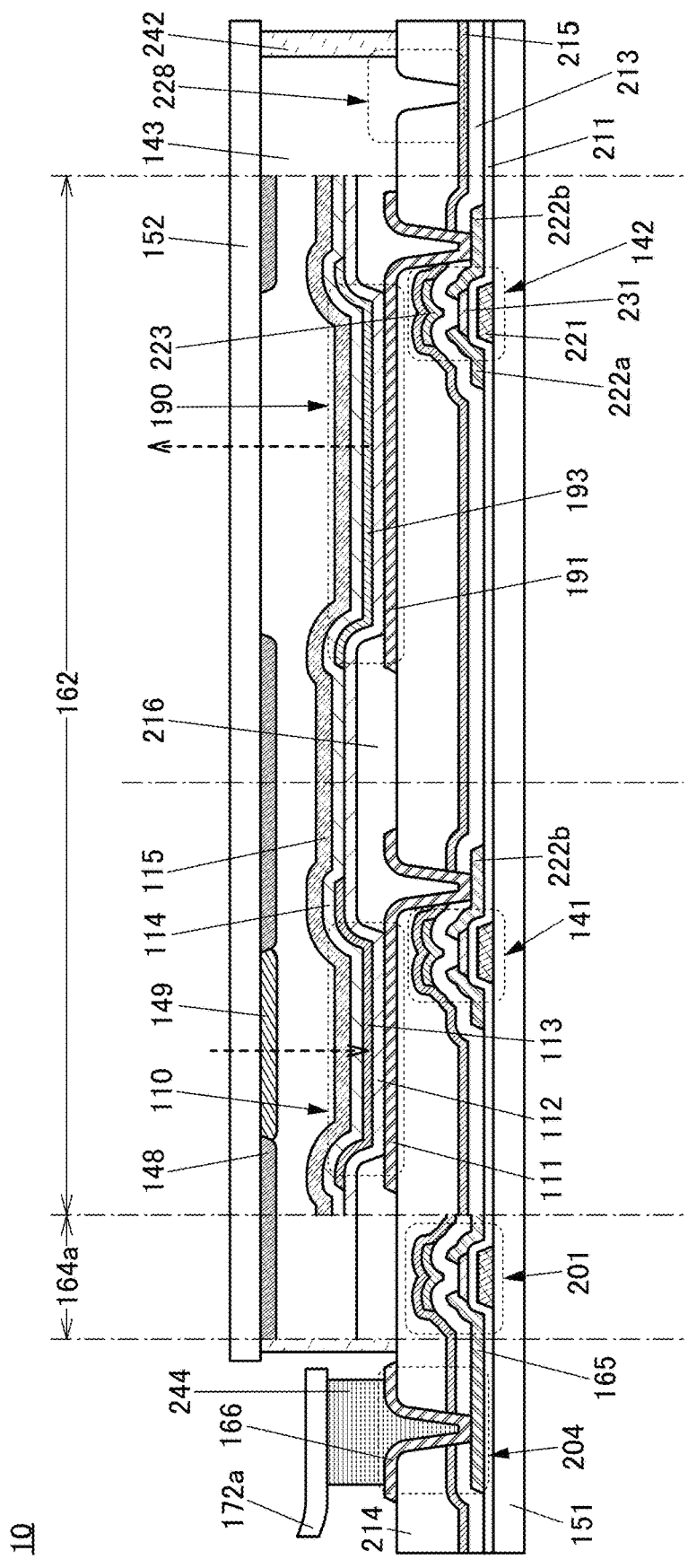
FIG. 39 is a cross-sectional view illustrating a structure example of a semiconductor device.

FIG. 39 illustrates an example of cross sections of part of a region including the FPC 172*a*, part of a region including the circuit 164*a*, part of a region including the display portion 162, and part of a region including an end portion in the semiconductor device 10 illustrated in FIG. 38.

The semiconductor device 10 illustrated in FIG. 39 includes a transistor 201, the transistor 141, the transistor 142, the light-emitting element 190, the light-receiving element 110, and the like between the substrate 151 and the substrate 152.

The substrate 152 and the insulating layer 214 are bonded to each other with the adhesive layer 242. A solid sealing structure, a hollow sealing structure, or the like can be employed to seal the light-emitting element 190 and the light-receiving element 110. A hollow sealing structure is employed in which a space 143 surrounded by the substrate 152, the adhesive layer 242, and the insulating layer 214 is filled with an inert gas (e.g., nitrogen or argon). The adhesive layer 242 may overlap with the light-receiving element 110 and the light-emitting element 190.

The region surrounded by the substrate 152, the adhesive layer 242, and the insulating layer 214 may be filled with a resin different from that of the adhesive layer 242.

The transistor 201, the transistor 141, and the transistor 142 are formed over the substrate 151. These transistors can be formed using the same material in the same step.

An insulating layer 211, an insulating layer 213, an insulating layer 215, and the insulating layer 214 are provided in this order over the substrate 151. Parts of the insulating layer 211 function as gate insulating layers of the transistors. Parts of the insulating layer 213 function as gate insulating layers of the transistors. The insulating layer 215 is provided to cover the transistors. The insulating layer 214 is provided to cover the transistors and has a function of a planarization layer. Note that the number of gate insulating layers and the number of insulating layers covering the transistors are not limited and may each be one or two or more.

A material into which impurities such as water or hydrogen do not easily diffuse is preferably used for at least one of the insulating layers that cover the transistors. Thus, such an insulating layer can function as a barrier layer. Such a structure can effectively inhibit diffusion of impurities into the transistors from the outside and increase the reliability of the display device.

An inorganic insulating film is preferably used as each of the insulating layer 211, the insulating layer 213, and the insulating layer 215. As the inorganic insulating film, a silicon nitride film, a silicon oxynitride film, a silicon oxide film, a silicon nitride oxide film, an aluminum oxide film, or an aluminum nitride film can be used, for example. Alternatively, a hafnium oxide film, an yttrium oxide film, a zirconium oxide film, a gallium oxide film, a tantalum oxide film, a magnesium oxide film, a lanthanum oxide film, a cerium oxide film, or a neodymium oxide film may be used. A stack including two or more of the above insulating films may also be used.

In this specification and the like, a silicon oxynitride film refers to a film that contains more oxygen than nitrogen in the composition. A silicon nitride oxide film represents a film containing more nitrogen than oxygen in the composition.

An organic insulating film is preferably used for the insulating layer 214 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

Here, an organic insulating film often has a lower barrier property against impurities than an inorganic insulating film. Therefore, the organic insulating film preferably has an opening in the vicinity of an end portion of the semiconductor device 10. This can inhibit diffusion of impurities from the end portion of the semiconductor device 10 through the organic insulating film. Alternatively, the organic insulating film may be formed such that an end portion of the organic insulating film is positioned inward from the end portion of the semiconductor device 10, to prevent the organic insulating film from being exposed at the end portion of the semiconductor device 10.

In a region 228 illustrated in FIG. 39, an opening is formed in the insulating layer 214. This can inhibit diffusion of impurities into the display portion 162 from the outside through the insulating layer 214 even when an organic insulating film is used as the insulating layer 214. Thus, the reliability of the semiconductor device 10 can be increased.

Each of the transistor 201, the transistor 141, and the transistor 142 includes a conductive layer 221 functioning as a gate, the insulating layer 211 functioning as the gate insulating layer, a conductive layer 222*a* and the conductive layer 222*b* functioning as a source and a drain, a semiconductor layer 231, the insulating layer 213 functioning as the gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display device of this embodiment. For example, a planar transistor, a staggered transistor, or an inverted staggered transistor can be used. A top-gate or a bottom-gate transistor structure may be employed. Alternatively, gates may be provided above and below a semiconductor layer in which a channel is formed.

The structure in which the semiconductor layer where a channel is formed is provided between two gates is used for the transistor 201, the transistor 141, and the transistor 142. The two gates may be connected to each other and supplied with the same signal to drive the transistor. Alternatively, one of the two gates may be supplied with a potential for controlling the threshold voltage of the transistor and the other may be supplied with a potential for driving.

There is no particular limitation on the crystallinity of a semiconductor material used for the transistors, and any of an amorphous semiconductor, a single crystal semiconductor, and a semiconductor having crystallinity other than single crystal (a microcrystalline semiconductor, a polycrystalline semiconductor, or a semiconductor partly including crystal regions) may be used. It is preferable that a single crystal semiconductor or a semiconductor having crystallinity be used, in which case deterioration of the transistor characteristics can be inhibited.

A semiconductor layer of a transistor preferably contains a metal oxide (also referred to as an oxide semiconductor). Alternatively, the semiconductor layer of the transistor may include silicon. Examples of silicon include amorphous silicon and crystalline silicon (e.g., low-temperature polysilicon or single crystal silicon).

When the semiconductor layer contains a metal oxide, the metal oxide preferably contains at least indium or zinc as described above. In particular, indium and zinc are preferably contained. In addition to them, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

The transistors included in the circuit 164*a* and the transistors included in the display portion 162 may have the same structure or different structures. One structure or two or more kinds of structures may be employed for a plurality of transistors included in the circuit 164*a*. Similarly, one structure or two or more kinds of structures may be employed for a plurality of transistors included in the display portion 162.

A connection portion 204 is provided in a region that is over the substrate 151 and does not overlap with the substrate 152. In the connection portion 204, the wiring 165 is electrically connected to the FPC 172*a* through a conductive layer 166 and a connection layer 244. On a top surface of the connection portion 204, the conductive layer 166 obtained by processing the same conductive film as the pixel electrode 191 is exposed. Thus, the connection portion 204 and the FPC 172*a* can be electrically connected to each other through the connection layer 244.

Any of a variety of optical members can be arranged on the outer side of the substrate 152. Examples of the optical members include a polarizing plate, a retardation plate, a light diffusion layer (e.g., a diffusion film), an anti-reflective layer, and a light-condensing film. Furthermore, an antistatic film preventing the attachment of dust, a water repellent film suppressing the attachment of stain, a hard coat film inhibiting generation of a scratch caused by the use, a shock absorption layer, or the like may be arranged on the outside of the substrate 152.

For each of the substrate 151 and the substrate 152, glass, quartz, ceramics, sapphire, resin, or the like can be used.

As the adhesive layer, a variety of curable adhesives, e.g., a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. Alternatively, a two-component-mixture-type resin may be used. An adhesive sheet or the like may be used.

As the connection layer 244, an anisotropic conductive film (ACF), an anisotropic conductive paste (ACP), or the like can be used.

The light-emitting element 190 has a top-emission structure, a bottom-emission structure, a dual-emission structure, or the like. Although a top-emission structure is preferred in one embodiment of the present invention, another structure can be used when a light-emitting surface of the light-emitting element 190 and a light-receiving surface of the light-receiving element 110 face in the same direction.

The light-emitting element 190 includes at least the light-emitting layer 193. The light-emitting element 190 may further include, as a layer other than the light-emitting layer 193, a layer containing a substance with a high hole-injection property, a substance with a high hole-transport property, a hole-blocking material, a substance with a high electron-transport property, a substance with a high electron-injection property, a substance with a bipolar property (a substance with a high electron-transport property and a high hole-transport property), or the like. For example, the common layer 112 preferably includes one or both of a hole-injection layer and a hole-transport layer. For example, the common layer 114 preferably includes one or both of an electron-transport layer and an electron-injection layer.

The common layer 112, the light-emitting layer 193, and the common layer 114 may use either a low molecular compound or a high molecular compound and may also contain an inorganic compound. The layers included in the common layer 112, the light-emitting layer 193, and the common layer 114 can be formed by a method such as an evaporation method (including a vacuum evaporation method), a transfer method, a printing method, an inkjet method, or a coating method.

The light-emitting layer 193 may contain an inorganic compound such as quantum dots as a light-emitting material.

The photoelectric conversion layer 113 of the light-receiving element 110 contains a semiconductor. As the semiconductor, an inorganic semiconductor such as silicon or an organic semiconductor containing an organic compound can be used. This embodiment describes an example in which an organic semiconductor is used as the semiconductor included in the photoelectric conversion layer 113. The use of an organic semiconductor is preferable because the light-emitting layer 193 of the light-emitting element 190 and the photoelectric conversion layer 113 of the light-receiving element 110 can be formed by the same method (e.g., a vacuum evaporation method) and thus the same manufacturing apparatus can be used.

Examples of an n-type semiconductor material included in the photoelectric conversion layer 113 include electron-accepting organic semiconductor materials such as fullerene (e.g., $C_{60}$ and $C_{70}$) and derivatives thereof. Examples of a p-type semiconductor material included in the photoelectric conversion layer 113 include an electron-donating organic semiconductor material such as copper(II) phthalocyanine (CuPc), tetraphenyldibenzoperiflanthene (DBP), or zinc phthalocyanine (ZnPc).

For example, the photoelectric conversion layer 113 can be formed by co-evaporation of an n-type semiconductor and a p-type semiconductor.

Examples of materials that can be used for a gate, a source, and a drain of a transistor and conductive layers such as a variety of wirings and electrodes included in a display device include metals such as aluminum, titanium, chromium, nickel, copper, yttrium, zirconium, molybdenum, silver, tantalum, or tungsten, and an alloy containing any of these metals as its main component. A film containing any of these materials can be used as a single-layer structure or a stacked-layer structure.

As a light-transmitting conductive material, a conductive oxide such as indium oxide, indium tin oxide, indium zinc oxide, zinc oxide, or zinc oxide containing gallium can be used or graphene can be used. Alternatively, a metal material such as gold, silver, platinum, magnesium, nickel, tungsten, chromium, molybdenum, iron, cobalt, copper, palladium, or titanium, or an alloy material containing the metal material can be used. Further alternatively, a nitride of the metal material (e.g., titanium nitride) or the like may be used, for example. Note that in the case of using the metal material or the alloy material (or the nitride thereof), the thickness is preferably set small enough to be able to transmit light. A stacked film of any of the above materials can be used as a conductive layer. For example, a stacked-layer film of indium tin oxide and an alloy of silver and magnesium, or the like is preferably used for higher conductivity. These can also be used for conductive layers such as a variety of wirings or electrodes included in a display device, and conductive layers (conductive layers functioning as a pixel electrode or a common electrode) included in a display element.

As an insulating material that can be used for each insulating layer, for example, a resin such as an acrylic resin or an epoxy resin, and an inorganic insulating material such as silicon oxide, silicon oxynitride, silicon nitride oxide, silicon nitride, or aluminum oxide can be given.

The structures described in this embodiment can be combined as appropriate. For example, structures illustrated in different drawings can be combined as appropriate for implementation.

Note that this embodiment can be combined with any of the other embodiments and examples in this specification and the like as appropriate.

Embodiment 2

Described in this embodiment is a metal oxide (hereinafter also referred to as an oxide semiconductor) that can be used in an OS transistor described in the above embodiment.

The metal oxide preferably contains at least indium or zinc. In particular, indium and zinc are preferably contained. In addition to them, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

<Classification of Crystal Structure>

First, the classification of crystal structures of an oxide semiconductor is described with reference to FIG. 40A. FIG. 40A is a diagram showing the classification of crystal structures of an oxide semiconductor, typically IGZO (a metal oxide containing In, Ga, and Zn).

As shown in FIG. 40A, an oxide semiconductor is roughly classified into "Amorphous", "Crystalline", and "Crystal". "Amorphous" includes completely amorphous. "Crystalline" includes CAAC (c-axis-aligned crystalline), nc (nanocrystalline), and CAC. Note that the term "Crystalline" excludes single crystal, poly crystal, and completely amorphous (excluding single crystal and poly crystal). "Crystal" includes single crystal and poly crystal.

Note that the structures in the thick frame in FIG. 40A are in an intermediate state between "Amorphous" and "Crystal", and belong to a new crystalline phase. That is, these structures are completely different from "Amorphous", which is energetically unstable, and "Crystal".

A crystal structure of a film or a substrate can be analyzed with an X-ray diffraction (XRD) spectrum. Here, XRD spectra of a quartz glass substrate and an IGZO film having a crystal structure classified into "Crystalline" (also referred to as Crystalline IGZO), which are obtained by a GIXD (Grazing-Incidence XRD) measurement, are shown in FIG. 40B and FIG. respectively. Note that a GIXD method is also referred to as a thin film method or a Seemann-Bohlin method. The XRD spectrum obtained by GIXD measurement in each of FIG. 40B and FIG. 40C is hereinafter simply referred to as an XRD spectrum. In each of FIG. 40B and FIG. 40C, the vertical axis represents X-ray intensity (Intensity), and the horizontal axis represents diffraction angle (2θ of X-ray. FIG. 40B shows an XRD spectrum of a quartz glass substrate, and FIG. 40C shows an XRD spectrum of a crystalline IGZO film. Note that the crystalline IGZO film shown in FIG. 40C has a composition in the vicinity of In:Ga:Zn=4:2:3 [atomic ratio]. Furthermore, the crystalline IGZO film shown in FIG. 40C has a thickness of 500 nm.

As indicated by arrows in FIG. 40B, the XRD spectrum of the quartz glass substrate shows a peak with a substantially bilaterally symmetrical shape. In contrast, as indicated by arrows in FIG. 40C, the XRD spectrum of the crystalline IGZO film shows a peak with a bilaterally asymmetrical shape. The asymmetrical peak of the XRD spectrum clearly shows the existence of crystal in the film or the substrate. In other words, the crystal structure of the film or the substrate cannot be regarded as "amorphous" unless it has a bilaterally symmetrical peak in the XRD spectrum. Note that in FIG. 40C, a crystal phase (IGZO crystal phase) is clearly written at 2θ=31° or in the neighborhood thereof. The bilaterally asymmetrical peak of the XRD spectrum is probably attributed to a diffraction peak derived from such a crystal phase (a fine crystal).

Specifically, interference of an X-ray scattered by atoms contained in IGZO probably contributes to a peak at 2θ=34° or in the vicinity thereof. In addition, the fine crystal probably contributes to the peak at 2θ=31° or in the vicinity thereof. In the XRD spectrum of the crystalline IGZO film shown in FIG. 40C, the peak at 2θ of 34° or in the vicinity thereof is wide on the lower angle side. This indicates that the crystalline IGZO film includes a fine crystal attributed to the peak at 2θ of 31° or in the vicinity thereof.

A crystal structure of a film or a substrate can also be evaluated with a diffraction pattern obtained by a nanobeam electron diffraction (NBED) method (such a pattern is also referred to as a nanobeam electron diffraction pattern). Diffraction patterns of the quartz glass substrate and the IGZO film formed with a substrate temperature set at room temperature are shown in FIG. 40D and FIG. 40E, respectively. FIG. 40D shows the diffraction pattern of the quartz glass substrate and FIG. 40E shows the diffraction pattern of the IGZO film. Note that the IGZO film shown in FIG. 40E is formed by a sputtering method using an In—Ga—Zn oxide target with In:Ga:Zn=1:1:1 [atomic ratio]. In the nanobeam electron diffraction method, electron diffraction is performed with a probe diameter of 1 nm.

Note that as shown in FIG. 40D, a halo pattern is observed in the diffraction pattern of the quartz glass substrate, which indicates that the quartz glass substrate is in an amorphous state. As shown in FIG. 40E, not a halo pattern but a spot-like pattern is observed in the diffraction pattern of the IGZO film formed at room temperature. Thus, it is suggested that the IGZO film formed at room temperature is in an intermediate state, which is neither a crystal state nor an amorphous state, and it cannot be concluded that the IGZO film is in an amorphous state.

<<Structure of Oxide Semiconductor>>

Oxide semiconductors may be classified in a manner different from that in FIG. 40A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which layers containing indium (In) and oxygen (hereinafter In layers) and layers containing the element M, zinc (Zn), and oxygen (hereinafter (M,Zn) layers) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using 19120 scanning, for example, a peak indicating c-axis alignment is detected at 2θ of 31° or around 31°. Note that the position of the peak indicating c-axis alignment (the value of 2θ may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, or the like are included in the distortion in some cases. Note that a clear crystal grain boundary (grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of oxygen atoms arranged in the a-b plane direction, an interatomic bond distance changed by substitution of a metal atom, or the like.

A crystal structure in which a clear crystal grain boundary is observed is what is called polycrystal. It is highly probable that the crystal grain boundary becomes a recombination center and traps carriers and thus decreases the on-state current or field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, reduction in electron mobility due to the crystal grain boundary is less likely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor with some analysis methods in some cases. For example, when an nc-OS film is subjected to structural analysis using out-of-plane XRD measurement with an XRD apparatus using 0120 scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter greater than a nanocrystal (e.g., greater than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or less than the size of a nanocrystal (e.g., greater than or equal to 1 nm and less than or equal to 30 nm).

[A-Like OS]

The a-like OS is an oxide semiconductor having a structure between those of the nc-OS and the amorphous oxide semiconductor. The a-like OS includes a void or a low-density region. That is, the a-like OS has low crystallinity as compared with the nc-OS and the CAAC-OS. Moreover, the a-like OS has higher hydrogen concentration in the film than the nc-OS and the CAAC-OS.

<<Composition of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) with a size greater than or equal to 0.5 nm and less than or equal to 10 nm, preferably greater than or equal to 1 nm and less than or equal to 3 nm, or a similar size are mixed in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. As another example, the first region has higher [In] than the second region and lower [Ga] than the second region. Moreover, the second region has higher [Ga] than the first region and has lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

In a material composition of a CAC-OS in an In—Ga—Zn oxide that contains In, Ga, Zn, and O, regions containing Ga as a main component are observed in part of the CAC-OS and regions containing In as a main component are observed in part thereof. These regions are randomly present to form a mosaic pattern. Thus, it is suggested that the CAC-OS has a structure in which metal elements are unevenly distributed.

The CAC-OS can be formed by a sputtering method under conditions where intentional heating is not performed on a substrate, for example. Moreover, in the case of forming the CAC-OS by a sputtering method, any one or more selected from an inert gas (typically, argon), an oxygen gas, and a nitrogen gas may be used as a deposition gas. The ratio of the flow rate of an oxygen gas to the total flow rate of the deposition gas in deposition is preferably as low as possible, and for example, the ratio of the flow rate of an oxygen gas to the total flow rate of the deposition gas in deposition is preferably higher than or equal to 0% and less than 30%, further preferably higher than or equal to 0% and less than or equal to 10%.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

Here, the first region has a higher conductivity than the second region. In other words, when carriers flow through the first region, the conductivity of a metal oxide is exhibited. Accordingly, when the first regions are distributed in a metal oxide as a cloud, high field-effect mobility ($\mu$) can be achieved.

The second region has a higher insulating property than the first region. In other words, when the second regions are distributed in a metal oxide, a leakage current can be inhibited.

Thus, in the case where the CAC-OS is used for a transistor, a switching function (on/off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, a high on-state current ($I_{on}$), high field-effect mobility ($\mu$), and an excellent switching operation can be achieved.

A transistor using a CAC-OS has high reliability. Thus, the CAC-OS is suitably used in a variety of semiconductor devices typified by a display.

An oxide semiconductor has various structures with different properties. Two or more kinds of the amorphous oxide semiconductor, the polycrystalline oxide semiconductor, the a-like OS, the CAC-OS, the nc-OS, and the CAAC-OS may be included in the oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor with a low carrier concentration is preferably used for a transistor. For example, the carrier concentration of an oxide semiconductor is lower than or equal to $1\times10^{17}$ cm$^{-3}$, preferably lower than or equal to $1\times10$ 15 cm$^{-3}$, further preferably lower than or equal to $1\times10^{13}$ cm$^{-3}$, still further preferably lower than or equal to $1\times10^{11}$ cm', yet further preferably lower than $1\times10^{10}$ cm$^{-3}$, and higher than or equal to $1\times10^{-9}$ cm$^{-3}$. In order to reduce the carrier concentration in an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state.

Note that an oxide semiconductor with a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/cm 3, preferably lower than or equal to $2\times10^{17}$ atoms/cm 3.

When the oxide semiconductor contains an alkali metal or an alkaline earth metal, defect states are formed and carriers are generated in some cases. Thus, a transistor including an oxide semiconductor that contains an alkali metal or an alkaline earth metal is likely to have normally-on characteristics. Thus, the concentration of an alkali metal or an alkaline earth metal in the oxide semiconductor, which is obtained using SIMS, is set lower than or equal to $1\times10^{18}$ atoms/cm 3, preferably lower than or equal to $2\times10^{16}$ atoms/cm 3.

Furthermore, when the oxide semiconductor contains nitrogen, the oxide semiconductor easily becomes n-type by generation of electrons serving as carriers and an increase in carrier concentration. As a result, a transistor including an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained using SIMS, is set lower than $5\times10^{19}$ atoms/cm 3, preferably lower than or equal to $5\times10^{18}$ atoms/cm 3, further preferably lower than or equal to $1\times10^{18}$ atoms/cm 3, still further preferably lower than or equal to $5\times10^{17}$ atoms/cm 3.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained using SIMS, is set lower than $1\times10^{20}$ atoms/cm 3, preferably lower than $1\times10^{19}$ atoms/cm 3, further preferably lower than $5\times10^{18}$ atoms/cm 3, still further preferably lower than $1\times10^{18}$ atoms/cm 3.

When an oxide semiconductor with sufficiently reduced impurities is used for the channel formation region of the transistor, stable electrical characteristics can be given.

Note that this embodiment can be combined with any of other embodiments and examples in this specification and the like as appropriate.

Embodiment 3

In this embodiment, electronic devices having the semiconductor device of one embodiment of the present invention are described.

The semiconductor device of one embodiment of the present invention can be provided in a variety of semiconductor devices. For example, the semiconductor device of one embodiment of the present invention can be provided in a digital camera, a digital video camera, a digital photo frame, a portable game console, a portable information terminal, and an audio reproducing device, in addition to electronic devices with a relatively large screen, such as a television device, a desktop or laptop personal computer, a tablet personal computer, a computer monitor, digital signage, and a pachinko machine. Structure examples of electronic device in which the semiconductor device of one embodiment of the present invention can be provided are described with reference to FIG. 41A to FIG. 41D.

Figure 41A:
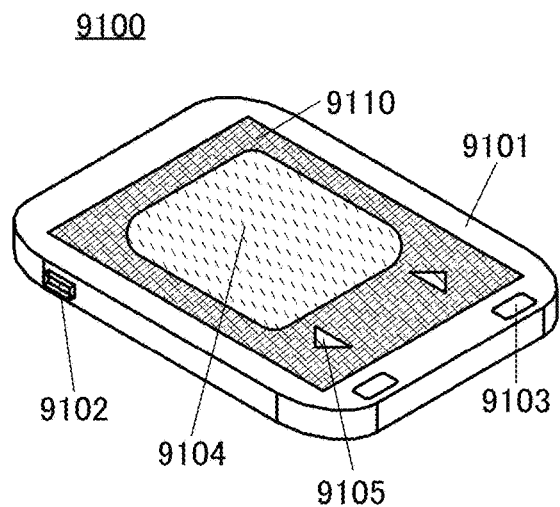
FIG. 41A to FIG. 41D are diagrams showing examples of electronic devices.

FIG. 41A is a diagram illustrating an example of a portable information terminal 9100. The portable information terminal 9100 includes a display portion 9110, a housing 9101, a key 9102, a speaker 9103, and the like. The portable information terminal 9100 can be a tablet, for example. The key such as the key 9102 can be a key for switching on/off of the power source.

That is, the key such as the key 9102 can be a power switch, for example. The key such as the key 9102 can be an operation key to allow an electron device to conduct a desired operation, for example.

The display portion 9110 can display information 9104, operation buttons (also referred to as operation icons or simply icons) 9105, and the like.

The portable information terminal 9100 in which the semiconductor device of one embodiment of the present invention is provided can perform authentication such as fingerprint authentication in a short time and with a high accuracy.

Figure 41B:
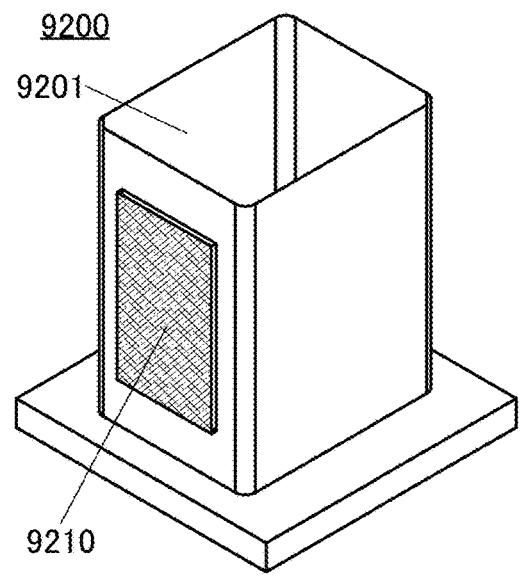

FIG. 41B is a diagram illustrating an example of a digital signage 9200. The digital signage 9200 can be configured such that a display portion 9210 is attached to a column 9201.

The digital signage 9200 in which the semiconductor device of one embodiment of the present invention is provided can perform authentication such as fingerprint authentication in a short time and with a high accuracy.

Figure 41C:
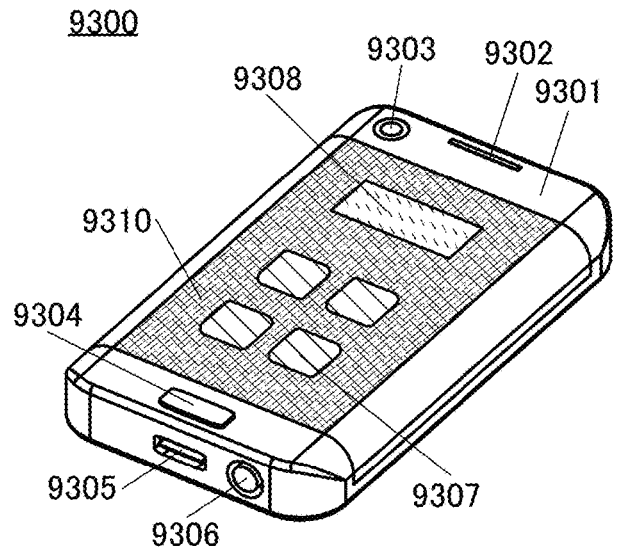

FIG. 41C is a diagram illustrating an example of a portable information terminal 9300. The portable information terminal 9300 includes a display portion 9310, a housing 9301, a speaker 9302, a camera 9303, a key 9304, a connection terminal 9305, a connection terminal 9306, and the like. For example, the portable information terminal 9300 can be a smartphone. Note that the connection terminal 9305 can be a micro USB terminal, a lightning terminal, or a Type-C terminal, or the like. The connection terminal 9306 can be an earphone jack, for example.

The display portion 9310 can display, for example, an operation button 9307. The display portion 9310 can also display information 9308. Note that examples of the information 9308 include display indicating reception of an e-mail, an SNS (social networking service), a telephone call, and the like, the title of an e-mail, an SNS, or the like, the sender of an e-mail, an SNS, or the like, date, time, remaining battery, and reception strength of an antenna.

The portable information terminal 9300 in which the semiconductor device of one embodiment of the present invention is provided can perform authentication such as fingerprint authentication in a short time and with a high accuracy.

Figure 41D:
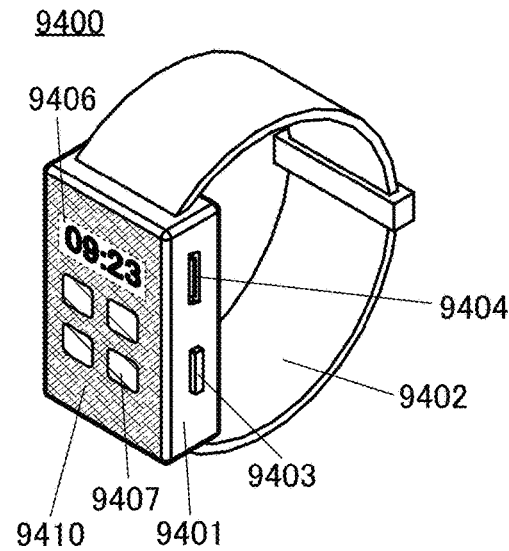

FIG. 41D is a diagram illustrating an example of a watch-type portable information terminal 9400. The portable information terminal 9400 includes a display portion 9410, a housing 9401, a wristband 9402, a key 9403, a connection terminal 9404, and the like. Note that the connection terminal 9404 can be a micro USB terminal, a lightning terminal, or a Type-C terminal, or the like, for example, as in the case of the connection terminal 9305.

The display portion 9410 can display information 9406, operation buttons 9407, and the like. FIG. 41D illustrates an example in which time is displayed on the display portion 9410 as the information 9406.

The portable information terminal 9400 in which the semiconductor device of one embodiment of the present invention is provided can perform authentication such as fingerprint authentication in a short time and with a high accuracy.

Note that this embodiment can be combined with any of the other embodiments and examples in this specification and the like as appropriate.

Example 1

In this example, the results of simulation of a shift register circuit included in a semiconductor device of one embodiment of the present invention are described.

In this example, the operation illustrated in FIG. 13 is simulated and then the operation illustrated in FIG. 14 is simulated, assuming that the shift register circuit has the structure illustrated in FIG. 10. In addition, the operation illustrated in FIG. 21 is simulated and then the operation illustrated in FIG. 22 is simulated, assuming that the shift register circuit has the structure illustrated in FIG. 20. Moreover, the operation illustrated in FIG. 24 is simulated and then the operation illustrated in FIG. 25 is simulated, assuming that the shift register circuit has the structure illustrated in FIG. 23. Here, m is 8. In other words, the shift register circuit assumed in this example includes the register circuit R[1] to the register circuit R[8]. In addition, p is 3 and q is 6.

Figure 42A:
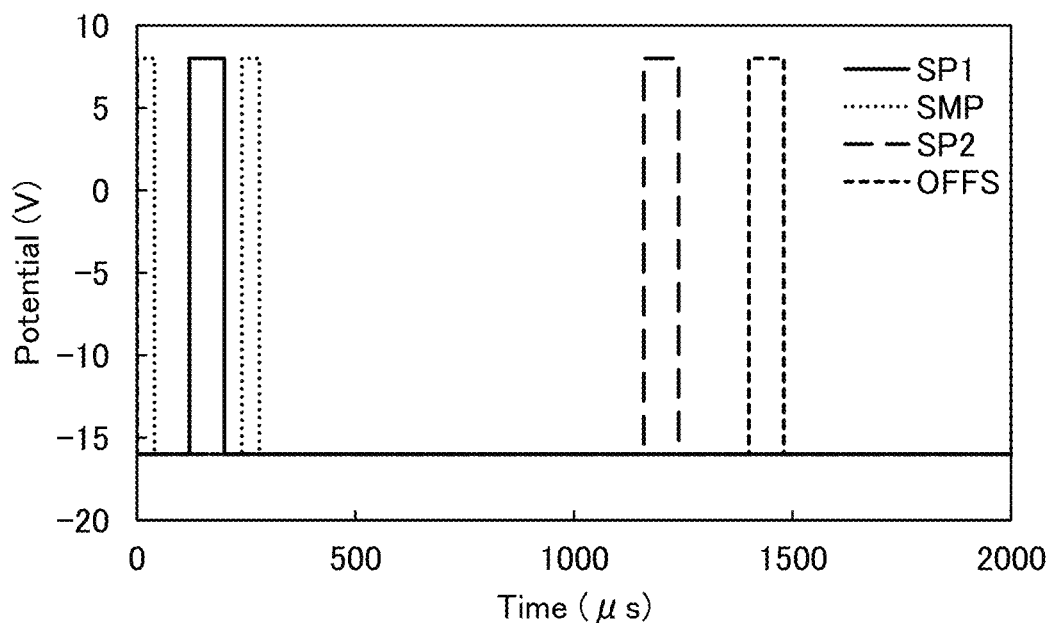
FIG. 42A and FIG. 42B are graphs showing potential changes over time.
Figure 42B:
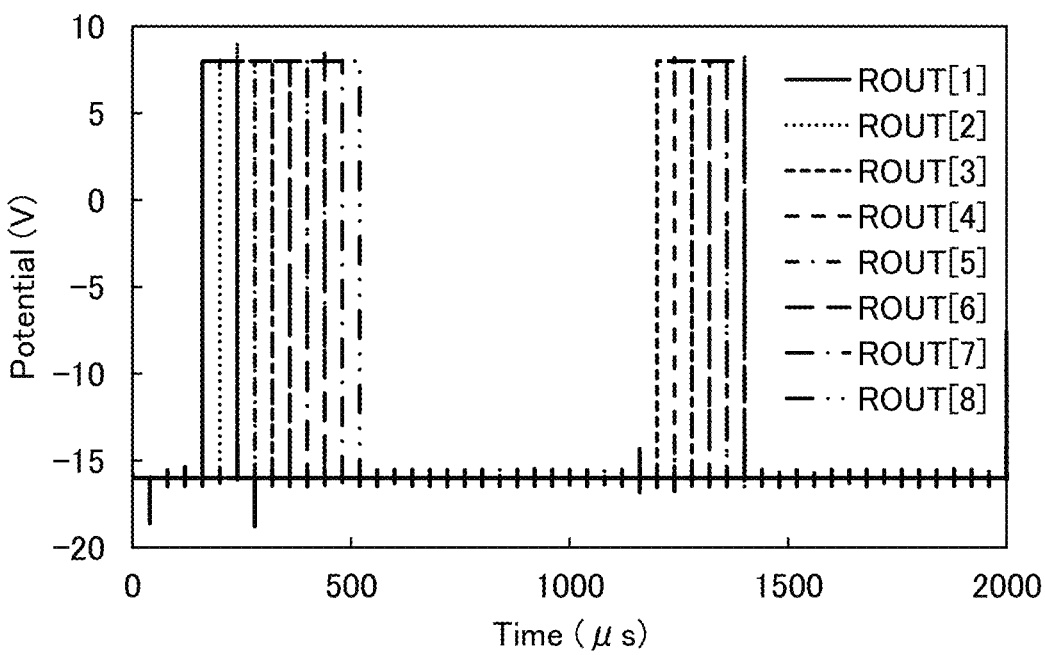

FIG. 42A and FIG. 42B are graphs showing potential changes over time of the terminals in the case where the operation illustrated in FIG. 13 is simulated and then the operation illustrated in FIG. 14 is simulated, assuming that the shift register circuit has the structure illustrated in FIG. 10. Specifically, FIG. 42A shows potentials of the terminal SP1, the terminal SMP, the terminal SP2, and the terminal OFFS, which are terminals electrically connected to the input terminals of the register circuit R or the input terminals of the latch circuit LAT. FIG. 42B shows potentials of the terminal ROUT[1] to the terminal ROUT[8], which are terminals electrically connected to the output terminals of the register circuit R[1] to register circuit R[8].

Figure 43A:
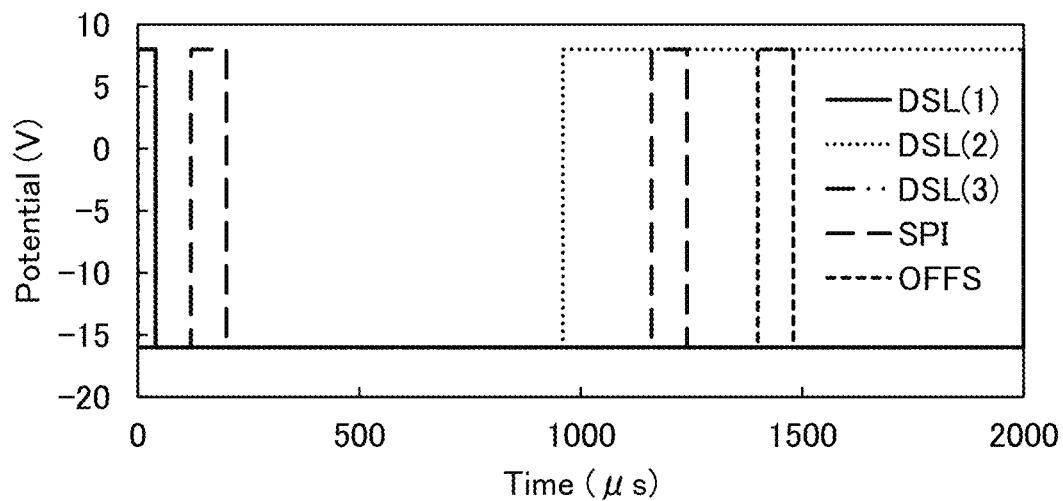
FIG. 43A and FIG. 43B are graphs showing potential changes over time.
Figure 43B:
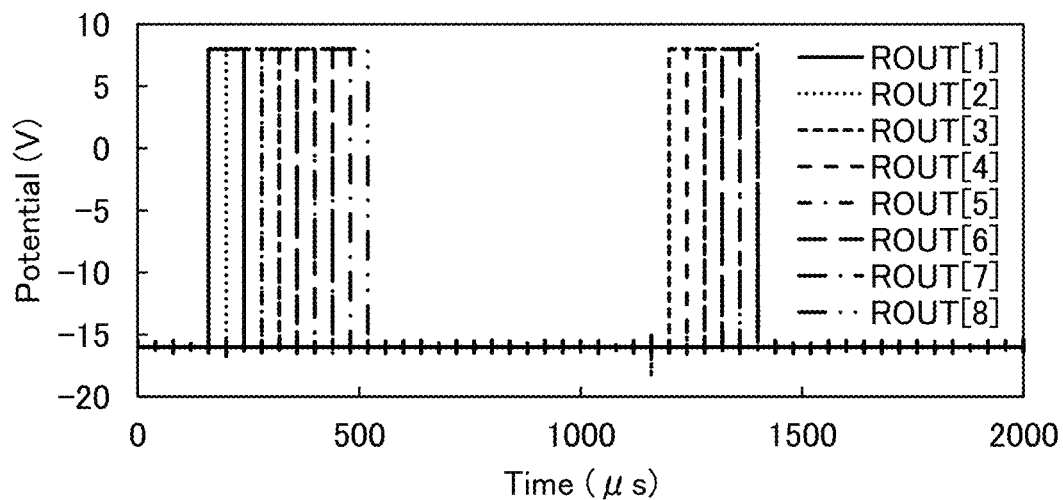

FIG. 43A and FIG. 43B are graphs showing potential changes over time of the terminals in the case where the operation illustrated in FIG. 21 is simulated and then the operation illustrated in FIG. 22 is simulated, assuming that the shift register circuit has the structure illustrated in FIG. 20. Specifically, FIG. 43A shows the potentials of the terminal DSL(1), the terminal DSL(2), the terminal DSL(3), the terminal SPI, and the terminal OFFS, which are terminals electrically connected to the demultiplexer circuit DeMUX or the register circuit R. FIG. 43B shows the potentials of the terminal ROUT[1] to the terminal ROUT[8], which are terminals electrically connected to the output terminals of the register circuit R[1] to register circuit R[8].

Figure 44A:
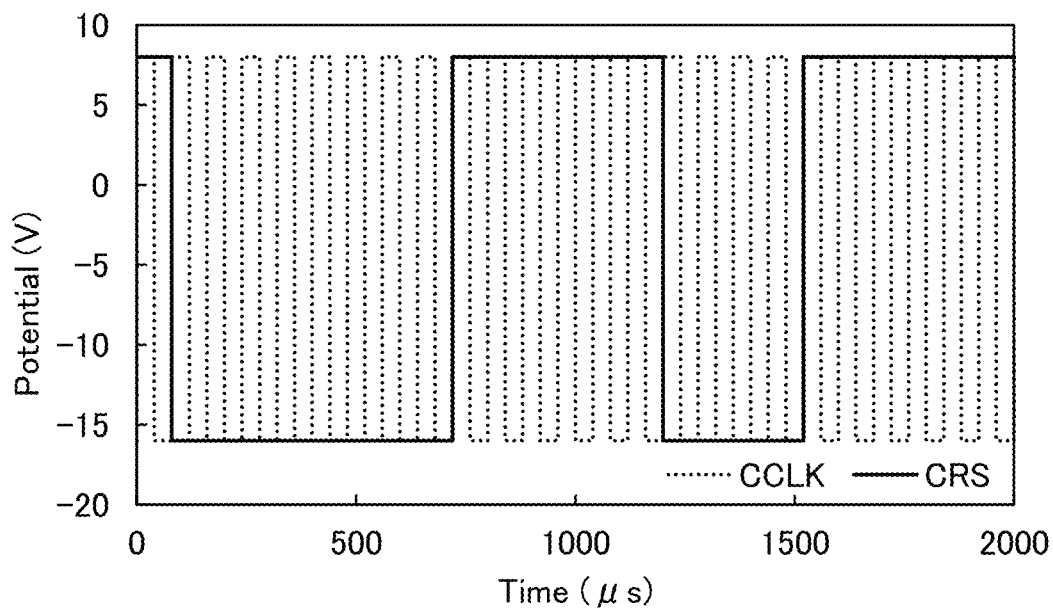
FIG. 44A and FIG. 44B are graphs showing potential changes over time.
Figure 44B:
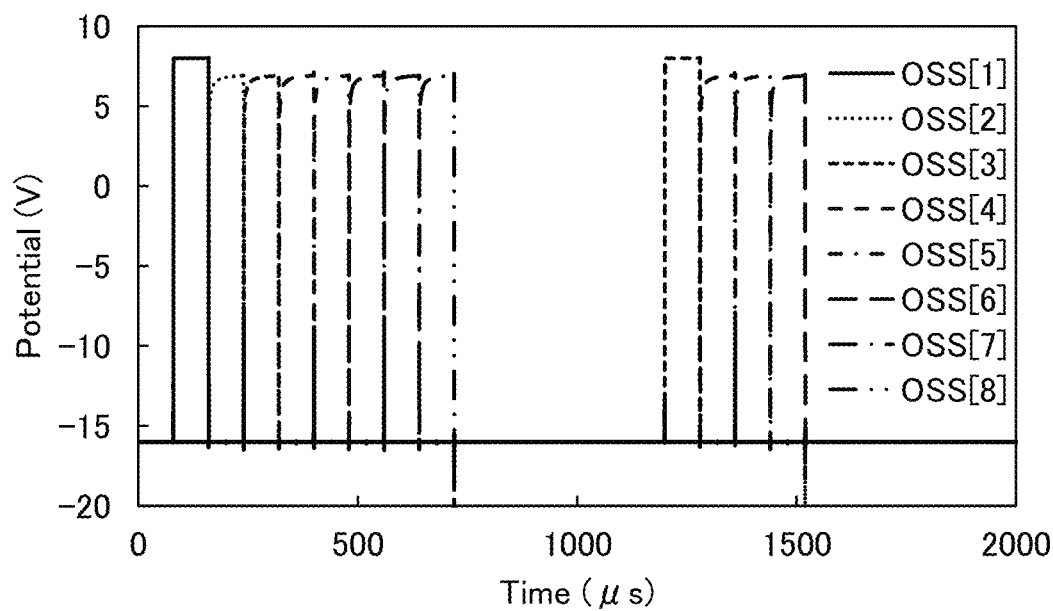

FIG. 44A and FIG. 44B are graphs showing potential changes over time of the terminals in the case where the operation illustrated in FIG. 24 is simulated and then the operation illustrated in FIG. 25 is simulated, assuming that the shift register circuit has the structure illustrated in FIG. 23. Specifically, FIG. 44A shows the potentials of the terminal CCLK and the terminal CRS, which are terminals electrically connected to the input terminals of the counter circuit CNT. FIG. 44B shows the potentials of the terminal OSS[1] to the terminal OSS[8], which are terminals electrically connected to the output terminals of the register circuit R[1] to register circuit R[8].

In the shift register circuit having any structure of FIG. 10, FIG. 20, and FIG. 23, it is confirmed by simulations that signals are output from the register circuit R[3] to the register circuit [6] after signals are output from the register circuit R[1] to the register circuit [8]. Thus, it is confirmed that the shift register circuit illustrated in FIG. 10, the shift register circuit illustrated in FIG. 20, and the shift register circuit illustrated in FIG. 23 can all perform desired operations in simulations.

This example can be combined with any of the other embodiments and examples in this specification and the like as appropriate.

Example 2

In this example, the results of simulation of a shift register circuit included in a semiconductor device of one embodiment of the present invention are described.

Figure 45:
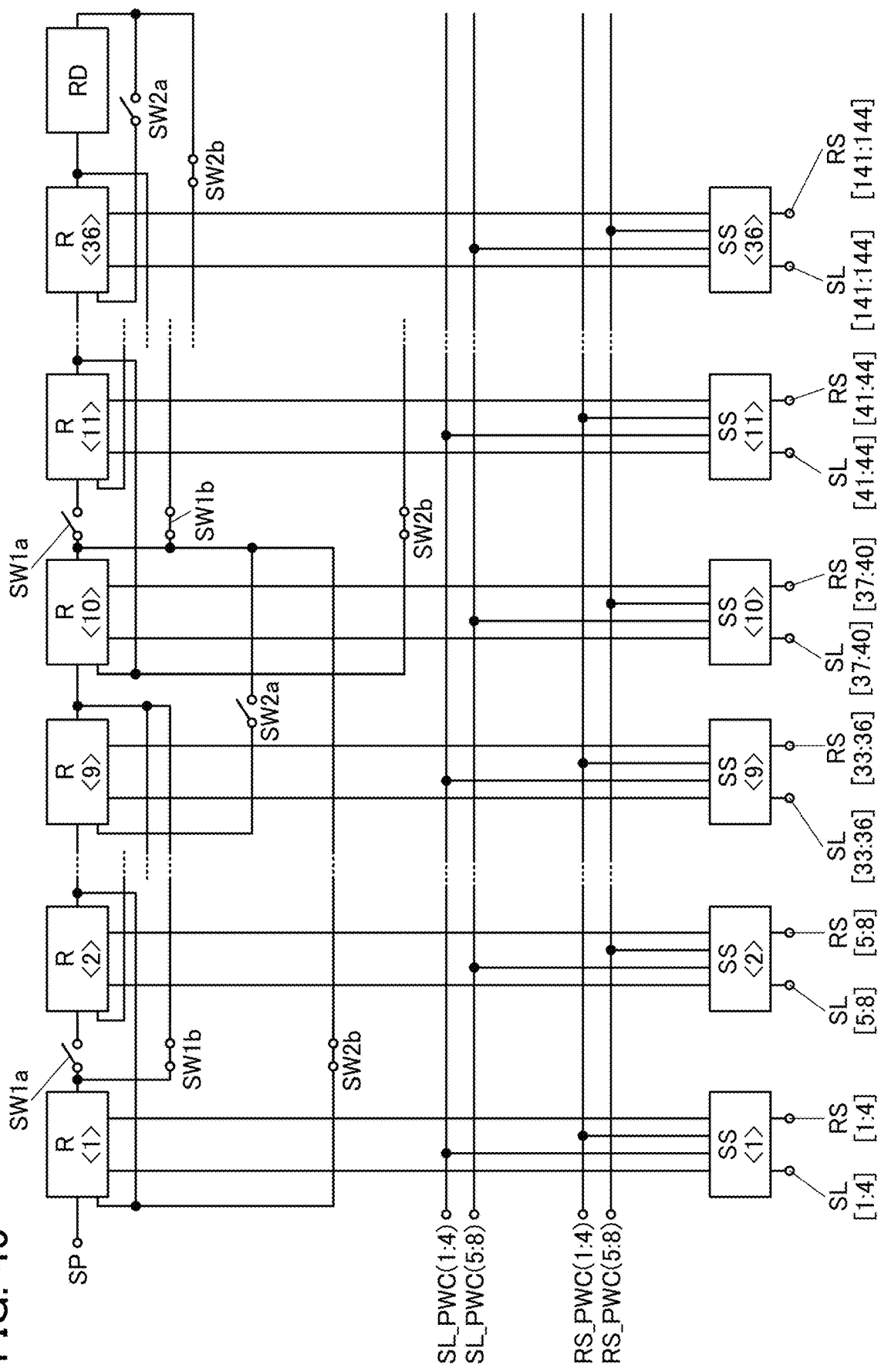
FIG. 45 is a block diagram illustrating a structure of an imaging unit in Example.

FIG. 45 is a schematic diagram of a shift register circuit used for simulations in this example. The shift register circuit illustrated in FIG. 45 corresponds to the shift register circuit illustrated in FIG. 26 in Embodiment 1.

As illustrated in FIG. 45, the structure of the shift register circuit in this example includes the register circuit R<1> to the register circuit R<36>, the register circuit RD, the switch SW1a, the switch SW1b, the switch SW2a, the switch SW2b, and the signal supply circuit SS<1> to the signal supply circuit SS<36>.

The terminal SP is electrically connected to the input terminal of the register circuit R<1>. The register circuit R<1> to the register circuit R<36> are electrically connected in series via the switch SW1a every nine register circuits R. In addition, the register circuit R<1>, the register circuit R<10>, the register circuit R<19>, and the register circuit R<28> are electrically connected in series via the switch SW1b. An output terminal of the register circuit R<36> is electrically connected to the input terminal of the register circuit RD.

An output terminal of the register circuit R<10> is electrically connected to an input terminal of the register circuit R<9> via the switch SW2a and is electrically connected to the input terminal of the register circuit R<1> via the switch SW2b. An output terminal of the register circuit R<19> is electrically connected to an input terminal of the register circuit R<18> via the switch SW2a and is electrically connected to an input terminal of the register circuit R<10> via the switch SW2b. An output terminal of the register circuit R<28> is electrically connected to an input terminal of the register circuit R<27> via the switch SW2a and is electrically connected to an input terminal of the register circuit R<19> via the switch SW2b. The output terminal of the register circuit RD is electrically connected to an input terminal of the register circuit R<36> via the switch SW2a and is electrically connected to an input terminal of the register circuit R<28> via the switch SW2b.

The terminal SL_PWC(1) to the terminal SL_PWC(4) and the terminal RS_PWC(1) to the terminal RS_PWC(4) are electrically connected to input terminals of the odd-numbered signal supply circuit SS of the signal supply circuit SS<1> to the signal supply circuit SS<36>. On the other hand, the terminal SL_PWC(5) to the terminal SL_PWC(8) and the terminal RS_PWC(5) to the terminal RS_PWC(8) are electrically connected to input terminals of the even-numbered signal supply circuit SS of the signal supply circuit SS<1> to the signal supply circuit SS<36>.

Four terminals SL and four terminals RS are electrically connected to output terminals of each of the signal supply circuits SS. For example, terminals SL[1:4] and terminals RS[1:4] are electrically connected to the output terminals of the signal supply circuit SS<1>. In addition, terminals SL[141:144] and terminals RS[141:144] are electrically connected to the output terminals of the signal supply circuit SS<36>.

Here, as illustrated in FIG. 45, in this example, the switch SW1a and the switch SW2a are in off states and the switch SW1b and the switch SW2b are in on states. Then, an operation corresponding to the operation illustrated in FIG. 31 in Embodiment 1 is simulated.

Figure 46A:
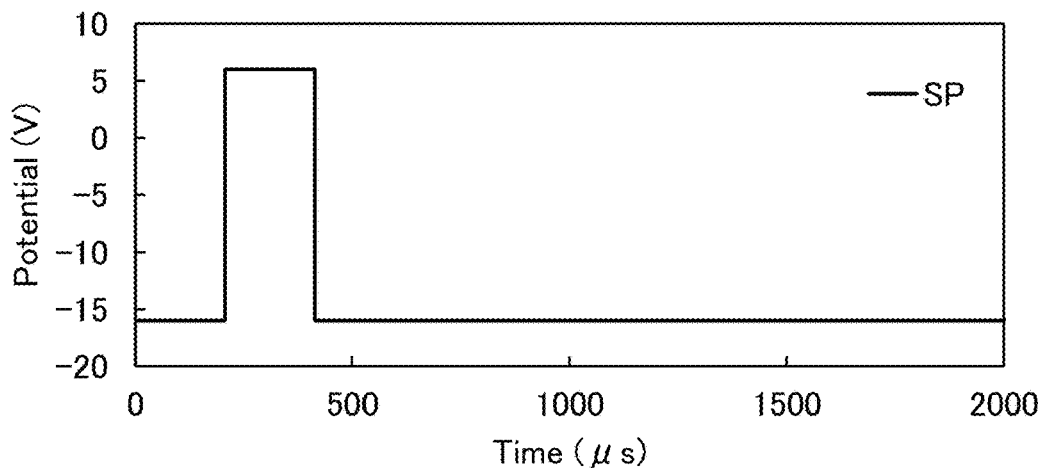
FIG. 46A to FIG. 46C are graphs showing potential changes over time.
Figure 46B:
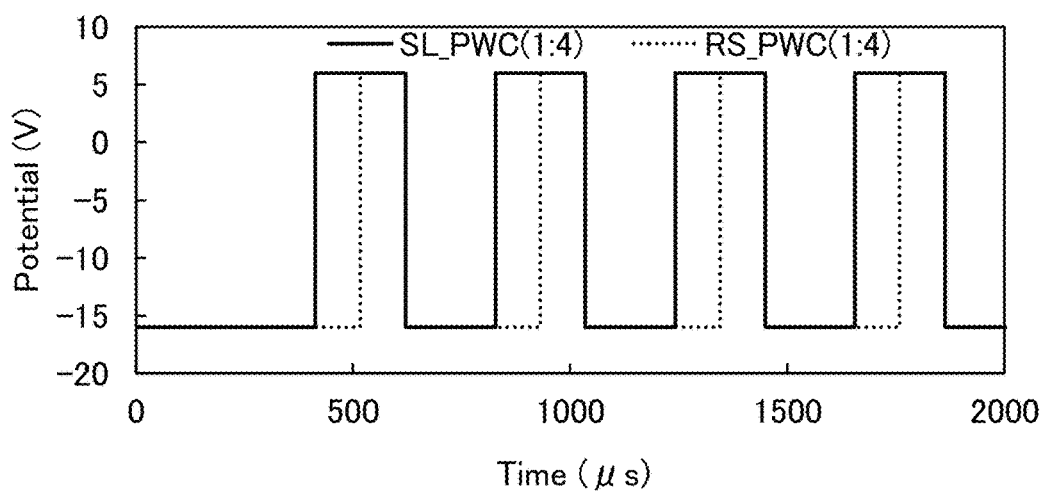
Figure 46C:
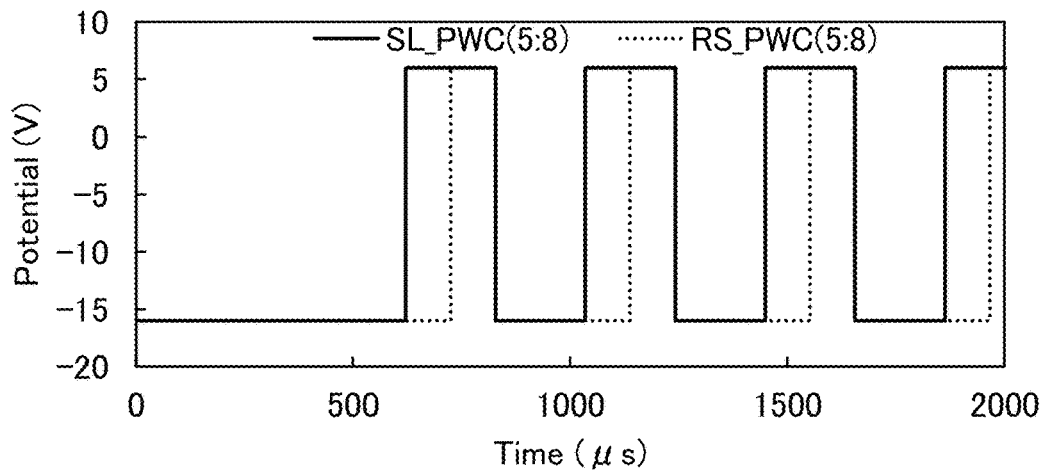

FIG. 46A to FIG. 46C are graphs showing potential changes over time of the terminals that are electrically connected to the input terminal of the register circuit R or the input terminals of the signal supply circuit SS. Specifically, FIG. 46A is a graph showing a potential change over time of the terminal SP. FIG. 46B is a graph showing potential changes over time of the terminal SL_PWC(1) to the terminal SL_PWC(4) and the terminal RS_PWC(1) to the terminal RS_PWC(4), and FIG. 46C is a graph showing potential changes over time of the terminal SL_PWC(5) to the terminal SL_PWC(8) and the terminal RS_PWC(5) to the terminal RS_PWC(8).

In this example, a high-potential start pulse signal is input to the terminal SP first as shown in FIG. 46A to FIG. 46C. After that, inputs of high-potential selection signals to the terminal SL_PWC(1) to the terminal SL_PWC(4) and inputs of high-potential reset signals to the terminal RS_PWC(1) to the terminal RS_PWC(4) are performed alternately with inputs of high-potential selection signals to the terminal SL_PWC(5) to the terminal SL_PWC(8) and inputs of high-potential reset signals to the terminal RS_PWC(5) to the terminal RS_PWC(8). Note that in this example, the high potential is set to 6 V.

Figure 47A:
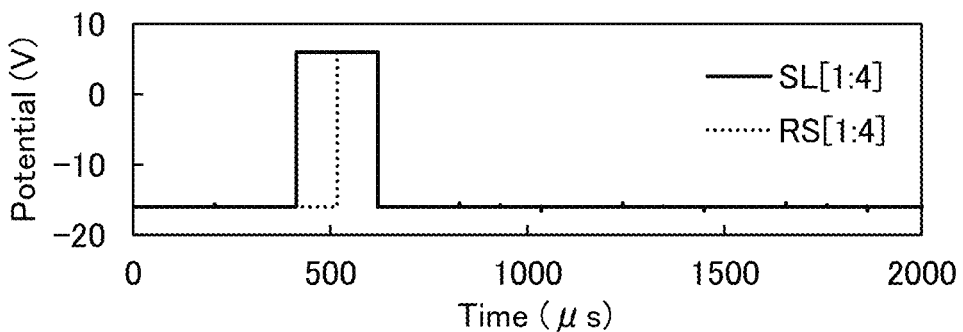
FIG. 47A to FIG. 47D are graphs showing potential changes over time.
Figure 47B:
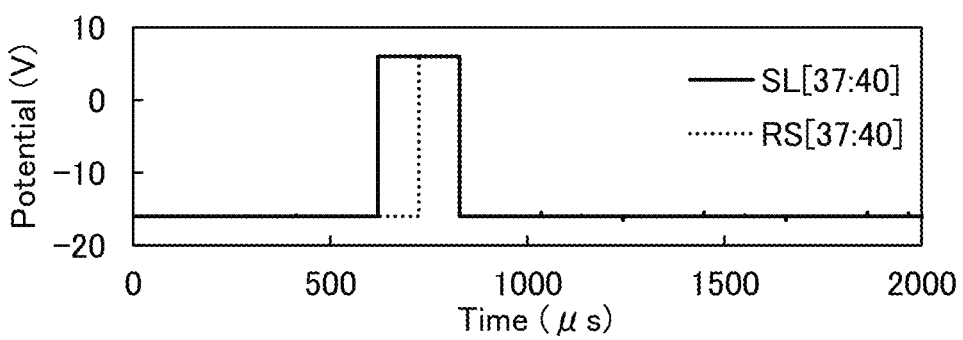
Figure 47C:
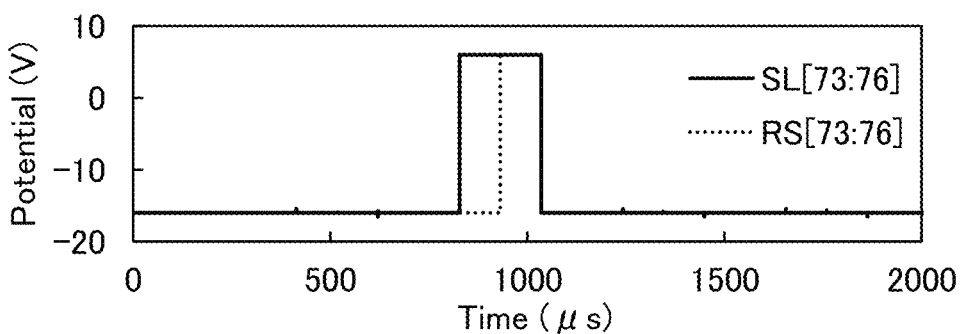
Figure 47D:
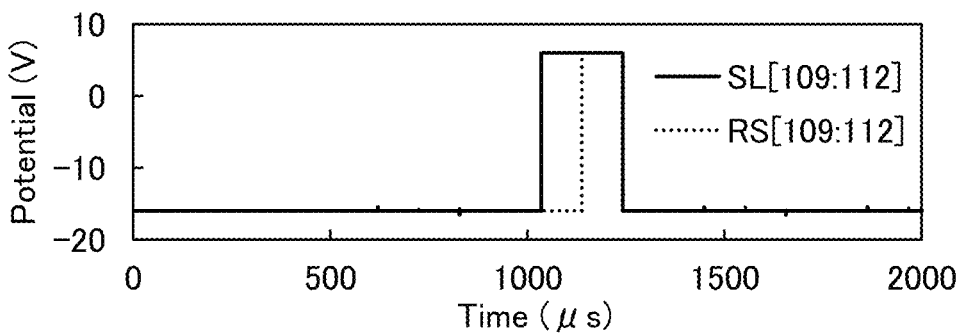

FIG. 47A to FIG. 47D are graphs showing potential changes over time of the terminal SL and the terminal RS. Specifically, FIG. 47A is a graph showing potential changes over time of the terminal SL[1] to the terminal SL[4] and the terminal RS[1] to the terminal RS[4]. FIG. 47B is a graph showing potential changes over time of the terminal SL[37] to the terminal SL[40] and the terminal RS[37] to the terminal RS[40]. FIG. 47C is a graph showing potential changes over time of the terminal SL[73] to the terminal SL[76] and the terminal RS[73] to the terminal RS[76]. FIG. 47D is a graph showing potential changes over time of the terminal SL[109] to the terminal SL[112] and the terminal RS[109] to the terminal RS[112].

According to FIG. 47A to FIG. 47D, it is confirmed by the simulation that the high-potential selection signals are sequentially output to the terminal SL[1] to the terminal SL[4], the terminal SL[37] to the terminal SL[40], the terminal SL[73] to the terminal SL[76], and the terminal SL[109] to the terminal SL[112]. Moreover, it is confirmed by the simulation that the high-potential reset signals are sequentially output to the terminal RS[1] to the terminal RS[4], the terminal RS[37] to the terminal RS[40], the terminal RS[73] to the terminal RS[76], and the terminal RS[109] to the terminal RS[112]. Here, in the simulation in this example, no high-potential signals are output from the terminals, which are not shown in FIG. 47A to FIG. 47D, of the terminal SL[1] to the terminal SL[144] and the terminal RS[1] to the terminal RS[144]

As described above, it is confirmed that the shift register circuit illustrated in FIG. 45 can perform a desired operation in the simulations.

This example can be combined with any of the other embodiments and examples in this specification as appropriate.

REFERENCE NUMERALS

10 semiconductor device, 11: substrate, 12: substrate, 13: light-emitting unit, 15: imaging unit, 23: light, 24*a*: light, 24*b*: reflected light, 25: light, 27: finger, 29: fingerprint, 30: pixel portion, 30R: pixel portion, 31: pixel, 32: control circuit, 33: row driver circuit, 34: CDS circuit, 36: circuit, 37: detection circuit, 41: wiring, 43: wiring, 44: wiring, 45: wiring, 46: wiring, 47: wiring, 48: wiring, 49: wiring, 50: light-receiving element, 51: transistor, 52: transistor, 53: transistor, 54: transistor, 56: capacitor, 57: capacitor, 60: circuit, 70: finger, 71: fingerprint, 80: pixel, 81: pixel, 82: pixel, 82E: light source, 83: gate driver circuit, 84: pixel portion, 86: data driver circuit, 110: light-receiving element, 111: pixel electrode, 112: common layer, 113: photoelectric conversion layer, 114: common layer, 115: common electrode, 141: transistor, 142: transistor, 143: space, 148: light-blocking layer, 149: filter, 151: substrate, 152: substrate, 162: display portion, 164a: circuit, 164b: circuit, 165: wiring, 165a: wiring, 165b: wiring, 166: conductive layer, 172a: FPC, 172b: FPC, 173a: IC, 173b: IC, 180: light-emitting element, 183: light-emitting layer, 190: light-emitting element, 191: pixel electrode, 193: light-emitting layer, 195: protective layer, 201: transistor, 204: connection portion, 211: insulating layer, 213: insulating layer, 214: insulating layer, 215: insulating layer, 216: partition, 221: conductive layer, 222a: conductive layer, 222b: conductive layer, 223: conductive layer, 228: region, 231: semiconductor layer, 242: adhesive layer, 244: connection layer, 9100: portable information terminal, 9101: housing, 9102: key, 9103: speaker, 9104: information, 9110: display portion, 9200: digital signage, 9201: column, 9210: display portion, 9300: portable information terminal, 9301: housing, 9302: speaker, 9303: camera, 9304: key, 9305: connection terminal, 9306: connection terminal, 9307: operation button, 9308: information, 9310: display portion, 9400: portable information terminal, 9401: housing, 9402: wristband, 9403: key, 9404: connection terminal, 9406: information, 9407: operation button, 9410: display portion

The invention claimed is:

1. A semiconductor device comprising a light-emitting unit and an imaging unit,
wherein the imaging unit comprises a first register circuit, a second register circuit, and a latch circuit,
wherein the first register circuit is configured to output a scan signal,
wherein the scan signal and a start pulse signal are input to the latch circuit, and
wherein the latch circuit is configured to output one of the scan signal and the start pulse signal to the second register circuit on the basis of data held in the latch circuit.

2. The semiconductor device according to claim 1,
wherein each of the first register circuit, the second register circuit, and the latch circuit comprises a transistor, and
wherein the transistor comprises a metal oxide in a channel formation region.

3. A semiconductor device comprising a light-emitting unit and an imaging unit,
wherein the imaging unit comprises first to m-th latch circuits (m is an integer greater than or equal to 2) and first to m-th register circuits,
wherein a first start pulse signal is input to the first latch circuit,
wherein a second start pulse signal is input to the first to m-th latch circuits,
wherein scan signals output from the first to (m−1)-th register circuits are input to the second to m-th latch circuits respectively,
wherein the first latch circuit is configured to output one of the first start pulse signal and the second start pulse signal to the first register circuit on the basis of data held in the first latch circuit, and
wherein the second to m-th latch circuits are configured to output one of the scan signal and the second start pulse signal to the second to m-th register circuits, respectively, on the basis of data held in the second to m-th latch circuits.

4. The semiconductor device according to claim 3,
wherein the imaging unit is configured to be driven in a first mode in which the first latch circuit outputs the first start pulse signal and the second to m-th latch circuits output the scan signals,
wherein the imaging unit is configured to be driven in a second mode in which any of the first to m-th latch circuits outputs the second start pulse signal, and
wherein a transmission rate of the scan signal in the first mode is higher than a transmission rate of the scan signal in the second mode.

5. The semiconductor device according to claim 4,
wherein in the second mode, the first latch circuit does not output the first start pulse signal.

6. The semiconductor device according to claim 4,
wherein when in the second mode, a p-th latch circuit (p is an integer greater than or equal to 2 and less than or equal to m) outputs the second start pulse signal, the first latch circuit outputs neither the first start pulse signal nor the second start pulse signal, and the second to (p−1)-th latch circuits output neither the scan signal nor the second start pulse signal.

7. The semiconductor device according to claim 3,
wherein the imaging unit comprises a pixel portion in which pixels are arranged in matrix with m rows and n columns (n is an integer greater than or equal to 1), a detection circuit, and a control circuit,
wherein the detection circuit is configured to detect an object touching the pixel portion, and
wherein the control circuit is configured to generate the data to be written to the first to m-th latch circuits on the basis of a result of the detection.

8. The semiconductor device according to claim 3,
wherein each of the first to m-th latch circuits and the first to m-th register circuits comprises a transistor, and
wherein the transistor comprises a metal oxide in a channel formation region.

9. An electronic device comprising:
the semiconductor device according to claim 3, and
an operation button.

10. A method for driving a semiconductor device comprising a light-emitting unit and an imaging unit,
wherein the imaging unit comprises a shift register circuit in which first to m-th latch circuits (m is an integer greater than or equal to 2) and first to m-th register circuits are connected in series alternately, comprising:
inputting a first start pulse signal to the first register circuit via the first latch circuit in a first period;
outputting a first scan signal from the first register circuit and sequentially transferring the first scan signal to the second to m-th register circuits via the second to m-th latch circuits in a second period;
writing data in a p-th latch circuit (p is any of integers greater than or equal to 1 and less than m) after inputting the first start pulse signal to the first latch circuit in a third period;
inputting the second start pulse signal to a p-th register circuit via the p-th latch circuit in a fourth period;
outputting a second scan signal from the p-th register circuit and transferring the second scan signal to a (p+1)-th register circuit via a (p+1)-th latch circuit in a fifth period; and
wherein a transmission rate of the first scan signal is higher than a transmission rate of the second scan signal.

11. The method for driving a semiconductor device according to claim 10,
   wherein the imaging unit comprises a pixel portion in which pixels are arranged in matrix with m rows and n columns (n is an integer greater than or equal to 1),
   wherein each of the pixels acquires captured-image data before start of the first period,
   wherein the shift register circuit sequentially supplies, to pixels in first to m-th rows, a selection signal that selects the pixel from which the captured-image data is read out in response to the first scan signal in the second period,
   wherein the semiconductor device detects a position of an object touching the pixel portion on the basis of the captured-image data after an end of the second period, and
   wherein a latch circuit to which the data is written is determined on the basis of the position of the object in the third period.

12. The method for driving the semiconductor device according to claim 11,
   wherein the semiconductor device performs authentication after an end of the fifth period.

13. The method for driving the semiconductor device according to claim 10,
   wherein the first to m-th latch circuits and the first to m-th register circuits each comprises a transistor, and
   wherein the transistor comprises a metal oxide in a channel formation region.

\* \* \* \* \*